US006241859B1

(12) United States Patent
Yamada et al.

(10) Patent No.: US 6,241,859 B1
(45) Date of Patent: Jun. 5, 2001

(54) METHOD OF FORMING A SELF-ALIGNED REFRACTORY METAL SILICIDE LAYER

(75) Inventors: Yoshiaki Yamada; Yoshihisa Matsubara; Takashi Ishigami, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/138,572

(22) Filed: Aug. 24, 1998

(30) Foreign Application Priority Data

Aug. 22, 1997  (JP) .................................................... 9-226648

(51) Int. Cl.[7] .................................................... C23C 14/34
(52) U.S. Cl. ............................ 204/192.23; 204/192.22; 204/192.15; 427/372.2; 427/379; 427/397.7; 438/762; 438/765; 438/769
(58) Field of Search ........................ 204/192.15, 192.22, 204/192.23; 438/762, 765, 769; 427/372.2, 379, 397.7

(56) References Cited

U.S. PATENT DOCUMENTS

| 5,985,756 | * | 11/1999 | Shinmura | 438/648 |
| 5,998,284 | * | 12/1999 | Azuma | 438/514 |
| 6,015,997 | * | 1/2000 | Hu et al. | 257/412 |
| 6,054,387 | * | 4/2000 | Fukuda | 438/683 |

FOREIGN PATENT DOCUMENTS

| 63-111665 | 5/1988 | (JP) | H01L/29/46 |
| 5-299376 | 11/1993 | (JP) | H01L/21/285 |
| 6-204169 | 7/1994 | (JP) | H01L/21/28 |
| 6-340969 | 12/1994 | (JP) | C23C/14/34 |
| 8-49069 | 2/1996 | (JP) | C23C/14/34 |
| 9-36230 | 2/1997 | (JP) | H01L/21/768 |
| 9-186104 | 7/1997 | (JP) | H01L/21/28 |
| 9-186105 | 7/1997 | (JP) | H01L/21/28 |
| 9-186113 | 7/1997 | (JP) | H01L/21/285 |
| 9-190986 | 7/1997 | (JP) | H01L/21/285 |
| 9-213660 | 8/1997 | (JP) | H01L/21/285 |

* cited by examiner

Primary Examiner—Nam Nguyen
Assistant Examiner—Steven H. VerSteeg
(74) Attorney, Agent, or Firm—Young & Thompson

(57) ABSTRACT

The present invention provides a method of forming a silicide layer on a silicon region. The method comprises the following steps. A first refractory metal layer is formed on the silicon region. The first refractory metal layer is made of a first refractory metal. A second refractory metal layer is formed on the first refractory metal layer. The second refractory metal layer is made of a second refractory metal and containing nitrogen. The second refractory metal layer has a film stress of not higher than $1 \times 10^{10}$ dyne/cm$^2$. A heat treatment is carried out in a first atmosphere substantially free of nitrogen so as to cause a silicidation of a lower region of the first refractory metal layer, whereby a C49-structured refractory metal silicide layer is formed on the silicon region.

63 Claims, 21 Drawing Sheets heat treatment in nitrogen atmosphere heat treatment in argon atmosphere collimate-sputtering Ti-target with Ar/N₂ gases compressive film stress $1 \times 10^{10}$ dyne/cm² heat treatment in argon atmosphere long-slow-sputtering Ti-target with Ar/N$_2$ gases compressive film stress $1 \times 10^{10}$ dyne/cm$^2$ sputtering TiN$_{0.5}$-target with Ar gas compressive film stress $1 \times 10^{10}$ dyne/cm$^2$ heat treatment in argon atmosphere

US 6,241,859 B1

METHOD OF FORMING A SELF-ALIGNED REFRACTORY METAL SILICIDE LAYER

BACKGROUND OF THE INVENTION

The present invention relates to a method of forming a semiconductor device and a method of forming a self-aligned refractory metal salicide layer over semiconductor diffusion layers and polysilicon layers.

In accordance with highly required scaling down of the semiconductors devices and increasing the density of integration, a design rule of 0.15–0.25 micrometers minimum size has now been on the application to form highly integrated semiconductor devices such as memory devices and logic devices. The increase in the density of the semiconductor device requires substantive reductions in length of the gate electrode and in width of diffusion layers as well as in thicknesses of the diffusion layers and the polysilicon layer as the gate electrode, thereby resulting in increase in electrical resistance of the semiconductor device. The increase in electrical resistance causes a substantive delay in transmission of signals on the circuits. For realizing the substantive reduction in the resistance, it is, therefore, required to form silicide layers, particularly refractory metal salicide layers, on the polysilicon gate electrode and on the diffusion layers of the single crystal silicon substrate. The refractory metal silicide layers are formed by silicidation of a refractory metal layer and a self-alignment technique.

A conventional method of forming a MOS field effect transistor with silicide layers will be described with reference to FIGS. 1A through 1E, which are fragmentary cross sectional elevation views illustrative of MOS field effect transistors in sequential steps involved in the first conventional fabrication method.

With reference to FIG. 1A, field oxide films 102 are selectively formed on a surface of a silicon substrate 101 by a local oxidation of silicon method, thereby to define an active region surrounded by the field oxide films 102. An ion-implantation of an impurity into the active region of the silicon substrate 101 is carried out to increase a withstand voltage thereof. A thermal oxidation of silicon is carried out to form a gate oxide film 103 on the active region of the silicon substrate 101. A chemical vapor deposition method is carried out to deposit a polysilicon film having a thickness of about 150 nanometers on an entire region of the silicon substrate, so that the polysilicon film extends over the field oxide films 102 and the gate oxide film 103. The polysilicon film is doped with an impurity such as phosphorus to reduce a resistivity of the polysilicon film. The polysilicon film is patterned by a photolithography technique in order to form a polysilicon gate electrode 104 on the gate oxide film 103. A chemical vapor deposition method is carried out to deposit a silicon oxide film on an entire region of the silicon substrate 101, so that the silicon oxide film extends over the polysilicon gate electrode 104, the active region of the silicon substrate 101 and the field oxide films 102. An anisotropic etching to the silicon oxide film is carried out to leave the silicon oxide film only on side walls of the polysilicon gate electrode 104, thereby to form side wall spacers 105 on the side walls of the polysilicon gate electrode 104. An ion-implantation of an impurity such as boron or arsenic into the active region of the silicon substrate 101 is carried out by using the polysilicon gate electrode 104, the side wall spacers 105 and the field oxide films 102 as masks, thereby to form impurity doped regions in upper regions of the silicon substrate 101. A heat treatment to the silicon substrate 101 is carried out at a temperature in the range of 800 to 1000° C. to form source/drain diffusion layers 106 in the upper regions of the silicon substrate 101.

With reference to FIG. 1B, a sputtering method is carried out by sputtering a titanium target to deposit titanium on an entire region of the silicon substrate 101, thereby entirely forming a titanium film 107 having a thickness of 50 nanometers, so that the titanium film 107 extends over the polysilicon gate electrode 104, the side wall spacers 105, the source/drain diffusion layers 106 and the field oxide films 102.

With reference to FIG. 1C, a heat treatment to the silicon substrate 101 is carried out by use of a lamp anneal at a temperature in the range of 600 to 650° C. in a nitrogen atmosphere under an atmospheric pressure for a time in the range of 30 to 60 seconds, thereby to cause both a titanium nitration reaction and a titanium silicide reaction, wherein nitrogen atoms are thermally diffused into the titanium layer 107 whereby the titanium film, except for bottom regions thereof on the source/drain diffusion layers 106 and the polysilicon gate electrode 104, are made into a titanium nitride film 112, whilst silicon atoms in the source/drain diffusion layers 106 and in the polysilicon gate electrode 104 are also thermally diffused into the bottom region of the titanium layer 107, whereby titanium atoms in the bottom region of the titanium layer 107 but only on the source/drain diffusion layers 106 and the polysilicon gate electrode 104 are silicided with the thermally diffused silicon atoms from the source/drain diffusion layers 106 and the polysilicon gate electrode 104. As a result, the bottom regions of the titanium layer 107 but only on the source/drain diffusion layers 106 and the polysilicon gate electrode 104 are made into titanium silicide layers 109. Namely, the titanium film 107 on the side wall spacers 105 and the field oxide films 102 are completely nitrated. The titanium silicide layers 109, therefore, extends on the bottom surface of the titanium nitride film 112 and over the source/drain diffusion layers 106 and the polysilicon gate electrode 104. The titanium silicide layers 109 has a C49-crystal structure hang a relatively high resistivity of about 60 $\mu\Omega$cm.

With reference to FIG. 1D, the titanium nitride film 112 is completely etched by a wet etching which uses a chemical of a mixture of ammonium solution and a hydrogen peroxide solution, whereby the C49-structured titanium silicide layers 109 remain on the polysilicon gate electrode 104 and on the source/drain diffusion layers 106.

With reference to FIG. 1E, a heat treatment to the silicon substrate 101 is carried out at a temperature of about 850° C. in a nitrogen atmosphere under an atmospheric pressure for 60 seconds to cause a phase transition from the C49 crystal structure to a C54 crystal structure which has a low resistivity of about 20 $\mu\Omega$cm. As a result, the C49-structured titanium silicide layers 109 are made into C54-structured titanium silicide layers 111. Namely, the C54-structured titanium silicide layers 111 are formed on the polysilicon gate electrode 104 and on the source/drain diffusion layers 106.

The reason why the heat treatment for causing the silicidation reaction is carried out in the nitrogen atmosphere is as follows. During the heat treatment for causing the silicidation reaction of titanium with silicon, silicon may be diffused not only into the titanium film but also onto the silicon oxide films such as the field oxide films 102. The diffused silicon over the silicon oxide film is then reacted with titanium diffused from the titanium film, thereby to form a titanium silicide layer on an interface between the titanium film and the silicon oxide film. This titanium silicide layer will remain on the silicon oxide film such as the field oxide films, This means it no longer possible to obtain the required insulation. This phenomenon is so called to as "over-growth". In order to prevent the over-growth of the titanium silicide layer over the silicon oxide film, it is required to carry out the heat treatment for causing the silicidation reaction in the nitrogen atmosphere. The heat treatment in the nitrogen atmosphere causes a diffusion of nitrogen in the nitrogen atmosphere into the titanium film. Further, a nitration reaction temperature is lower than a silicidation Areaction temperature. This means that when the heat treatment is commenced and the temperature of the substrate is risen, then the nitration reaction is caused prior to the silicidation reaction. For those reasons, titanium in the titanium film over silicon having been diffused onto the silicon oxide film is fist reacted with nitrogen having been diffused from the nitrogen atmosphere into the titanium film, so that the titanium film over the silicon oxide film is nitrated with the diffused nitrogen from the nitrogen atmosphere, whereby almost no titanium atoms in the titanium nitride film over the silicon oxide film could be silicided with silicon on the interface between the silicon oxide film and the titanium nitride film. Therefore, no titanium silicide layer is formed on the silicon oxide film. This means that the heat treatment for causing the silicidation reaction in the nitrogen atmosphere allows the silicide layer to be self-aligned and selectively formed only on the silicon layer or the polysilicon layer.

The above technique for preventing the over-growth of the silicide layer on silicon oxide region is disclosed in the Japanese patent applications Nos. 7-303928 and 8-263906. This conventional technique will be described with reference to FIGS. 2A through 2E which are fragmentary cross sectional elevation views illustrative of MOS field effect transistors in sequential steps involved in the second conventional fabrication method.

With reference to FIG. 2A, field oxide films 102 are selectively formed on a surface of a silicon substrate 101 by a local oxidation of silicon method, thereby to define an active region surrounded by the field oxide films 102. An ion-implantation of an impurity into the active region of the silicon substrate 101 is carried out to increase a withstand voltage thereof. A thermal oxidation of silicon is carried out to form a gate oxide film 103 on the active region of the silicon substrate 101. A chemical vapor deposition method is carried out to deposit a polysilicon film having a thickness of about 150 nanometers on an entire region of the silicon substrate, so that the polysilicon film extends over the field oxide films 102 and the gate oxide film 103. The polysilicon film is doped with an impurity such as phosphorus to reduce a resistivity of the polysilicon film. The polysilicon film is patterned by a photolithography technique in order to form a polysilicon gate electrode 104 on the gate oxide film 103. A chemical vapor deposition method is carried out to deposit a silicon oxide film on an entire region of the silicon substrate 101, so that the silicon oxide film extends over the polysilicon gate electrode 104, the active region of the silicon substrate 101 and the field oxide films 102. An anisotropic etching to the silicon oxide film is carried out to leave the silicon oxide film only on side walls of the polysilicon gate electrode 104, thereby to form side wall spacers 105 on the side walls of the polysilicon gate electrode 104. An ion-implantation of an impurity such as boron or arsenic into the active region of the silicon substrate 101 is carried out by using the polysilicon gate electrode 104, the side wall spacers 105 and the field oxide films 102 as masks, thereby to form impurity doped regions in upper regions of the silicon substrate 101. A heat treatment to the silicon substrate 101 is carried out at a temperature in the range of 800 to 1000° C. to form source/drain diffusion layers 106 in the upper regions of the silicon substrate 101.

With reference to FIG. 2B, a sputtering method is carried out by sputtering a titanium target to deposit titanium on an entire region of the silicon substrate 101, thereby entirely forming a titanium film 107 having a thickness of 20 nanometers, so that the titanium film 107 extends over the polysilicon gate electrode 104, the side wall spacers 105, the source/drain diffusion layers 106 and the field oxide films 102. Subsequently, a further sputtering method is carried out by sputtering a titanium nitride target to deposit titanium nitride on an entire region of the titanium film 107, thereby forming a titanium nitride film 113 which extends over the titanium film 107.

With reference to FIG. 2C, a heat treatment to the silicon substrate 101 is carried out by use of a lamp anneal at a temperature in the range of 600 to 650° C. in an argon atmosphere under an atmospheric pressure for a time in the range of 30 to 60 seconds, thereby to cause both a titanium nitration reaction and a titanium silicide reaction. This heat treatment causes that silicon atoms in the source/drain diffusion layers 106 and the polysilicon gate electrode 104 are thermally diffused into lower regions of the titanium film 107, so that the lower regions of the titanium film 107 over the source/drain diffusion layers 106 and the polysilicon gate electrode 104 are silicided with the thermally diffused silicon atoms, whereby titanium silicide layers 109 are self-aligned and selectively formed on the source/drain diffusion layers 106 and the polysilicon gate electrode 104. The titanium silicide layers 109 has a C49 crystal structure having a relatively high resistivity of about 60 $\mu\Omega$cm. On the other hands, upper regions of the titanium film 107 over the source/drain diffusion layers 106 and the polysilicon gate electrode 104 and further the upper and lower regions of the titanium film 107 over the side wall spacers 105 and the field oxide films 102 are nitrated with nitrogen atoms thermally diffused from the titanium nitride film 113 overlying the titanium film 107, thereby to form a nitrogen containing titanium film 114 which extends over the field oxide films 102, the C49-structured titanium silicide layers 109 and the side wall spacers 105. As a result, the bottom regions of the titanium layer 107 but only on the source/drain diffusion layers 106 and the polysilicon gate electrode 104 are made into the C49-structured titanium silicide layers 109. Namely, the titanium film 107 on the side wall spacers 105 and the field oxide films 102 are completely nitrated. The titanium silicide layers 109, therefore, extend on the bottom surface of the nitrogen containing titanium film 114 and over the source/drain diffusion layers 106 and the polysilicon gate electrode 104.

With reference to FIG. 2D, the nitrogen containing titanium film 114 is completely etched by a wet etching which uses a chemical of a mixture of ammonium solution and a hydrogen peroxide solution, whereby the C49-structured titanium silicide layers 109 remain on the polysilicon gate electrode 104 and on the source/drain diffusion layers 106.

With reference to FIG. 2E, a heat treatment to the silicon substrate 101 is carried out at a temperature of about 850° C. in an argon atmosphere under an atmospheric pressure for 60 seconds to cause a phase transition from the C49 crystal structure to a C54 crystal structure which has a low resistivity of about 20 $\mu\Omega$cm. As a result, the C49-structured titanium silicide layers 109 are made into C54-structured titanium silicide layers 111. Namely, the C54-structured titanium silicide layers 111 are formed on the polysilicon gate electrode 104 and on the source/drain diffusion layers 106.

In accordance with the above second conventional method, the titanium nitride film has been formed on the titanium film before the heat treatment is carried out in the argon atmosphere in order to prevent the over-growth of the titanium silicide layer over the field oxide films 102 or over the side wall spacers 105. Namely, the second conventional method is effective for allowing the titanium silicide layers 109 to be self-aligned only on the polysilicon gate electrode 104 and on the source/drain diffusion layers 106.

The second conventional method is, however, engaged with the following problems.

It order to realize the scaling down of the semiconductor devices, it is required to reduce a thickness of the titanium silicide layers. Notwithstanding, it is difficult for the conventional methods to form extremely thin titanium suicide layers on the source/drain diffusion layers and on the polysilicon gate electrode. In order to reduce the thickness of the titanium silicide layers, it is also required to reduce a thickness of the titanium film. During the heat treatment for causing the silicidation reaction, not only the silcidation reaction of titanium but also the nitration reaction of titanium are caused, wherein the silicidation reaction and the nitration reaction are exclusive to each other, and therein the temperature of beginning the titanium nitration reaction is lower than the temperature of beginning the titanium silicidation reaction. This means that the titanium nitration reaction is caused prior to the titanium silicidation reaction, and therefore, if the titanium film is extremely thin, the entire of the titanium film may be nitrated before the required silicidation reaction could no longer be caused even the temperature of the silicon substrate is risen up to the temperature of causing the titanium silicidation reaction. If particularly the silicon region contains arsenic as an impurity, then the silicidation reaction rate is reduced, whilst the nitration reaction is relatively promoted, whereby the extremely thin titanium film may entirely be nitrated followed by no silicidation reaction.

If, in accordance with the first conventional method, the heat treatment for causing the titanium silicidation reaction is carried out in the nitrogen atmosphere, this provides an influence to the phase transition of the titanium silicide film from the C49 crystal structure to the C54 crystal structure. FIG. 3 is a diagram illustrative of variation in phase transition temperature from the C49 crystal structure to the C54 crystal structure of the titanium silicide film over thickness of the titanium film. As the thickness of the titanium film is increased, the phase transition temperature is decreased. If the thickness of the titanium film is thicker than 30 nanometers, then the phase transition temperature is below 800° C. It is preferable that the phase transition temperature is low. Particularly, as the thickness of the titanium film is reduced from 30 nanometers, the phase transition temperature is rapidly increased. The reason why the reduction in thickness of the titanium film results in increase of the phase transition temperature is as follows. The heat treatment for causing the silicidation reaction is carried out in the nitrogen atmosphere, whereby nitrogen atoms in the nitrogen atmosphere may thermally be diffused into the titanium film and a nitration reaction of titanium appears in the titanium film. If the titanium film is thin, then a nitrogen concentration of the thin nitrogen containing titanium film is high. If, however, the titanium film is thick, then a nitrogen concentration of the thick nitrogen containing titanium nitride film is low. The increase in concentration of the nitrogen containing titanium film results in an increase of the phase transition temperature, whereby the second heat treatment for causing the phase transition from the C49-structured titanium silicide layer into the C54-structured titanium silicide layer is required to be carried out at a high temperature. The heat treatment at a high temperature may provide influences to the source/drain diffusion layers, whereby characteristics of the semiconductor device are deteriorated. The heat treatment at a high temperature may also cause a cohesion of the titanium silicide layer, whereby a resistivity of the titanium silicide layer is increased.

In contrast to the above heat treatment in the nitrogen atmosphere, a heat treatment in an argon atmosphere for causing the titanium silicide layer is preferable in the light of suppressing an excess nitrogen diffusion and relatively activating the silicidation reaction. If the heat treatment is carried out in the argon atmosphere, then no nitrogen atoms are thermally diffused into the titanium nitride film 108 overlaying the titanium film 107, whilst nitrogen in the titanium nitride film 108 is diffused to the titanium film 107, whereby the nitrogen concentration of the titanium nitride film 108 is decreased. Further, a depth of nitrogen diffused into the titanium film 107 is shallower as compared to when the heat treatment is carried out in the nitrogen atmosphere. Namely, the heat treatment in the argon atmosphere suppresses an excess nitrogen diffusion into the titanium film 107, so that no nitration reaction is caused in the lower or bottom region of the titanium film 107, thereby allowing the silicidation reaction in the lower or bottom region of the titanium film 107 to form a titanium silicide layer. Consequently, the heat treatment in the argon gas atmosphere free of nitrogen allows a formation of the titanium suicide layer even if the titanium film 107 is extremely thin for scaling down of the semiconductor device.

As described above, the above second conventional method of forming the titanium silicide layer is made by forming laminations of the titanium film and the titanium nitride film for subsequent heat treatment in the argon atmosphere. This second conventional method has the following problems.

The titanium nitride film has been formed on the titanium film before the heat treatment is carried out to cause the silicidation reaction to form the C49-structured titanium silicide layer. The titanium nitride film may be sintered by this heat treatment. The sintering of the titanium nitride film increases a density of the titanium nitride film. The sintered titanium nitride film overlying the C49-structured titanium silicide layer is then required to be removed. Notwithstanding, it is difficult to remove the sintered titanium nitride film having a high density by a wet etching which uses a chemical which comprises a mixture solution of ammonium and hydrogen peroxide. Namely, sintering of the titanium nitride film or increase in film density of the titanium nitride film makes it difficult to remove the same by the wet etching. In place of the wet etching, over-etching or dry etching to the sintered titanium nitride film with the high film density may be considered for solving the above problem with difficulty in removal of the sintered titanium nitride film. However, either the wet etching or the dry etching are insufficient in etching selectivity of a titanium nitride etching rate to a titanium silicide etching rate. Namely, the titanium nitride etching rate is not sufficiently higher than the titanium silicide etching rate. For this reason, the thin titanium silicide layer is likely to be etched. This means it difficult to remove only the sintered titanium nitride film overlying the titanium silicide layer without etching the titanium silicide layer. The unintended etching to the titanium silicide layer results in variation in thickness of the remaining titanium silicide layer. This variation in thickness of the remaining titanium silicide layer results in increased variations in resistance of the titanium silicide layer. The over-etching to the thin titanium silicide layer makes it difficult to obtain a sufficiently reduced resistance of the remaining titanium silicide layer.

The sintering of the titanium nitride film by the heat treatment in the argon atmosphere for causing the silicidation reaction increases a film stress of the titanium nitride film. The titanium nitride film having the increased film stress has the following problems.

The silicon layer or silicon region, on which a titanium silicide layer is intended to be formed, is often surrounded by or bounded with the silicon oxide film or silicon oxide region. The silicidation reaction of a refractory metal such as titanium with silicon is initiated on an interface between the refractory metal film and the silicon layer or silicon region, whereby an initial refractory metal silicide layer is first formed on the interface between the refractory metal film and the silicon layer or silicon region. Thereafter, the silicidation reaction is continued to appear on an interface between the growing refractory metal silicide layer and the silicon layer or silicon region, whereby the refractory metal silicide layer is grown toward the silicon layer or silicon region. In the atomic level viewpoint, the continuous titanium silicidation reaction requires that silicon atoms are diffused onto the interface between the currently growing titanium silicide layer and the silicon layer or silicon region and further that the titanium atoms are immersed into the surface region of the silicon layer or silicon region, whereby the titanium silicide layer being on growth is immersed into the surface region of the silicon layer or silicon region. Namely, the titanium silicide layer is continuously grown with immersion thereof into the surface region of the silicon layer or silicon region. If the silicon layer or silicon region is surrounded by the silicon oxide region, then the immersion of the titanium silicide layer on growth into the surface region of the silicon layer or silicon region causes a plastic deformation toward the surface region of the silicon layer or silicon region. Since the titanium layer 107 overlies the titanium silicide layer being on immersion into the surface region of the silicon layer or silicon region, then the titanium layer also shows a plastic deformation together with the plastic deformation of the titanium silicide layer Since further the titanium nitride film overlies the titanium film, then the plastic deformation of the titanium film causes a further plastic deformation of the titanium nitride film. Those plastic deformations of not only the titanium silicide layer but also the titanium film and the titanium nitride film needs a larger force than a total film stress of the titanium silicide layer, the titanium film and the titanium nitride film. The provision of the titanium nitride film on the titanium film increases the required force for those plastic deformations of the titanium silicide layer, the titanium film and the titanium nitride film. This means that the provision of the titanium nitride film on the titanium film may provide a resistance or bar to the plastic deformations of the titanium silicide layer, the titanium film and the titanium nitride film. As described above, the continuous growth of the titanium silicide layer with immersion into the surface region of the silicon layer or silicon region needs the plastic deformations of not only the titanium silicide layer but also the titanium film and the titanium nitride film, for which reason the provision of the titanium nitride film on the titanium film may provide a resistance or bar to the continuous growth of the titanium silicide layer with immersion into the surface region of the silicon layer or silicon region. This resistance or bar to the continuous growth of the titanium silicide layer with immersion into the surface region of the silicon layer or silicon region reduces a rate of the titanium silicidation reaction, whereby the titanium nitrate reaction may exceed the titanium silicidation reaction. This may make it no longer possible to cause the required titanium silicidation reaction. Particularly, if the silicon layer or silicon region is defined by the silicon oxide regions to form a line with a reduced width, the required force for the plastic deformations of the titanium silicide layer, the titanium layer and the titanium nitride film is relatively high. This results in a further resistance or bar to the continuous growth of the titanium silicide layer with immersion into the surface region of the silicon layer or silicon region, resulting in a reduction in a rate of the titanium silicidation reaction, whereby the titanium nitrate reaction may exceed the titanium silicidation reaction. This may make it no longer possible to cause the required titanium silicidation reaction.

Consequently, the second conventional silicidation method is effective to suppress the excess nitration reaction and allows a reduction in thickness of the silicide layer but not applicable to silicide the line-shaped silicon layer or silicon region.

In the above circumstances, it has been required to develop a novel method of forming a self-aligned refractory metal silicide layer on a silicon region surrounded by a silicon oxide region free from the above problems with the first and second conventional methods.

SUMMARY OF THE INVENTION

Accordingly, it is an object of the present invention to provide a novel method of forming a self-aligned refractory metal silicide layer on a silicon region surrounded by a silicon oxide region free from the above problems.

It is a further object of the present invention to provide a novel method of forming a self-aligned refractory metal silicide layer on a silicon region surrounded by a silicon oxide region, which is free from a problem with any over-growth of the silicide layer onto the silicon oxide region.

It is a still further object of the present invention to provide a novel method of forming a self-aligned refractory metal silicide layer on a silicon region surrounded by a silicon oxide region, which is capable of suppressing any excess refractory metal nitration reaction.

It is yet a further object of the present invention to provide a novel method of forming a self-aligned refractory metal silicide layer on a silicon region surrounded by a silicon oxide region, which allows a reduction in thickness of the silicide layer.

It is a further more object of the present invention to provide a novel method of forming a self-aligned refractory metal silicide layer in the form of a line with a reduced width on a silicon region surrounded by a silicon oxide region.

It is still more object of the present invention to provide a novel method of forming a self-aligned refractory metal silicide layer on a silicon region surrounded by a silicon oxide region, which is capable of reducing the necessary force for plastic deformations of the refractory metal silicide layer and films laminated thereon.

It is moreover object of the present invention to provide a novel method of forming a self-aligned refractory metal silicide layer on a silicon region surrounded by a silicon oxide region, which is free of such a high temperature heat treatment as to deteriorate characteristics of a semiconductor device having the refractory metal silicide layer.

It is another object of the present invention to provide a novel method of forming a self-aligned refractory metal silicide layer on a silicon region surrounded by a silicon oxide region, which facilitates etching to the unsilicided layer such as the refractory metal nitride film without any over-etching to the refractory metal silicide layer.

The present invention provides a method of forming a silicide layer on a silicon region. The method comprises the following steps. A first refractory metal layer is formed on the silicon region. The first refractory metal layer is made of a first refractory metal. A second refractory metal layer is formed on the first refractory metal layer. The second refractory metal layer is made of a second refractory metal and containing nitrogen. The second refractory metal layer has a film stress of not higher than $1 \times 10^{10}$ dyne/cm$^2$. A heat treatment is carried out in a first atmosphere substantially free of nitrogen so as to cause a silicidation of a lower region of the first refractory metal layer, whereby a C49-structured refractory metal silicide layer is formed on the silicon region.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1A:
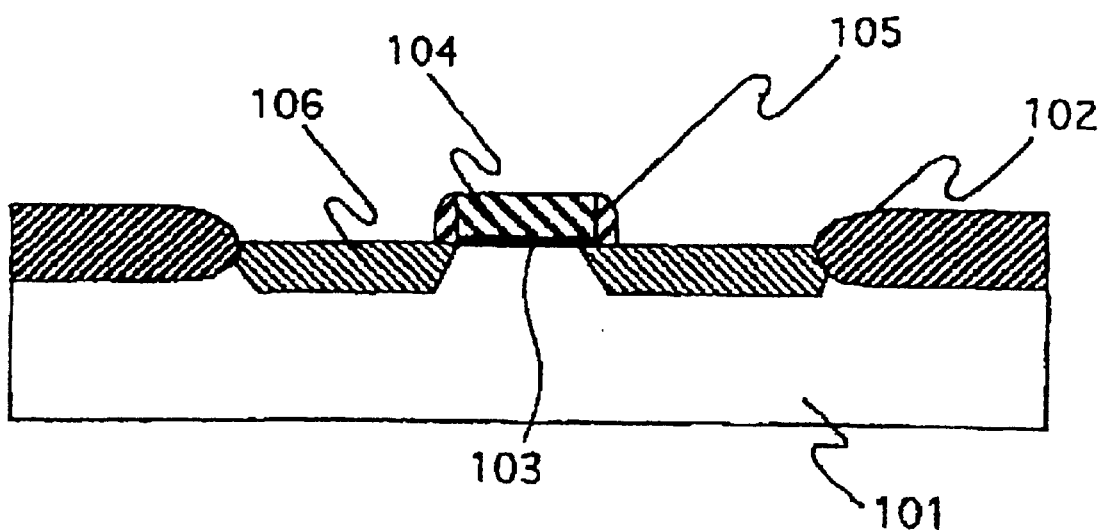
FIGS. 1A through 1E are fragmentary cross sectional elevation views illustrative of MOS field effect transistors in sequential steps involved in the first conventional fabrication method.
Figure 1B:
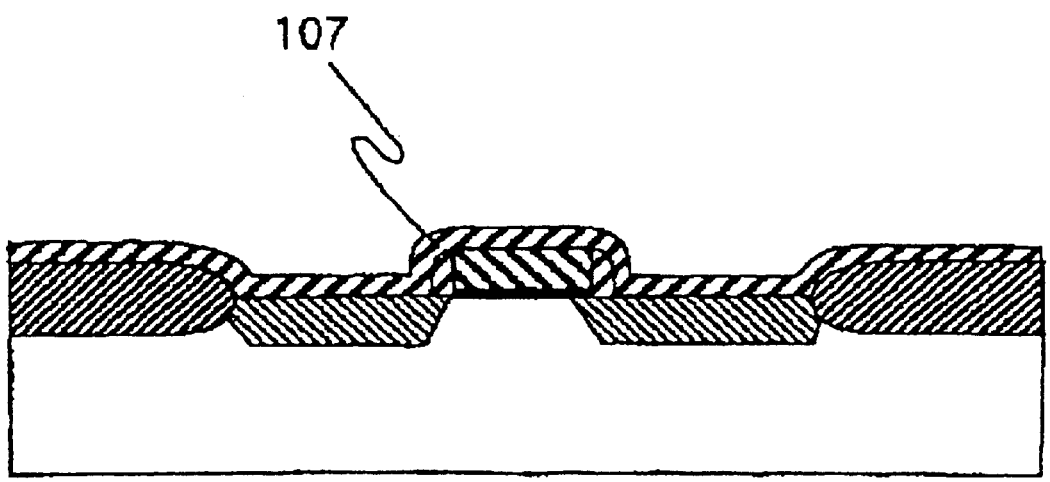
Figure 1C:
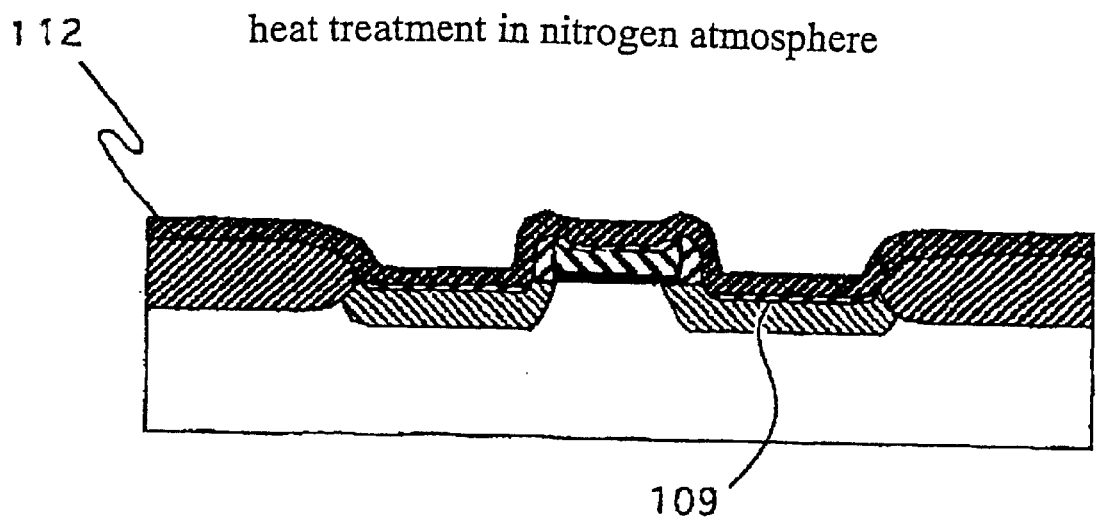
Figure 1D:
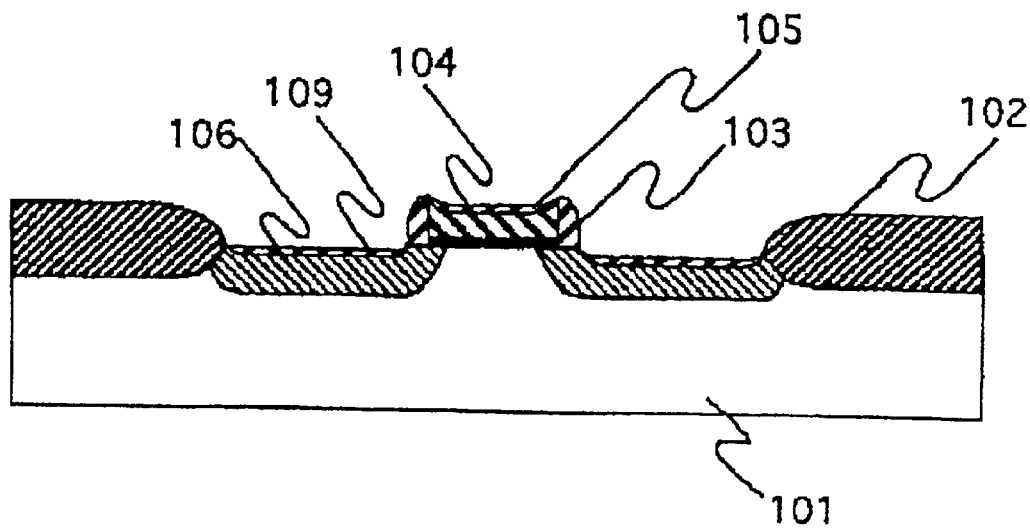
Figure 1E:
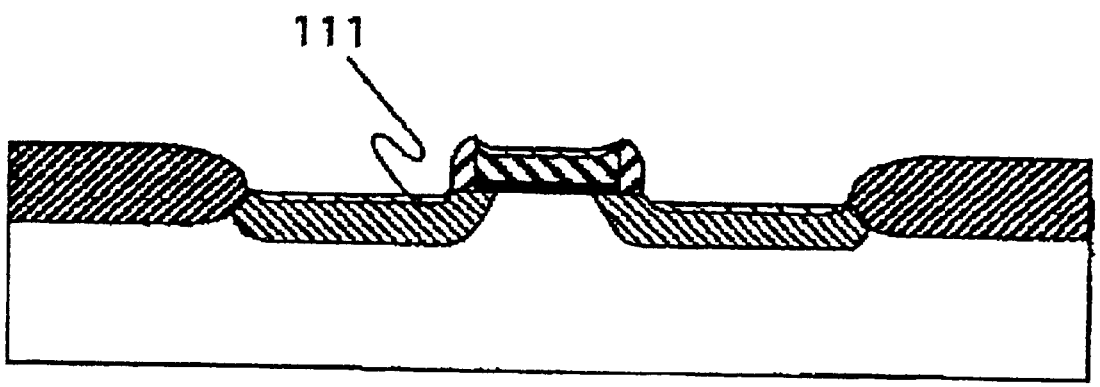
Figure 2A:
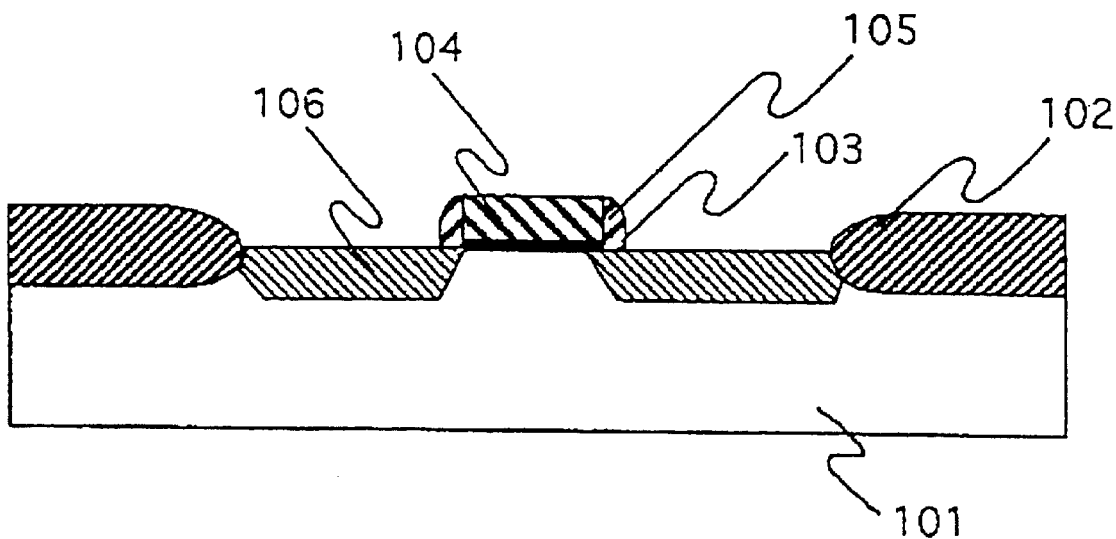
FIGS. 2A through 2E are fragmentary cross sectional elevation views illustrative of MOS field effect transistors in sequential steps involved in the second conventional fabrication method.
Figure 2B:
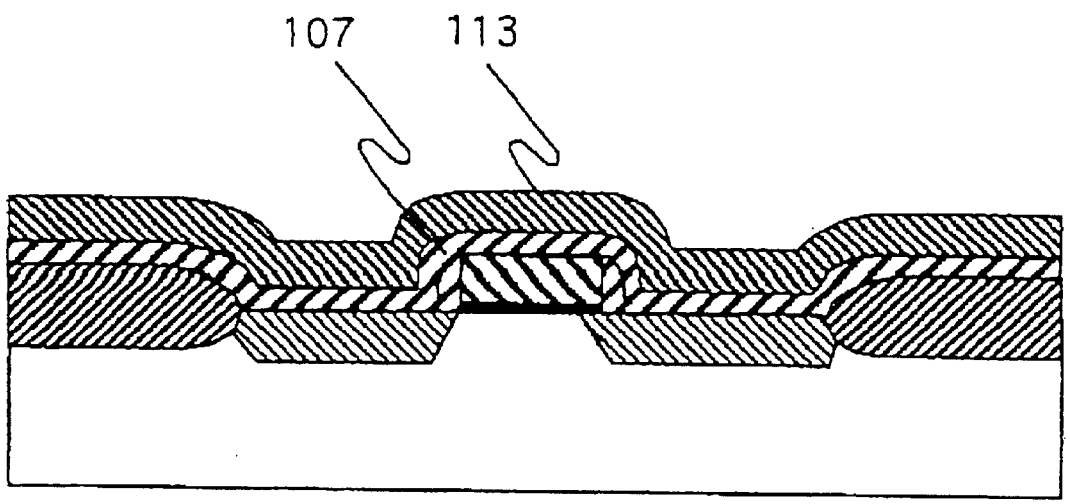
Figure 2C:
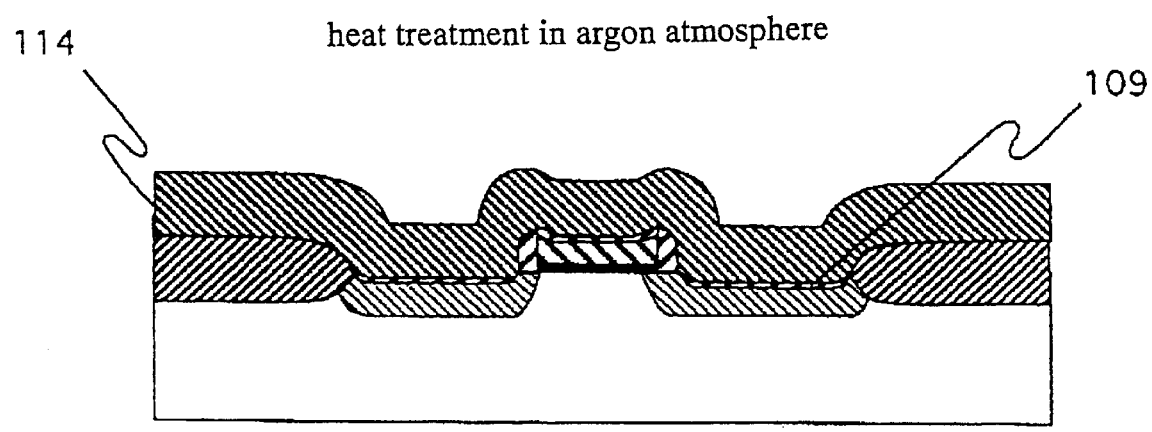
Figure 2D:
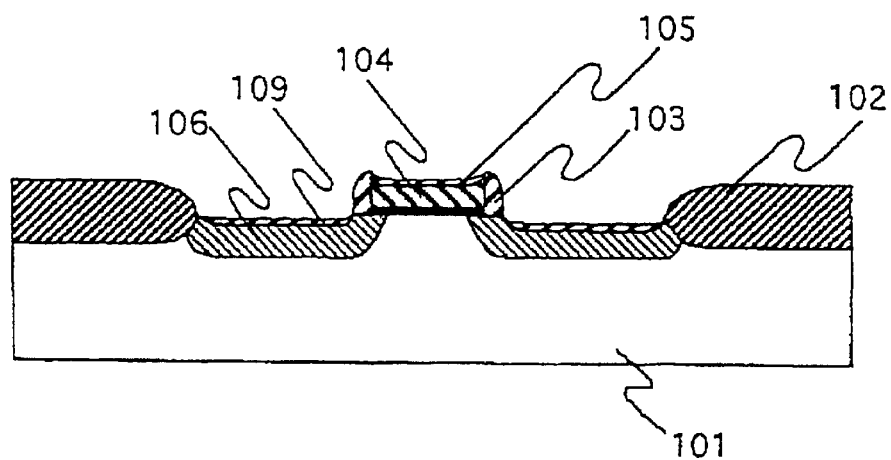
Figure 2E:
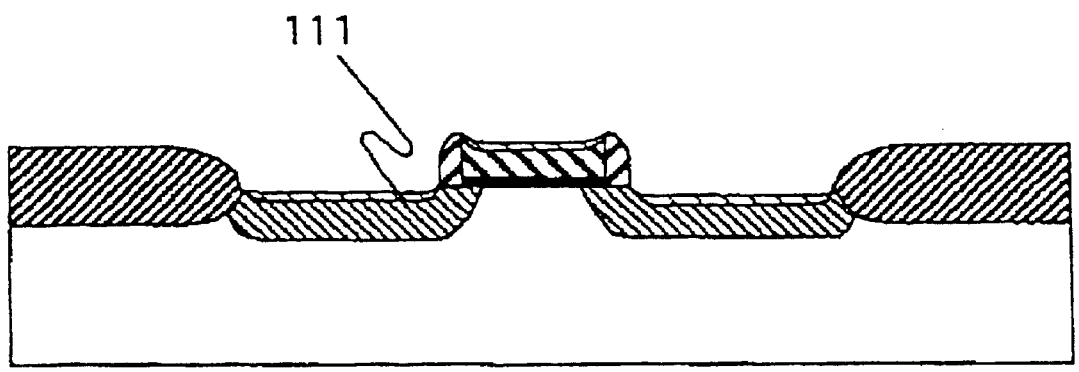
Figure 3:
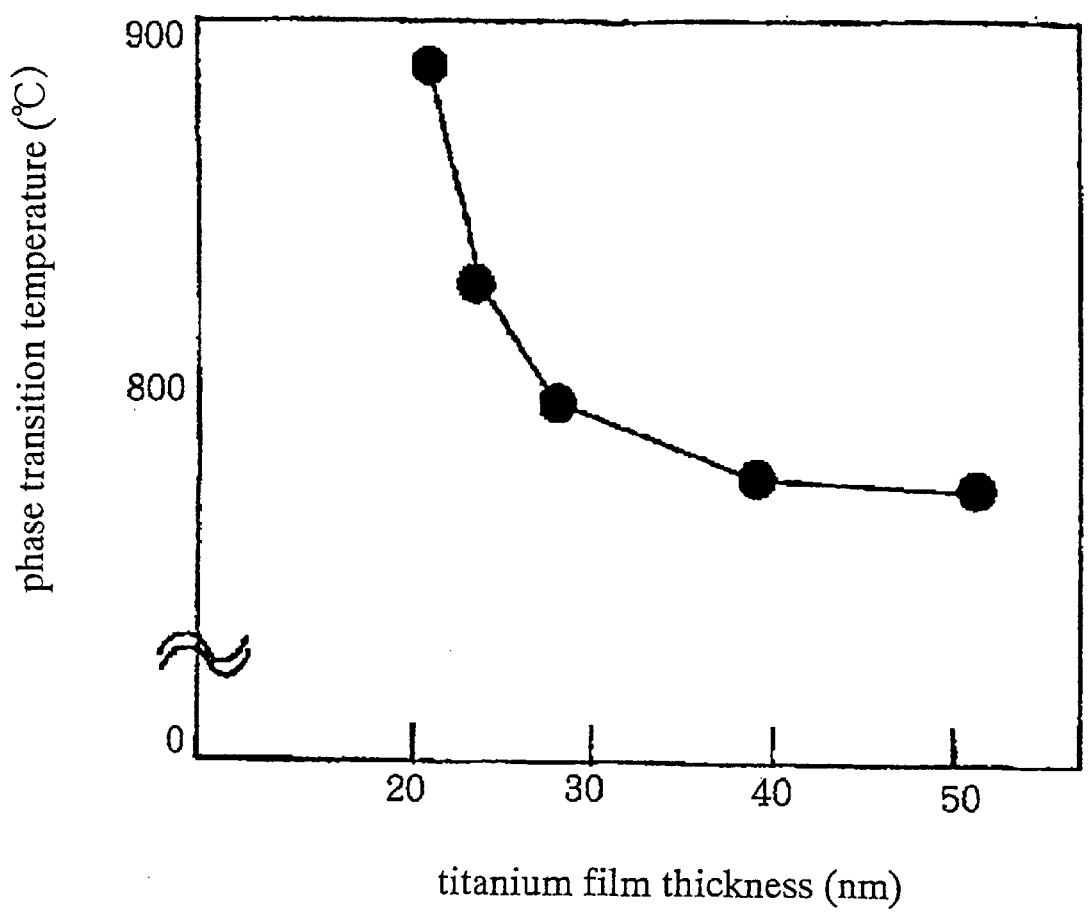
FIG. 3 is a diagram illustrative of variation in phase transition temperature from the C49 crystal structure to the C54 crystal structure of the titanium silicide film over thickness of the titanium film.

The first present invention provides a method of forming a silicide layer on a silicon region. The method comprises the following steps. A first refractory metal layer is formed on the silicon region. The first refractory metal layer is made of a first refractory metal. A second refractory metal layer is formed on the first refractory metal layer. The second refractory metal layer is made of a second refractory metal and containing nitrogen. The second refractory metal layer has a film stress of not higher than $1 \times 10^{10}$ dyne/cm$^2$. A heat treatment is carried out in a first atmosphere substantially free of nitrogen so as to cause a silicidation of a lower region of the first refractory metal layer, whereby a C49-structured refractory metal silicide layer is formed on the silicon region.

The nitrogen containing second refractory metal layer has a low film stress of not higher than $1 \times 10^{10}$ dyne/cm$^2$. This low film stress of the nitrogen containing second refractory metal layer reduces the necessary force for plastic deformations of the refractory metal silicide layer, the first refractory metal layer and the nitrogen containing second refractory metal layer during the continuous silicidation reaction. This reduction in the necessary force for the plastic deformations of the refractory metal silicide layer, the first refractory metal layer and the nitrogen containing second refractory metal layer facilitates the plastic deformations of the refractory metal silicide layer, the first refractory metal layer and the second nitrogen containing second refractory metal layer. This further facilitates immersions of the growing refractory metal silicide layer into the silicon region.

Namely, the provision of the nitrogen containing second refractory metal layer with the low film stress on the first refractory metal layer decreases the required force for those plastic deformations of the refractory metal silicide layer, the first refractory metal layer and the nitrogen containing second refractory metal layer. This means that the provision of the nitrogen containing second refractory metal layer on the first refractory metal layer does provide substantially no resistance nor bar to the plastic deformations of the refractory metal silicide layer, the first refractory metal layer and the nitrogen containing second refractory metal layer. Although the continuous growth of the refractory metal silicide layer with immersion into the surface region of the silicon region needs the plastic deformations of not only the titanium silicide layer but also the titanium film and the titanium nitride film, the provision of the nitrogen containing second refractory metal layer with the low film stress on the first refractory metal layer provide no resistance nor bar to the continuous growth of the refractory metal silicide layer with immersion into the surface region of the silicon layer or silicon region. No resistance nor bar to the continuous growth of the refractory metal silicide layer with immersion into the surface region of the silicon region does not reduce the rate of the refractory metal silicidation reaction, whereby the refractory metal nitrate reaction does not exceed the refractory metal silicidation reaction. This may make it possible to cause the required refractory metal silicidation reaction. Particularly, even if the silicon region is defined by the silicon oxide regions to form a line with a reduced width, the required force for the plastic deformations of the refractory metal silicide layer, the first refractory metal layer and the nitrogen containing second refractory metal layer is not relatively high due to the low film stress of the nitrogen containing second refractory metal layer. This facilitates the continuous growth of the refractory metal silicide layer with immersion into the surface region of the silicon region, resulting in no reduction in the rate of the refractory metal silicidation reaction, whereby the refractory metal nitrate reaction does not exceed the refractory metal silicidation reaction. This may make it possible to cause the required titanium silicidation reaction.

Consequently, the low film stress of not higher than $1 \times 10^{10}$ dyne/cm$^2$ of the nitrogen containing refractory metal layer is effective to suppress the excess nitration reaction and allows a reduction in thickness of the silicide layer as well as applicable to silicide the line-shaped silicon layer or silicon region.

Accordingly, the low film stress of the nitrogen containing second refractory metal layer makes the self-aligned refractory metal silicide layer free from the above problems with the first and second conventional methods. The low film stress of the nitrogen containing second refractory metal layer makes the self-aligned refractory metal silicide layer free from a problem with any over-growth of the silicide layer onto the silicon oxide region. The low film stress of the nitrogen containing second refractory metal layer is capable of suppressing any excess refractory metal nitration reaction. The low film stress of the nitrogen containing second refractory metal layer allows a reduction in thickness of the silicide layer. The low film stress of the nitrogen containing second refractory metal layer allows a self-aligned refractory metal silicide layer to be in the form of a line with a reduced width on a silicon region surrounded by a silicon oxide region. The low film stress of the nitrogen containing second refractory metal layer is capable of reducing the necessary force for plastic deformations of the refractory metal silicide layer and films laminated thereon. The low film stress of the nitrogen containing second refractory metal layer does not need such a high temperature heat treatment as to deteriorate characteristics of a semiconductor device having the refractory metal silicide layer. The low film stress of the nitrogen containing second refractory metal layer facilitates etching to the unsilicided layer such as the refractory metal nitride film without any over-etching to the refractory metal silicide layer.

It is preferable to further comprise a step of : removing the second refractory metal layer and an unsilicided remaining region of the first refractory metal layer to show a surface of the C49-structured refractory metal silicide layer.

It is preferable to furthermore comprise a step of : carrying out a further heat treatment in a second atmosphere substantially free of nitrogen so as to cause a phase transition from C49 crystal structure to C54 crystal structure whereby the C49-structured refractory metal silicide layer is made into a C54-structured refractory metal silicide layer.

It is preferable that the first refractory metal and the second refractory metal are the same.

It is further preferable that the first and second refractory metals are titanium so that the first refractory metal layer comprises a titanium layer and the second refractory metal comprises a titanium nitride layer.

It is furthermore preferable that a compositional ratio of nitrogen to titanium of the second refractory metal layer is in the range of 30% to 80%.

It is still further preferable that a compositional ratio of nitrogen to titanium of the second refractory metal layer is in the range of 45% to 55%.

It is yet further preferable that the titanium nitride layer as the second refractory metal layer is formed by a reactive sputtering method, wherein a titanium target is sputtered in an argon-nitrogen mixture atmosphere.

It is moreover preferable that a nitrogen flow rate to a total flow rate of nitrogen and argon is set in the range of 30% to 50%.

It is also preferable that the first atmosphere free of nitrogen comprises an inert gas free of nitrogen.

It is further preferable that the inert gas free of nitrogen comprises an argon gas.

It is also preferable that the first atmosphere free of nitrogen comprises a vacuum.

It is further preferable that the titanium nitride layer as the second refractory metal layer is formed by a long slow sputtering method under conditions that a distance between a titanium target and the silicon region is not less than a half size of a target and a pressure is controlled in the range of 0.2 mTorr to 0.4 mTorr.

It is also preferable that the titanium nitride layer as the second refractory metal layer is formed by a sputtering method, wherein a titanium nitride target having a compositional ratio of nitrogen to titanium in the range of 30% to 80% is sputtered with an argon.

It is also preferable that the first refractory metal and the second refractory metal are different from each other.

The second present invention provides a method of forming a silicide layer on a silicon region. The method comprises the following steps. A nitrogen containing compositionally graded refractory metal layer is formed on the silicon region. The nitrogen containing compositionally graded refractory metal layer has such a compositional grade that a compositional ratio of nitrogen is varied in a thickness direction and is reduced toward a bottom surface of the nitrogen containing compositionally graded refractory metal layer, so that a lower region of the nitrogen containing compositionally graded refractory metal layer is substantially free of nitrogen, wherein an upper region of the nitrogen containing compositionally graded refractory metal layer has a film stress of not higher than $1 \times 10^{10}$ dyne/cm$^2$. A heat treatment is carried out in a first atmosphere substantially free of nitrogen so as to cause a silicidation of a bottom region of the nitrogen containing compositionally graded refractory metal layer, whereby a C49-structured refractory metal silicide layer is formed on the silicon region.

The upper region of the nitrogen containing compositionally graded refractory metal layer has a low film stress of not higher than $1 \times 10^{10}$ dyne/cm$^2$. This low film stress of the upper region of the nitrogen containing compositionally graded refractory metal layer reduces the necessary force for plastic deformations of the refractory metal silicide layer and the upper and lower regions of the nitrogen containing compositionally graded refractory metal layer during the continuous silicidation reaction. This reduction in the necessary force for the plastic deformations of the refractory metal silicide layer and the upper and lower regions of the nitrogen containing compositionally graded refractory metal layer facilitates the plastic deformations of the refractory metal silicide layer and the upper and lower regions of the nitrogen containing compositionally graded refractory metal layer. This further facilitates immersions of the growing refractory metal silicide layer into the silicon region.

Namely, the low film stress of the upper region of the nitrogen containing compositionally graded refractory metal layer decreases the required force for those plastic deformations of the refractory metal silicide layer and the upper and lower regions of the nitrogen containing compositionally graded refractory metal layer. This means that the provision of the nitrogen containing compositionally graded refractory metal layer does provide substantially no resistance nor bar to the plastic deformations of the refractory metal silicide layer and the upper and lower regions of the nitrogen containing compositionally graded refractory metal layer. Although the continuous growth of the refractory metal silicide layer with immersion into the surface region of the silicon region needs the plastic deformations of not only the titanium silicide layer but also the upper and lower regions of the nitrogen containing compositionally graded refractory metal layer, the low film stress of the upper region of the nitrogen containing compositionally graded refractory metal layer provides no resistance nor bar to the continuous growth of the refractory metal silicide layer with immersion into the surface region of the silicon layer or silicon region. No resistance nor bar to the continuous growth of the refractory metal silicide layer with immersion into the surface region of the silicon region does not reduce the rate of the refractory metal silicidation reaction, whereby the refractory metal nitrate reaction does not exceed the refractory metal silicidation reaction. This may make it possible to cause the required refractory metal silicidation reaction. Particularly, even if the silicon region is defined by the silicon oxide regions to form a line with a reduced width, the required force for the plastic deformations of the refractory metal silicide layer and the upper and lower regions of the nitrogen containing compositionally graded refractory metal layer is not relatively high due to the low film stress of the nitrogen containing second refractory metal layer This facilitates the continuous growth of the refractory metal silicide layer with immersion into the surface region of the silicon region, resulting in no reduction in the rate of the refractory metal silicidation reaction, whereby the refractory metal nitrate reaction does not exceed the refractory metal silicidation reaction. This may make it possible to cause the required titanium silicidation reaction.

Consequently, the low film stress of not higher than $1 \times 10^{10}$ dyne/cm$^2$ of the upper region of the nitrogen containing compositionally graded refractory metal layer is effective to suppress the excess nitration reaction and allows a reduction in thickness of the silicide layer as well as applicable to silicide the line-shaped silicon layer or silicon region.

Accordingly, the low film stress of the upper region of the nitrogen containing compositionally graded refractory metal layer makes the self-aligned refractory metal silicide layer free from the above problems with the first and second conventional methods. The low film stress of the upper region of the nitrogen containing compositionally graded refractory metal layer makes the self-aligned refractory metal silicide layer free from a problem with any overgrowth of the silicide layer onto the silicon oxide region. The low film stress of the upper region of the nitrogen containing compositionally graded refractory metal layer is capable of suppressing any excess refractory metal nitration reaction. The low film stress of the upper region of the nitrogen containing compositionally graded refractory metal layer allows a reduction in thickness of the silicide layer. The low film stress of the upper region of the nitrogen containing compositionally graded refractory metal layer allows a self-aligned refractory metal silicide layer to be in the form of a line with a reduced width on a silicon region surrounded by a silicon oxide region. The low film stress of the upper region of the nitrogen containing compositionally graded refractory metal layer is capable of reducing the necessary force for plastic deformations of the refractory metal silicide layer and the nitrogen containing compositionally graded refractory metal layer laminated thereon. The low film stress of the upper region of the nitrogen containing compositionally graded refractory metal layer does not need such a high temperature heat treatment as to deteriorate characteristics of a semiconductor device having the refractory metal silicide layer. The low film stress of the upper region of the nitrogen containing compositionally graded refractory metal layer facilitates etching to the unsilicided layer such as the upper region of the nitrogen containing compositionally graded refractory metal layer without any over-etching to the refractory metal silicide layer.

It is preferable to further comprise a step of : removing an unsilicided remaining region of the nitrogen containing compositionally graded refractory metal layer to show a surface of the C49-structured refractory metal silicide layer.

It is preferable to furthermore comprise a step of: carrying out a further heat treatment in a second atmosphere substantially free of nitrogen so as to cause a phase transition from C49 crystal structure to C54 crystal structure whereby the C49-structured refractory metal silicide layer is made into a C54-structured refractory metal silicide layer.

It is preferable that a refractory metal of the nitrogen containing compositionally graded refractory metal layer is titanium.

It is further preferable that a compositional ratio of nitrogen to titanium of the upper region of the nitrogen containing compositionally graded refractory metal layer is in the range of 30% to 80%.

It is furthermore preferable that a compositional ratio of nitrogen to titanium of the upper region of the nitrogen containing compositionally graded refractory metal layer is in the range of 45% to 55%.

It is still further preferable that the nitrogen containing compositionally graded refractory metal layer is formed by a reactive sputtering method, wherein a titanium target is sputtered in an argon-nitrogen mixture atmosphere by changing a nitrogen flow rate to a total rate of nitrogen and argon.

It is yet further preferable that a nitrogen flow rate to a total flow rate of nitrogen and argon is controlled in the range of 30% to 50% during the upper region of the nitrogen containing compositionally graded refractory metal layer is deposited.

It is also preferable that the nitrogen containing compositionally graded refractory metal layer is formed by a long slow sputtering method by changing a nitrogen flow rate to a total rate of nitrogen and argon under conditions that a distance between a titanium target and the silicon region is not less than a half size of a target and a pressure is controlled in the range of 0.2 mTorr to 0.4 mTorr.

It is also preferable that the nitrogen containing compositionally graded refractory metal layer has a step-graded nitrogen compositional ratio profile, so that the lower region of the nitrogen containing compositionally graded refractory metal layer is substantially free of nitrogen, whilst the upper region of the nitrogen containing compositionally graded refractory metal layer has a compositional ratio of in the range of 30% to 80%.

It is further preferable that the nitrogen flow rate to a total rate of nitrogen and argon is discontinuously increased from almost zero to a high level in the range of 30% to 50% to obtain the step-graded nitrogen compositional ratio profile.

It is also preferable that the nitrogen containing compositionally graded refractory metal layer has a slope-graded nitrogen compositional ratio profile, so that the lower region of the nitrogen containing compositionally graded refractory metal layer is substantially free of nitrogen, whilst the upper region of the nitrogen containing compositionally graded refractory metal layer has a compositional ratio gradually increased up to in the range of from 30% to 80%.

It is further preferable that the nitrogen flow rate to a total rate of nitrogen and argon is continuously increased from almost zero to a high level in the range of 30% to 50% to obtain the slope-graded nitrogen compositional ratio profile.

It is also preferable that the first atmosphere free of nitrogen comprises an inert gas free of nitrogen.

It is further preferable that the inert gas free of nitrogen comprises an argon gas.

It is also preferable that the first atmosphere free of nitrogen comprises a vacuum.

The third present invention provides a method of forming a self-aligned silicide layer on a silicon region bounded with a silicon oxide region. The method comprises the following steps. A first refractory metal layer is formed, which extends over the silicon region and the silicon oxide region. The first refractory metal layer is made of a first refractory metal. The first refractory metal layer comprises a first part on the silicon region and a second part on the silicon oxide region. A second refractory metal layer is formed on the first refractory metal layer. The second refractory metal layer is made of a second refractory metal and contains nitrogen. The second refractory metal layer has a film stress of not higher than $1 \times 10^{10}$ dyne/cm$^2$. A heat treatment is carried out in a first atmosphere substantially free of nitrogen so as to cause both a silicidation of a lower region of the first part of the first refractory metal layer and a nitration of an upper region of the first part of the first refractory metal layer and an entire region of the second part of the first refractory metal layer, whereby a C49-structured refractory metal silicide layer is formed only on the silicon region.

The nitrogen containing second refractory metal layer has a low film stress of not higher than $1 \times 10^{10}$ dyne/cm$^2$. This low film stress of the nitrogen containing second refractory metal layer reduces the necessary force for plastic deformations of the refractory metal silicide layer, the first refractory metal layer and the nitrogen containing second refractory metal layer during the continuous salicidation reaction. This reduction in the necessary force for the plastic deformations of the refractory metal silicide layer, the first refractory metal layer and the nitrogen containing second refractory metal layer facilitates the plastic deformations of the refractory metal silicide layer, the first refractory metal layer and the second nitrogen containing second refractory metal layer. This further facilitates immersions of the growing refractory metal silicide layer into the silicon region.

Namely, the provision of the nitrogen containing second refractory metal layer with the low film stress on the first refractory metal layer decreases the required force for those plastic deformations of the refractory metal silicide layer, the first refractory metal layer and the nitrogen containing second refractory metal layer. This means that the provision of the nitrogen containing second refractory metal layer on the first refractory metal layer does provide substantially no resistance nor bar to the plastic deformations of the refractory metal silicide layer, the first refractory metal layer and the nitrogen containing second refractory metal layer. Although the continuous growth of the refractory metal silicide layer with immersion into the surface region of the silicon region needs the plastic deformations of not only the titanium silicide layer but also the titanium film and the titanium nitride film, the provision of the nitrogen containing second refractory metal layer with the low film stress on the first refractory metal layer provide no resistance nor bar to the continuous growth of the refractory metal silicide layer with immersion into the surface region of the silicon layer or silicon region. No resistance nor bar to the continuous growth of the refractory metal silicide layer with immersion into the surface region of the silicon region does not reduce the rate of the refractory metal silicidation reaction, whereby the refractory metal nitrate reaction does not exceed the refractory metal silicidation reaction. This may make it possible to cause the required refractory metal silicidation reaction. Particularly, even if the silicon region is defined by the silicon oxide regions to form a line with a reduced width, the required force for the plastic deformations of the refractory metal silicide layer, the first refractory metal layer and the nitrogen containing second refractory metal layer is not relatively high due to the low film stress of the nitrogen containing second refractory metal layer. This facilitates the continuous growth of the refractory metal silicide layer with immersion into the surface region of the silicon region, resulting in no reduction in the rate of the refractory metal silicidation reaction, whereby the refractory metal nitrate reaction does not exceed the refractory metal silicidation reaction. This may make it possible to cause the required titanium silicidation reaction.

Consequently, the low film stress of not higher than $1 \times 10^{10}$ dyne/cm$^2$ of the nitrogen containing refractory metal layer is effective to suppress the excess nitration reaction and allows a reduction in thickness of the silicide layer as well as applicable to silicide the line-shaped silicon layer or silicon region.

Accordingly, the low film stress of the nitrogen containing second refractory metal layer makes the self-aligned refractory metal silicide layer free from the above problems with the first and second conventional methods. The low film stress of the nitrogen containing second refractory metal layer makes the self-aligned refractory metal silicide layer free from a problem with any over-growth of the silicide layer onto the silicon oxide region. The low film stress of the nitrogen containing second refractory metal layer is capable of suppressing any excess refractory metal nitration reaction. The low film stress of the nitrogen containing second refractory metal layer allows a reduction in thickness of the silicide layer. The low film stress of the nitrogen containing second refractory metal layer allows a self-aligned refractory metal silicide layer to be in the form of a line with a reduced width on a silicon region surrounded by a silicon oxide region. The low film stress of the nitrogen containing second refractory metal layer is capable of reducing the necessary force for plastic deformations of the refractory metal silicide layer and films laminated thereon. The low film stress of the nitrogen containing second refractory metal layer does not need such a high temperature heat treatment as to deteriorate characteristics of a semiconductor device having the refractory metal silicide layer. The low film stress of the nitrogen containing second refractory metal layer facilitates etching to the unsilicided layer such as the refractory metal nitride film without any over-etching to the refractory metal silicide layer. It is preferable to further comprise a step of : removing the second refractory metal layer and an unsilicided remaining region of the first refractory metal layer to show a surface of the C49-structured refractory metal silicide layer and also show a surface of the silicon oxide region.

It is preferable to furthermore comprise a step of : carrying out a further heat treatment in a second atmosphere substantially free of nitrogen so as to cause a phase transition from C49 crystal structure to C54 crystal structure whereby the C49-structured refractory metal silicide layer is made into a C54-structured refractory metal silicide layer.

It is preferable that the first refractory metal and the second refractory metal are the same.

It is further preferable that the first and second refractory metals are titanium so that the first refractory metal layer comprises a titanium layer and the second refractory metal comprises a titanium nitride layer.

It is furthermore preferable that a compositional ratio of nitrogen to titanium of the second refractory metal layer is in the range of 30% to 80%.

It is still further preferable that a compositional ratio of nitrogen to titanium of the second refractory metal layer is in the range of 45% to 55%.

It is yet further preferable that the titanium nitride layer as the second refractory metal layer is formed by a reactive sputtering method, wherein a titanium target is sputtered in an argon-nitrogen mixture atmosphere.

It is moreover preferable that a nitrogen flow rate to a total flow rate of nitrogen and argon is set in the range of 30% to 50%.

It is also preferable that the first atmosphere free of nitrogen comprises an inert gas free of nitrogen.

It is further preferable that the inert gas free of nitrogen comprises an argon gas.

It is also preferable that the first atmosphere free of nitrogen comprises a vacuum.

It is also preferable that the titanium nitride layer as the second refractory metal layer is formed by a long slow sputtering method under conditions that a distance between a titanium target and the silicon region is not less than a half size of a target and a pressure is controlled in the range of 0.2 mTorr to 0.4 mTorr.

It is also preferable that the titanium nitride layer as the second refractory metal layer is formed by a sputtering method, wherein a titanium nitride target having a compositional ratio of nitrogen to titanium in the range of 30% to 80% is sputtered with an argon.

It is also preferable that the first refractory metal and the second refractory metal are different from each other.

The fourth present invention provides a method of forming a self-aligned silicide layer on a silicon region bounded with a silicon oxide region. The method comprises the following steps. A nitrogen containing compositionally graded refractory metal layer is formed which extends over the silicon region and the silicon oxide region. The nitrogen containing compositionally graded refractory metal layer comprises a first part on the silicon region and a second part on the silicon oxide region. The nitrogen containing compositionally graded refractory metal layer has such a compositional grade that a compositional ratio of nitrogen is varied in a thickness direction and is reduced toward a bottom surface of the nitrogen containing compositionally graded refractory metal layer, so that a lower region of the nitrogen containing compositionally graded refractory metal layer is substantially free of nitrogen. An upper region of the nitrogen containing compositionally graded refractory metal layer has a film stress of not higher than $1 \times 10^{10}$ dynecm$^2$. A heat treatment is carried out in a first atmosphere substantially free of nitrogen so as to cause both a silicidation of a lower region of the first part of the nitrogen containing compositionally graded refractory metal layer and a nitration of an upper region of the first part of the nitrogen containing compositionally graded refractory metal layer and an entire region of the second part of the nitrogen containing compositionally graded refractory metal layer, whereby a C49-structured refractory metal silicide layer is formed only on the silicon region.

The upper region of the nitrogen containing compositionally graded refractory metal layer has a low film stress of not higher than $1 \times 10^{10}$ dyne/cm$^2$. This low film stress of the upper region of the nitrogen containing compositionally graded refractory metal layer reduces the necessary force for plastic deformations of the refractory metal silicide layer and the upper and lower regions of the nitrogen containing compositionally graded refractory metal layer during the continuous silicidation reaction. This reduction in the necessary force for the plastic deformations of the refractory metal silicide layer and the upper and lower regions of the nitrogen containing compositionally graded refractory metal layer facilitates the plastic deformations of the refractory metal silicide layer and the upper and lower regions of the nitrogen containing compositionally graded refractory metal layer. This further facilitates immersions of the growing refractory metal silicide layer into the silicon region.

Namely, the low film stress of the upper region of the nitrogen containing compositionally graded refractory metal layer decreases the required force for those plastic deformations of the refractory metal silicide layer and the upper and lower regions of the nitrogen containing compositionally graded refractory metal layer. This means that the provision of the nitrogen containing compositionally graded refractory metal layer does provide substantially no resistance nor bar to the plastic deformations of the refractory metal silicide layer and the upper and lower regions of the nitrogen containing compositionally graded refractory metal layer. Although the continuous growth of the refractory metal silicide layer with immersion into the surface region of the silicon region needs the plastic deformations of not only the titanium silicide layer but also the upper and lower regions of the nitrogen containing compositionally graded refractory metal layer, the low film stress of the upper region of the nitrogen containing compositionally graded refractory metal layer provides no resistance nor bar to the continuous growth of the refractory metal silicide layer with immersion into the surface region of the silicon layer or silicon region. No resistance nor bar to the continuous growth of the refractory metal silicide layer with immersion into the surface region of the silicon region does not reduce the rate of the refractory metal silicidation reaction, whereby the refractory metal nitrate reaction does not exceed the refractory metal silicidation reaction. This may make it possible to cause the required refractory metal silicidation reaction. Particularly, even if the silicon region is defined by the silicon oxide regions to form a line with a reduced width, the required force for the plastic deformations of the refractory metal silicide layer and the upper and lower regions of the nitrogen containing compositionally graded refractory metal layer is not relatively high due to the low film stress of the nitrogen containing second refractory metal layer. This facilitates the continuous growth of the refractory metal silicide layer with immersion into the surface region of the silicon region, resulting in no reduction in the rate of the refractory metal silicidation reaction, whereby the refractory metal nitrate reaction does not exceed the refractory metal silicidation reaction. This may make it possible to cause the required titanium silicidation reaction.

Consequently, the low film stress of not higher than $1 \times 10^{10}$ dyne/cm$^2$ of the upper region of the nitrogen containing compositionally graded refractory metal layer is effective to suppress the excess nitration reaction and allows a reduction in thickness of the silicide layer as well as applicable to silicide the line-shaped silicon layer or silicon region.

Accordingly, the low film stress of the upper region of the nitrogen containing compositionally graded refractory metal layer makes the self-aligned refractory metal silicide layer free from the above problems with the first and second conventional methods. The low film stress of the upper region of the nitrogen containing compositionally graded refractory metal layer makes the self-aligned refractory metal silicide layer free from a problem with any overgrowth of the silicide layer onto the silicon oxide region. The low film stress of the upper region of the nitrogen containing compositionally graded refractory metal layer is capable of suppressing any excess refractory metal nitration reaction. The low film stress of the upper region of the nitrogen containing compositionally graded refractory metal layer allows a reduction in thickness of the silicide layer. The low film stress of the upper region of the nitrogen containing compositionally graded refractory metal layer allows a self-aligned refractory metal silicide layer to be in the form of a line with a reduced width on a silicon region surrounded by a silicon oxide region. The low film stress of the upper region of the nitrogen containing compositionally graded refractory metal layer is capable of reducing the necessary force for plastic deformations of the refractory metal silicide layer and the nitrogen containing compositionally graded refractory metal layer laminated thereon. The low film stress of the upper region of the nitrogen containing compositionally graded refractory metal layer does not need such a high temperature heat treatment as to deteriorate characteristics of a semiconductor device having the refractory metal silicide layer. The low film stress of the upper region of the nitrogen containing compositionally graded refractory metal layer facilitates etching to the unsilicided layer such as the upper region of the nitrogen containing compositionally graded refractory metal layer without any over-etching to the refractory metal silicide layer.

It is preferable to further comprise a step of: removing an unsilicided remaining region of the nitrogen containing compositionally graded refractory metal layer to show a surface of the C49-structured refractory metal silicide layer and also show a surface of the silicon oxide region.

It is preferable to hermore comprise a step of : carrying out a further heat treatment in a second atmosphere substantially free of nitrogen so as to cause a phase transition from C49 crystal structure to C54 crystal structure whereby the C49-structured refractory metal silicide layer is made into a C54-structured refractory metal silicide layer.

It is preferable that a refractory metal of the nitrogen containing compositionally graded refractory metal layer is titanium.

It is further preferable that a compositional ratio of nitrogen to titanium of the upper region of the nitrogen containing compositionally graded refractory metal layer is in the range of 30% to 80%.

It is furthermore preferable that a compositional ratio of nitrogen to titanium of the upper region of the nitrogen containing compositionally graded refractory metal layer is in the range of 45% to 55%.

It is moreover preferable that the nitrogen containing compositionally graded refractory metal layer is formed by a reactive sputtering method, wherein a titanium target is sputtered in an argon-nitrogen mixture atmosphere by changing a nitrogen flow rate to a total rate of nitrogen and argon.

It is still further preferable that a nitrogen flow rate to a total flow rate of nitrogen and argon is controlled in the range of 30% to 50% during the upper region of the nitrogen containing compositionally graded refractory metal layer is deposited.

It is also preferable that the nitrogen containing compositionally graded refractory metal layer is formed by a long slow sputtering method by changing a nitrogen flow rate to a total rate of nitrogen and argon under conditions that a distance between a titanium target and the silicon region is not less than a half size of a target and a pressure is controlled in the range of 0.2 mTorr to 0.4 mTorr.

It is also preferable that the nitrogen containing compositionally graded refractory metal layer has a step-graded nitrogen compositional ratio profile, so that the lower region of the nitrogen containing compositionally graded refractory metal layer is substantially free of nitrogen, whilst the upper region of the nitrogen containing compositionally graded refractory metal layer has a compositional ratio of in the range of 30% to 80%.

It is further preferable that the nitrogen flow rate to a total rate of nitrogen and argon is discontinuously increased from almost zero to a high level in the range of 30% to 50% to obtain the step-graded nitrogen compositional ratio profile.

It is also preferable that the nitrogen containing compositionally graded refractory metal layer has a slope graded nitrogen compositional ratio profile, so that the lower region of the nitrogen containing compositionally graded refractory metal layer is substantially free of nitrogen, whilst the upper region of the nitrogen containing compositionally graded refractory metal layer has a compositional ratio gradually increased up to in the range of from 30% to 80%.

It is further preferable that the nitrogen flow rate to a total rate of nitrogen and argon is continuously increased from almost zero to a high level in the range of 30% to 50% to obtain the slope-graded nitrogen compositional ratio profile.

It is also preferable that the first atmosphere free of nitrogen comprises an inert gas free of nitrogen.

It is further preferable that the inert gas free of nitrogen comprises an argon gas.

It is also preferable that the first atmosphere free of nitrogen comprises a vacuum.

The fifth present invention provides a C54-structured silicide layer self-aligned on a silicon region bounded with a silicon oxide region, wherein the C54-structured silicide layer is formed by a method comprising the following steps. A first refractory metal layer is formed which extends over the silicon region and the silicon oxide region. The first refractory metal layer is made of a first refractory metal. The first refractory metal layer comprises a first part on the silicon region and a second part on the silicon oxide region. A second refractory metal layer is formed on the first refractory metal layer, the second refractory metal layer being made of a second refractory metal and containing nitrogen, wherein the second refractory metal layer has a film stress of not higher than $1 \times 10^{10}$ dyne/cm$^2$. A heat treatment is carried out in a first atmosphere substantially free of nitrogen so as to cause both a silicidation of a lower region of the first part of the first refractory metal layer and a nitration of an upper region of the first part of the first refractory metal layer and an entire region of the second part of the first refractory metal layer, whereby a C49-structured refractory metal silicide layer is formed only on the silicon region. The second refractory metal layer and an unsilicided remaining region of the first refractory metal layer are removed to show a surface of the C49-structured refractory metal silicide layer and also show a surface of the silicon oxide region. A further heat treatment is carried out in a second atmosphere substantially free of nitrogen so as to cause a phase transition from C49 crystal structure to C54 crystal structure whereby the C49-structured refractory metal silicide layer is made into a C54-structured refractory metal silicide layer.

The nitrogen containing second refractory metal layer has a low film stress of not higher than $1 \times 10^{10}$ dyne/cm$^2$. This low film stress of the nitrogen containing second refractory metal layer reduces the necessary force for plastic deformations of the refractory metal silicide layer, the first refractory metal layer and the nitrogen containing second refractory metal layer during the continuous silicidation reaction. This reduction in the necessary force for the plastic deformations of the refractory metal silicide layer, the first refractory metal layer and the nitrogen containing second refractory metal layer facilitates the plastic deformations of the refractory metal silicide layer, the first refractory metal layer and the second nitrogen containing second refractory metal layer. This further facilitates immersions of the growing refractory metal silicide layer into the silicon region.

Namely, the provision of the nitrogen containing second refractory metal layer with the low film stress on the first refractory metal layer decreases the required force for those plastic deformations of the refractory metal silicide layer, the first refractory metal layer and the nitrogen containing second refractory metal layer. This means that the provision of the nitrogen containing second refractory metal layer on the first refractory metal layer does provide substantially no resistance nor bar to the plastic deformations of the refractory metal silicide layer, the first refractory metal layer and the nitrogen containing second refractory metal layer. Although the continuous growth of the refractory metal silicide layer with immersion into the surface region of the silicon region needs the plastic deformations of not only the titanium silicide layer but also the titanium film and the titanium nitride film, the provision of the nitrogen containing second refractory metal layer with the low film stress on the first refractory metal layer provide no resistance nor bar to the continuous growth of the refractory metal silicide layer with immersion into the surface region of the silicon layer or silicon region. No resistance nor bar to the continuous growth of the refractory metal silicide layer with immersion into the surface region of the silicon region does not reduce the rate of the refractory metal silicidation reaction, whereby the refractory metal nitrate reaction does not exceed the refractory metal silicidation reaction. This may make it possible to cause the required refractory metal silicidation reaction. Particularly, even if the silicon region is defined by the silicon oxide regions to form a line with a reduced width, the required force for the plastic deformations of the refractory metal silicide layer, the first refractory metal layer and the nitrogen containing second refractory metal layer is not relatively high due to the low film stress of the nitrogen containing second refractory metal layer. This facilitates the continuous growth of the refractory metal silicide layer with immersion into the surface region of the silicon region, resulting in no reduction in the rate of the refractory metal silicidation reaction, whereby the refractory metal nitrate reaction does not exceed the refractory metal silicidation reaction. This may make it possible to cause the required titanium silicidation reaction.

Consequently, the low film stress of not higher than $1 \times 10^{10}$ dyne/cm$^2$ of the nitrogen containing refractory metal layer is effective to suppress the excess nitration reaction and allows a reduction in thickness of the silicide layer as well as applicable to silicide the line-shaped silicon layer or silicon region.

Accordingly, the low film stress of the nitrogen containing second refractory metal layer makes the self-aligned refractory metal silicide layer free from the above problems with the first and second conventional methods. The low film stress of the nitrogen containing second refractory metal layer makes the self-aligned refractory metal silicide layer free from a problem with any over-growth of the silicide layer onto the silicon oxide region. The low film stress of the nitrogen containing second refractory metal layer is capable of suppressing any excess refractory metal nitration reaction. The low film stress of the nitrogen containing second refractory metal layer allows a reduction in thickness of the silicide layer. The low film stress of the nitrogen containing second refractory metal layer allows a self-aligned refractory metal silicide layer to be in the form of a line with a reduced width on a silicon region surrounded by a silicon oxide region. The low film stress of the nitrogen containing second refractory metal layer is capable of reducing the necessary force for plastic deformations of the refractory metal silicide layer and films laminated thereon. The low film stress of the nitrogen containing second refractory metal layer does not need such a high temperature heat treatment as to deteriorate characteristics of a semiconductor device having the refractory metal silicide layer. The low film stress of the nitrogen containing second refractory metal layer facilitates etching to the unsilicided layer such as the refractory metal nitride film without any over-etching to the refractory metal silicide layer. It is preferable that the first refractory metal and the second refractory metal are the same.

It is further preferable that the first and second refractory metals are titanium so that the first refractory metal layer comprises a titanium layer and the second refractory metal comprises a titanium nitride layer is furthermore preferable that a compositional ratio of nitrogen to titanium of the second refractory metal layer is in the range of 30% to 80%.

It is still further preferable that a compositional ratio of nitrogen to titanium of the second refractory metal layer is in the range of 45% to 55%.

It is moreover preferable that the titanium nitride layer as the second refractory metal layer is formed by a reactive sputtering method, wherein a titanium target is sputtered in an argon-nitrogen mixture atmosphere.

It is yet further preferable that a nitrogen flow rate to a total flow rate of nitrogen and argon is set in the range of 30% to 50%.

It is also preferable that the first atmosphere free of nitrogen comprises an inert gas free of nitrogen.

It is further preferable that the inert gas free of nitrogen comprises an argon gas.

It is also preferable that the first atmosphere free of nitrogen comprises a vacuum.

It is also preferable that the titanium nitride layer as the second refractory metal layer is formed by a long slow sputtering method under conditions that a distance between a titanium target and the silicon region is not less than a half size of a target and a pressure is controlled in the range of 0.2 mTorr to 0.4 mTorr.

It is also preferable that the titanium nitride layer as the second refractory metal layer is formed by a sputtering method, wherein a titanium nitride target having a compositional ratio of nitrogen to titanium in the range of 30% to 80% is sputtered with an argon.

It is also preferable that the first refractory metal and the second refractory metal are different from each other.

The sixth present invention provides a C54-structured silicide layer self-aligned on a silicon region bounded with a silicon oxide region, wherein the C54-structured silicide layer is formed by a method comprising the following steps. A nitrogen containing compositionally graded refractory metal layer is formed which extends over the silicon region and the silicon oxide region. The nitrogen containing compositionally graded refractory metal layer comprises a first part on the silicon region and a second part on the silicon oxide region. The nitrogen containing compositionally graded refractory metal layer has such a compositional grade that a compositional ratio of nitrogen is varied in a thickness direction and is reduced toward a bottom surface of the nitrogen containing compositionally graded refractory metal layer, so that a lower region of the nitrogen containing compositionally graded refractory metal layer is substantially free of nitrogen An upper region of the nitrogen containing compositionally graded refractory metal layer has a film stress of not higher than $1\times10^{10}$ dyne/cm$^2$. A heat treatment is carried out in a first atmosphere substantially free of nitrogen so as to cause both a silicidation of a lower region of the first part of the nitrogen containing compositionally graded refractory metal layer and a nitration of an upper region of the first part of the nitrogen containing compositionally graded refractory metal layer and an entire region of the second part of the nitrogen containing compositionally graded refractory metal layer, whereby a C49-structured refractory metal silicide layer is formed only on the silicon region. An unsilicided remaining region of the nitrogen containing compositionally graded refractory metal layer is removed to show a surface of the C49-structured refractory metal silicide layer and also show a surface of the silicon oxide region. A further heat treatment is carried out in a second atmosphere substantially free of nitrogen so as to cause a phase transition from C49 crystal structure to C54 crystal structure whereby the C49-structured refractory metal silicide layer is made into a C54-structured refractory metal silicide layer.

The nitrogen containing second refractory metal layer has a low film stress of not higher than $1\times10^{10}$ dyne/cm$^2$. This low film stress of the nitrogen containing second refractory metal layer reduces the necessary force for plastic deformations of the refractory metal silicide layer, the first refractory metal layer and the nitrogen containing second refractory metal layer during the continuous silicidation reaction. This reduction in the necessary force for the plastic deformations of the refractory metal silicide layer, the first refractory metal layer and the nitrogen containing second refractory metal layer facilitates the plastic deformations of the refractory metal silicide layer, the first refractory metal layer and the second nitrogen containing second refractory metal layer. This further facilitates immersions of the growing refractory metal silicide layer into the silicon region.

Namely, the provision of the nitrogen containing second refractory metal layer with the low film stress on the first refractory metal layer decreases the required force for those plastic deformations of the refractory metal silicide layer, the first refractory metal layer and the nitrogen containing second refractory metal layer. This means that the provision of the nitrogen containing second refractory metal layer on the first refractory metal layer does provide substantially no resistance nor bar to the plastic deformations of the refractory metal silicide layer, the first refractory metal layer and the nitrogen containing second refractory metal layer. Although the continuous growth of the refractory metal silicide layer with immersion into the surface region of the silicon region needs the plastic deformations of not only the titanium silicide layer but also the titanium film and the titanium nitride film, the provision of the nitrogen containing second refractory metal layer with the low film stress on the first refractory metal layer provide no resistance nor bar to the continuous growth of the refractory metal silicide layer with immersion into the surface region of the silicon layer or silicon region. No resistance nor bar to the continuous growth of the refractory metal silicide layer with immersion into the surface region of the silicon region does not reduce the rate of the refractory metal silicidation reaction, whereby the refractory metal nitrate reaction does not exceed the refractory metal silicidation reaction. This may make it possible to cause the required refractory metal silicidation reaction. Particularly, even if the silicon region is defined by the silicon oxide regions to form a line with a reduced width, the required force for the plastic deformations of the refractory metal silicide layer, the first refractory metal layer and the nitrogen containing second refractory metal layer is not relatively high due to the low film stress of the nitrogen containing second refractory metal layer. This facilitates the continuous growth of the refractory metal silicide layer with immersion into the surface region of the silicon region, resulting in no reduction in the rate of the refractory metal silicidation reaction, whereby the refractory metal nitrate reaction does not exceed the refractory metal silicidation reaction. This may make it possible to cause the required titanium silicidation reaction.

Consequently, the low film stress of not higher than $1\times10^{10}$dyne/cm$^2$ of the nitrogen containing refractory metal layer is effective to suppress the excess nitration reaction and allows a reduction in thickness of the silicide layer as well as applicable to silicide the line-shaped silicon layer or silicon region.

Accordingly, the low film stress of the nitrogen containing second refractory metal layer makes the self-aligned refractory metal silicide layer free from the above problems with the first and second conventional methods. The low film stress of the nitrogen containing second refractory metal layer makes the self-aligned refractory metal silicide layer free from a problem with any over-growth of the silicide layer onto the silicon oxide region. The low film stress of the nitrogen containing second refractory metal layer is capable of suppressing any excess refractory metal nitration reaction. The low film stress of the nitrogen containing refractory metal layer allows a reduction in thickness of the silicide layer. The low film stress of the nitrogen containing second refractory metal layer allows a self-aligned refractory metal silicide layer to be in the form of a line with a reduced width on a silicon region surrounded by a silicon oxide region. The low film stress of the nitrogen containing second refractory metal layer is capable of reducing the necessary force for plastic deformations of the refractory metal silicide layer and films laminated thereon. The low film stress of the nitrogen containing second refractory metal layer does not need such a high temperature heat treatment as to deteriorate characteristics of a semiconductor device having the refractory metal silicide layer. The low film stress of the nitrogen containing second refractory metal layer facilitates. etching to the unsilicided layer such as the refractory metal nitride film without any over-etching to the refractory metal silicide layer. It is preferable that a refractory metal of the nitrogen containing compositionally graded refractory metal layer is titanium.

It is further preferable that a compositional ratio of nitrogen to titanium of the upper region of the nitrogen containing compositionally graded refractory metal layer is in the range of 30% to 80%.

It is furthermore preferable that a compositional ratio of nitrogen to titanium of the upper region of the nitrogen containing compositionally graded refractory metal layer is in the range of 45% to 55%.

It is also preferable that the nitrogen containing compositionally graded refractory metal layer is formed by a reactive sputtering method, wherein a titanium target is sputtered in an argon-nitrogen mixture atmosphere by changing a nitrogen flow rate to a total rate of nitrogen and argon.

It is further preferable that a nitrogen flow rate to a total flow rate of nitrogen and argon is controlled in the range of 30% to 50% during the upper region of the nitrogen containing compositionally graded refractory metal layer is deposited.

It is also preferable that the nitrogen containing compositionally graded refractory metal layer is formed by a long slow sputtering method by changing a nitrogen flow rate to a total rate of nitrogen and argon under conditions that a distance between a titanium target and the silicon region is not less than a half size of a target and a pressure is controlled in the range of 0.2 mTorr to 0.4 mTorr.

It is also preferable that the nitrogen containing compositionally graded refractory metal layer has a step-graded nitrogen compositional ratio profile, so that the lower region of the nitrogen containing compositionally graded refractory metal layer is substantially free of nitrogen, whilst the upper region of the nitrogen containing compositionally graded refractory metal layer has a compositional ratio of in the range of 30% to 80%.

It is further preferable that the nitrogen flow rate to a total rate of nitrogen and argon is discontinuously increased from almost zero to a high level in the range of 30% to 50% to obtain the step graded nitrogen compositional ratio profile.

It is also preferable that the nitrogen containing compositionally graded refractory metal layer has a slope-graded nitrogen compositional ratio profile, so that the lower region of the nitrogen containing compositionally graded refractory metal layer is substantially free of nitrogen, whilst the upper region of the nitrogen containing compositionally graded refractory metal layer has a compositional ratio gradually increased up to in the range of from 30% to 80%.

It is further preferable that the nitrogen flow rate to a total rate of nitrogen and argon is continuously increased from almost zero to a high level in the range of 30% to 50% to obtain the slope-graded nitrogen compositional ratio profile.

It is also preferable that the first atmosphere free of nitrogen comprises an inert gas free of nitrogen.

It is further preferable that the inert gas free of nitrogen comprises an argon gas.

It is also preferable that the first atmosphere free of nitrogen comprises a vacuum.

PREFERRED EMBODIMENTS

First Embodiment

A first embodiment according to the present invention will be described in detail with reference to FIGS. 4A through 4E which are fragmentary cross sectional elevation views illustrative of MOS field effect transistors in sequential steps involved in a novel fabrication method in a first embodiment in accordance with the present invention.

Figure 4A:
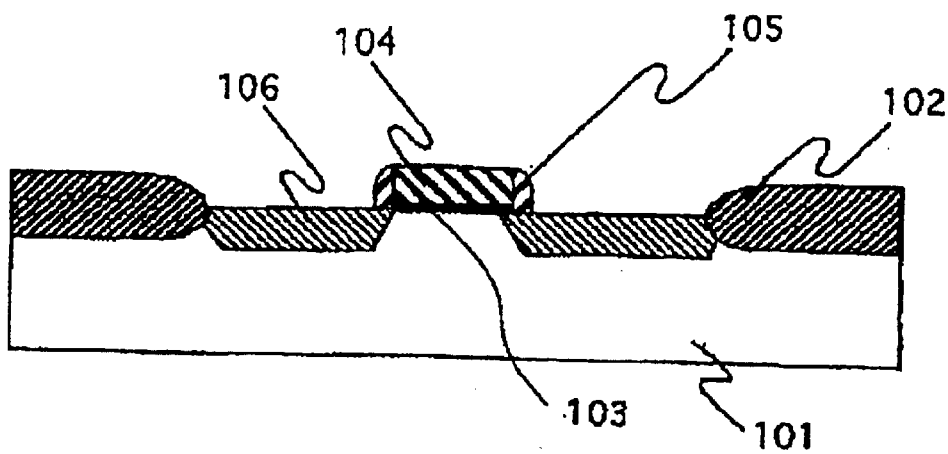
FIGS. 4A through 4E are fragmentary cross sectional elevation views illustrative of MOS field effect transistors in sequential steps involved in a novel fabrication method in a first embodiment in accordance with the present invention.

With reference to FIG. 4A, field oxide films 102 are selectively formed on a surface of a silicon substrate 101 by a local oxidation of silicon method, thereby to define an active region surrounded by the field oxide films 102. An ion-implantation of an impurity into the active region of the silicon substrate 101 is carried out to increase a withstand voltage thereof. A thermal oxidation of silicon is carried out to form a gate oxide film 103 on the active region of the silicon substrate 101. A chemical vapor deposition method is carried out to deposit a polysilicon film having a thickness of about 100 nanometers on an entire region of the silicon substrate, so that the polysilicon film extends over the field oxide films 102 and the gate oxide film 103. The polysilicon film is doped with an impurity such as phosphorus to reduce a resistivity of the polysilicon film. The polysilicon film is patterned by a photolithography technique in order to form a polysilicon gate electrode 104 on the gate oxide film 103. A chemical vapor deposition method is carried out to deposit a silicon oxide film having a thickness of about 100 nanometers on an entire region of the silicon substrate 101, so that the silicon oxide film extends over the polysilicon gate electrode 104, the active region of the silicon substrate 101 and the field oxide films 102. An anisotropic etching to the silicon oxide film is carried out to leave the silicon oxide film only on side walls of the polysilicon gate electrode 104, thereby to form side wall spacers 105 on the side walls of the polysilicon gate electrode 104. An ion-implantation of an impurity such as brown or arsenic into the active region of the silicon substrate 101 is carried out by using the polysilicon gate electrode 104, the side wall spacers 105 and the field oxide films 102 as masks, thereby to form impurity doped regions in upper regions of the silicon substrate 101. If the impurity is arsenic, a dose is set at about $1\times10^{15}$ cm$^{-2}$. A heat treatment to the silicon substrate 101 is carried out at a temperature of about 900° C. to form source/drain diffusion layers 106 in the upper regions of the silicon substrate 101.

Figure 4B:
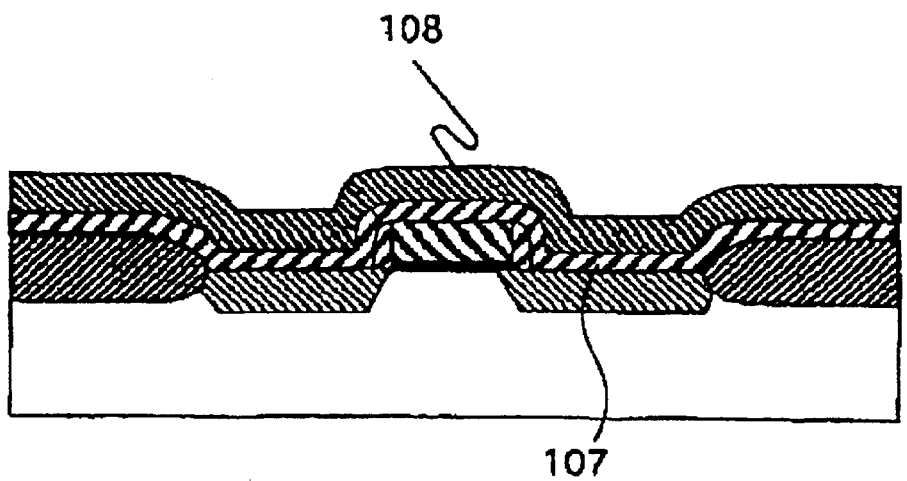

With reference to FIG. 4B, a sputtering method is carried out by sputtering a titanium target with an argon gas to deposit titanium on an entire region of the silicon substrate 101, thereby entirely forming a titanium film 107 having a thickness of about 20 nanometers, so that the titanium film 107 extends over the polysilicon gate electrode 104, the side wall spacers 105, the source drain diffusion layers 106 and the field oxide films 102. Subsequently, a further reactive sputtering method is carried out by sputtering a titanium target in an argon-nitrogen mixture atmosphere to deposit a nitrogen containing titanium film 108 on an entire region of the titanium film 107. The reactive sputtering method may be carried out by a collimate sputtering method which uses a collimate plate having many holes, wherein the collimate plate is placed between the titanium target and the substrate 101. A diameter of the titanium target is 300 millimeters. A distance between the titanium target and the substrate 101 is set to be 100 millimeters. A collimate plate is used which has a thickness of 10 millimeters and has holes of 10 millimeters in diameter. The sputtering is carried out under conditions of a pressure in the range of 2 mTorr to 4 mTorr, a power in the range of 8 kW to 10 kW, with supplying argon and nitrogen gases, wherein a ratio of a nitrogen gas flow rate to a total flow rate of the nitrogen and argon gases is controlled to be in the range of 30% to 50%.

Figure 5:
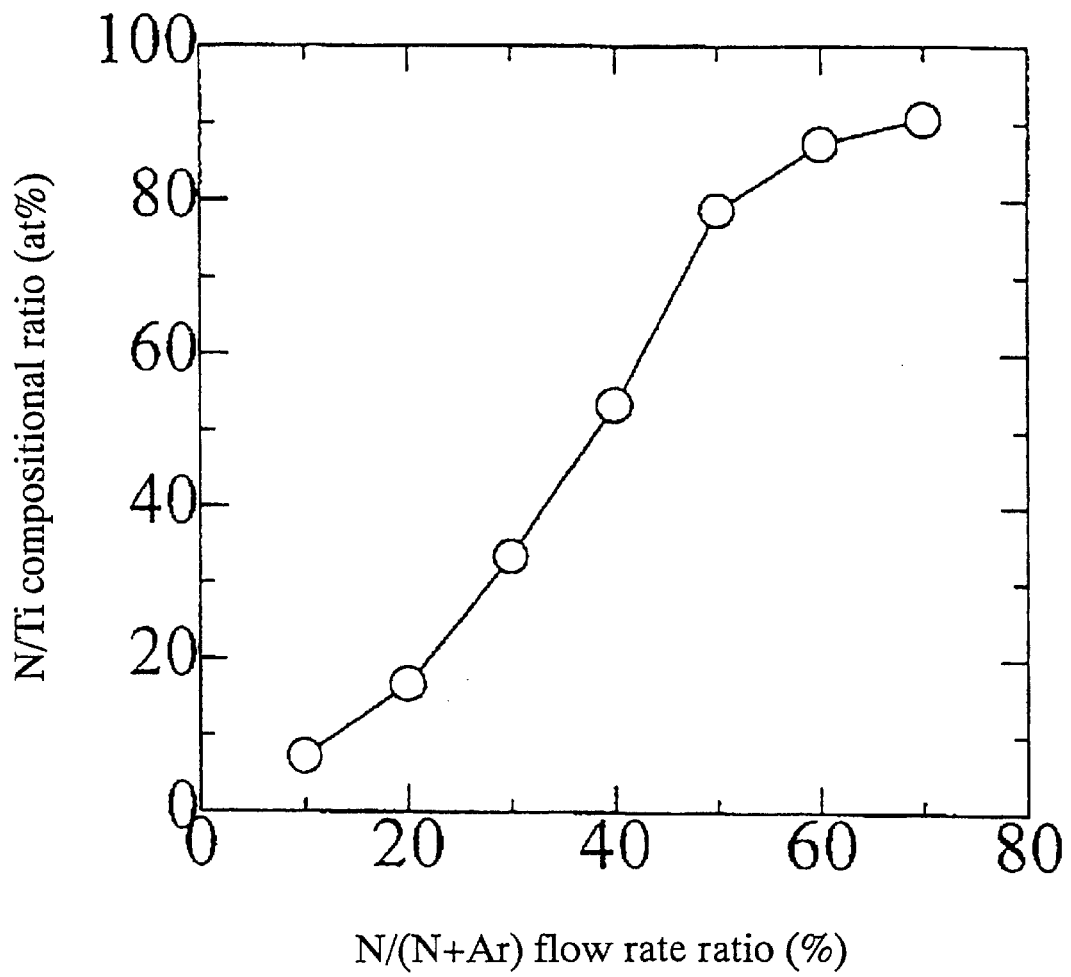
FIG. 5 is a diagram illustrative of variations in a compositional ratio of nitrogen to titanium of the nitrogen containing titanium film over a ratio of a nitrogen gas flow rate to a total flow rate of nitrogen and argon gases, wherein a reactive collimate sputtering method is carried out under conditions of a power of 9 kW and a pressure of 3 mTorr.

FIG. 5 is a diagram illustrative of variations in a compositional ratio of nitrogen to titanium of the nitrogen containing titanium film over a ratio of a nitrogen gas flow rate to a total flow rate of nitrogen and argon gases, wherein a reactive collimate sputtering method is carried out under conditions of a power of 9 kW and a pressure of 3 mTorr. As the ratio of the nitrogen gas flow rate to the total flow rate of the nitrogen and argon gases is increased, then the compositional ratio of nitrogen to titanium of the nitrogen containing titanium film is also increased. As the ratio of the nitrogen gas flow rate to the total flow rate of the nitrogen and argon gases is 30%, then the compositional ratio of nitrogen to titanium of the nitrogen containing titanium film is about 34%. As the ratio of the nitrogen gas flow rate to the total flow rate of the nitrogen and argon gases is 50%, then the compositional ratio of nitrogen to titanium of the nitrogen containing titanium film is about 79%. If the ratio of the nitrogen gas flow rate to the total flow rate of the nitrogen and argon gases is not higher than 50%, then no nitration appears on a surface of the titanium target. If, however, the ratio of the nitrogen gas flow rate to the total flow rate of the nitrogen and argon gases is higher than 50%, then the surface of the titanium target is nitrated. If the surface of the titanium target is not nitrated, then a deposition rate is higher by four times or more than when the surface of the titanium target is nitrated. The conditions for preventing the nitration of the surface of the titanium target depend upon not only the ratio of the nitrogen gas flow rate to the total flow rate of the nitrogen and argon gases but also the pressure and power.

Figure 4C:
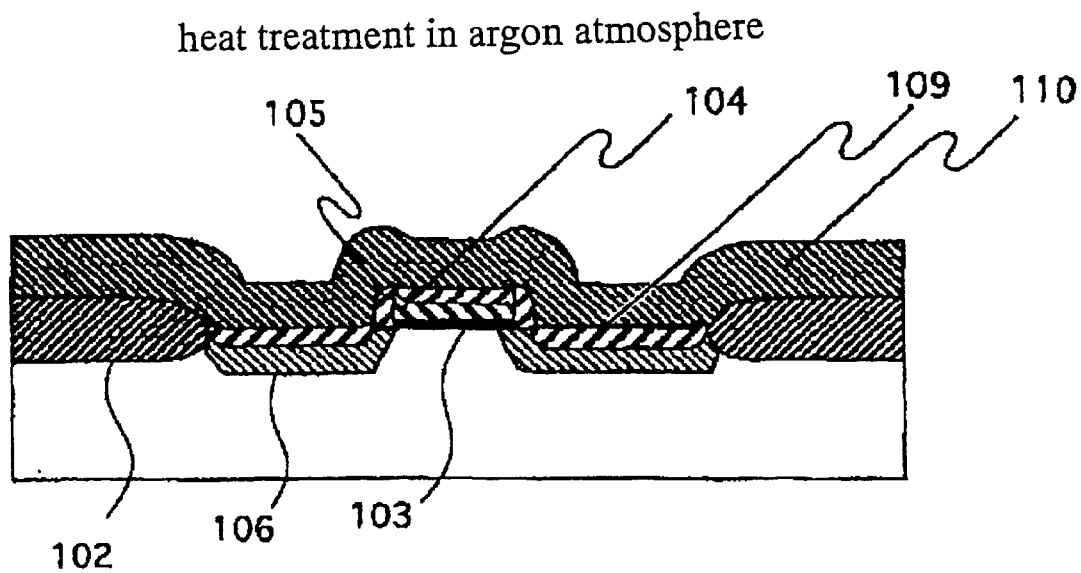

With reference to FIG. 4C, a heat treatment to the silicon substrate 101 is carried out by use of a lamp anneal at a temperature of 700° C. in an argon atmosphere under an atmospheric pressure for 30 seconds, thereby to cause both a titanium nitration reaction and a titanium silicide reaction. This heat treatment causes that silicon atoms in the source/drain diffusion layers 106 and the polysilicon gate electrode 104 are thermally diffused onto interfaces to the titanium film 107, so that the bottom surface of the titanium film 107 on the source/drain diffusion layers 106 and on the polysilicon gate electrode 104 are silicided with the thermally diffused silicon atoms. Subsequently, the titanium silicidation reaction is continued on the interfaces between the growing titanium silicide layers 109 and the source/drain diffusion layers 106 and the polysilicon gate electrode 104, whereby the titanium silicide layers 109 are grown toward the source/drain diffusion layers 106 and the polysilicon gate electrode 104. As a result, the titanium silicide layers 109 on the growth are immersed into the upper regions of the source/drain diffusion layers 106 and the polysilicon gate electrode 104, whereby the titanium silicide layers 109 show plastic deformations toward the source/drain diffusion layers 106 and the polysilicon gate electrode 104 together with further plastic deformations of the nitrogen containing titanium film 108 and the titanium film 107. As will be described in detail later, the nitrogen containing titanium film 108 has a low film stress. This low film stress of the nitrogen containing titanium film 108 reduces the necessary force for the plastic deformation of the nitrogen containing titanium film 108. This reduction in the necessary force for the plastic deformation of the nitrogen containing titanium film 108 facilitates the plastic deformation of the nitrogen containing titanium film 108. This further reduces the total necessary force of the plastic deformations of the titanium silicide layer 109, the titanium film 107 and the nitrogen containing titanium film 108. This reduction in the total necessary force of the plastic deformations facilitates the plastic deformations of the titanium silicide layer 109, the titanium film 107 and the nitrogen containing titanium film 108, thereby facilitating the immersion of the titanium silicide layer 109 on the growth. This means that the growth of the titanium silicide layer 109 is promoted while the titanium silicide reaction exceeds the titanium nitration reaction. The titanium silicide layers 109 has a C49-crystal structure having a relatively high resistivity of about 60 $\mu\Omega$cm. On the other hands, upper regions of the titanium film 107 over the source/drain diffusion layers 106 and the polysilicon gate electrode 104 and further the upper and lower regions of the titanium film 107 over the side wall spacers 105 and the field oxide films 102 are nitrated with nitrogen atoms thermally diffused from the nitrogen containing titanium film 108 overlying the titanium film 107, whereby the upper regions of the titanium film 107 over the source/drain diffusion layers 106 and the polysilicon gate electrode 104 and further the upper and lower regions of the titanium film 107 over the side wall spacers 105 and the field oxide films 102 are made into a nitrogen containing titanium film 110 which extends over the field oxide films 102, the C49-structured titanium silicide layers 109 and the side wall spacers 105. As a result, the titanium silicide layers 109 are self-aligned and selectively formed on the source/drain diffusion layers 106 and the polysilicon gate electrode 104. Namely, the bottom regions of the titanium layer 107 but only on the source/drain diffusion layers 106 and the polysilicon gate electrode 104 are made into the C49-structured titanium silicide layers 109, thereby suppressing the overgrowth of the titanium silicide layer over the side wall spacers 105 and the field oxide films 102. Namely, the titanium film 107 on the side wall spacers 105 and the field oxide films 102 are not silicided. The titanium silicide layers 109, therefore, extend on the bottom surface of the nitrogen containing titanium film 110 and over the source/drain diffusion layers 106 and the polysilicon gate electrode 104.

Contrary to the present invention, if the heat treatment were carried out in the nitrogen atmosphere, then the nitrogen containing titanium film 108 is nitrated with nitrogen supplied from the nitrogen atmosphere. The etching rate of the titanium nitride film is lower than the nitrogen containing titanium film, for which reason the etching to the titanium nitride film overlying the titanium silicide layer is likely to cause an over-etching to the titanium silicide layer, whereby the thickness of the titanium silicide layer is reduced and therefore the sheet resistance of the titanium silicide layer is increased. This means it important for the present invention to carry out the heat treatment in the nitrogen free atmosphere.

Figure 6:
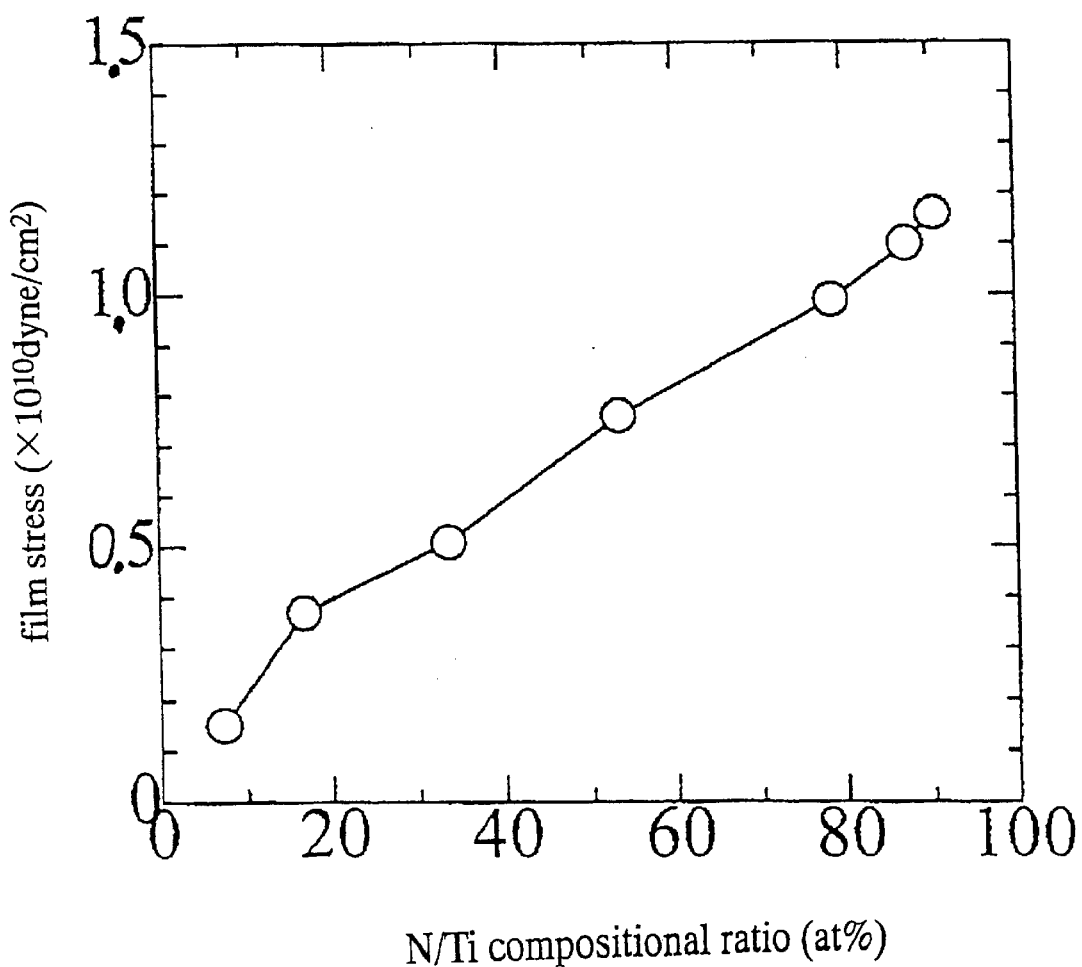
FIG. 6 is a diagram illustrative of variations in film stress or compressive stress of the nitrogen containing titanium film on the titanium film over the compositional ratio of nitrogen to titanium of the nitrogen containing titanium film.

FIG. 6 is a diagram illustrative of variations in film stress or compressive stress of the nitrogen containing titanium film on the titanium film over the compositional ratio of nitrogen to titanium of the nitrogen containing titanium film. The film stress or the compressive was measured by a stress measuring system. As the compositional ratio of nitrogen to titanium of the nitrogen containing titanium film is increased, then the film stress of the nitrogen containing titanium film is also increased. Before the heat treatment, the nitrogen containing titanium film has a compressive stress. However, the compressive stress of the nitrogen containing titanium film is changed to a tensile stress by the heat treatment. As the compressive stress before the heat treatment is small, then a variation from the compressive stress to the tensile stress by the heat treatment is also small. The silicidation reaction is the volume decrease reaction, for which reason if the tensile stress after the heat treatment is large, then the suppression of the silicidation reaction as the volume decrease reaction is large. If, however, the tensile stress after the heat treatment is small, then the suppression of the silicidation reaction as the volume decrease reaction is also small. Therefore, the small compressive stress of the nitrogen containing titanium film is preferable for causing the titanium silicidation reaction or for the formation of the titanium silicide layer As the compositional ratio of nitrogen to titanium of the nitrogen containing titanium film is about 88%, then the film stress as the compressive stress of the nitrogen containing titanium film is about $1.1 \times 10^{10}$ dyne/cm$^2$. As the compositional ratio of nitrogen to titanium of the nitrogen containing titanium film is about 80%, then the film stress as the compressive stress of the nitrogen containing titanium film is about $1.0 \times 10^{10}$ dyne/cm$^2$. As the compositional ratio of nitrogen to titanium of the nitrogen containing titanium film is about 53%, then the film stress as the compressive stress of the nitrogen containing titanium film is about $0.75 \times 10^{10}$ dyne/cm$^2$. As the compositional ratio of nitrogen to titanium of the nitrogen containing titanium film is about 33%, then the film stress as the compressive stress of the nitrogen containing titanium film is about $0.5 \times 10^{10}$ dyne/cm$^2$. As the compositional ratio of nitrogen to titanium of the nitrogen containing titanium film is about 17%, then the film stress as the compressive stress of the nitrogen containing titanium film is about $0.38 \times 10^{10}$ dyne/cm$^2$. In the light of facilitation of the silicidation reaction or the growth of the titanium silicide layer, the small film stress or small compressive stress is preferable, and therefore the low compositional ratio of nitrogen to titanium of the nitrogen containing titanium film is preferable.

Figure 7:
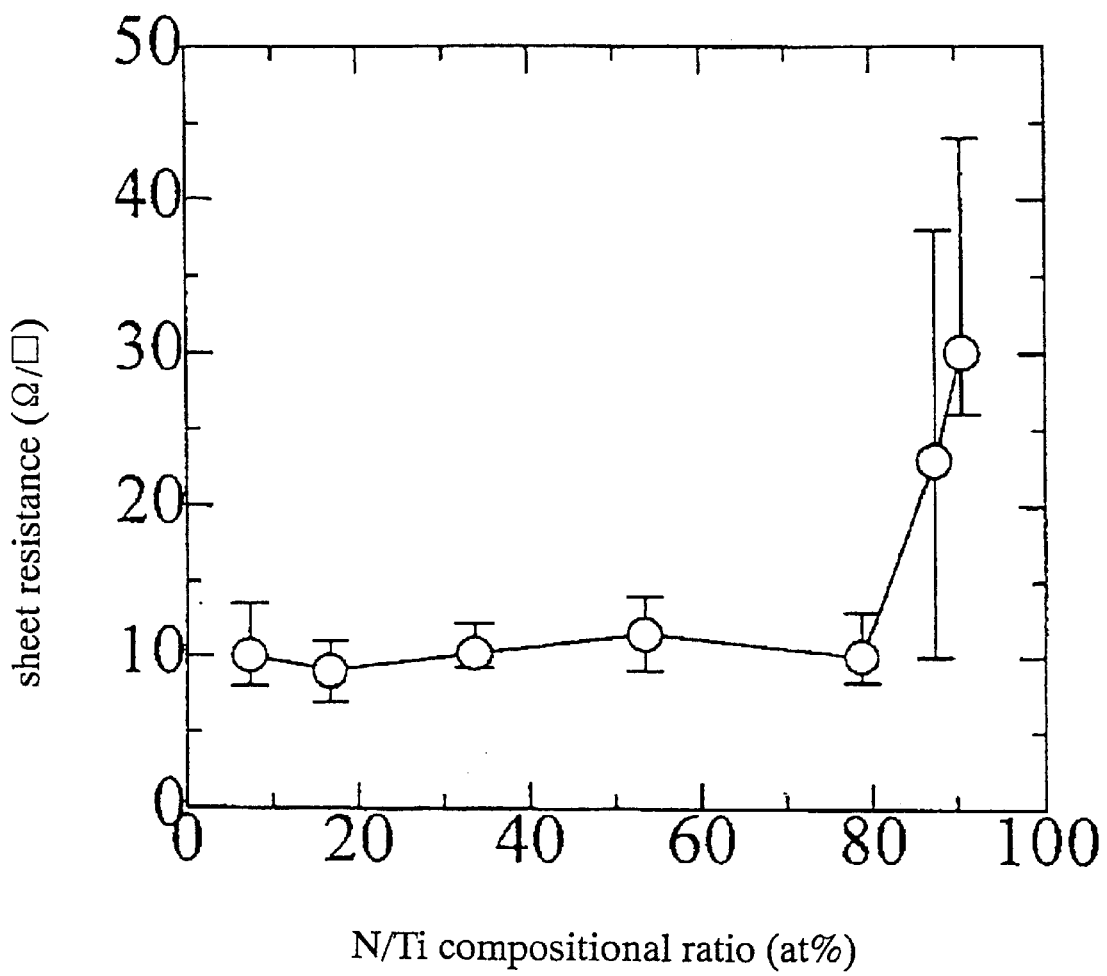
FIG. 7 is a diagram illustrative of variations in sheet resistance of a C54-structured titanium silicide layer formed on an n-type silicon diffusion region with a width of 0.35 micrometers over the compositional ratio of nitrogen to titanium of the nitrogen containing titanium film.

FIG. 7 is a diagram illustrative of variations in sheet resistance of a C54-structured titanium silicide layer formed on an n-type silicon diffusion region with a width of 0.35 micrometers over the compositional ratio of nitrogen to titanium of the nitrogen containing titanium film. As the compositional ratio of nitrogen to titanium of the nitrogen containing titanium film is increased from 80%, then the sheet resistance of the C54-structured titanium silicide layer is rapidly increased. In contrast, as the compositional ratio of nitrogen to titanium of the nitrogen containing titanium film is decreased from 80%, then the sheet resistance of the C54-structured titanium silicide layer is not largely varied. As the compositional ratio of nitrogen to titanium of the nitrogen containing titanium film is below 80%, then the sheet resistance of the C54-structured titanium silicide layer remains about 10 Ω☐. As the compositional ratio of nitrogen to titanium of the nitrogen containing titanium film is increased from 80% to 88%, then the sheet resistance of the C54-structured titanium silicide layer is rapidly increased from about 10 Ω☐ up to about 23 Ω☐. As the compositional ratio of nitrogen to titanium of the nitrogen containing titanium film is increased from 88% to 90%, then the sheet resistance of the C54-structured titanium silicide layer is rapidly increased from about 23 Ω☐ up to about 30 Ω☐. The reason why the increase in the compositional ratio of nitrogen to titanium of the nitrogen containing titanium film from 80% causes the rapid increase in the sheet resistance of the C54-structured titanium silicide layer is that the large compositional ratio of nitrogen to titanium of the nitrogen containing titanium film 108 provides a large film stress which prevents the titanium silicidation reaction together with immersion of the titanium silicide layer into the source/drain diffusion layers 106 or the polysilicon gate electrode 104. This means that in order to obtain the low sheet resistance of the C54-structured titanium silicide layer 109, it is required that the compositional ratio of nitrogen to titanium of the nitrogen containing titanium film 108 be not higher than 80%. Since 80% of the compositional ratio of nitrogen to titanium of the nitrogen containing titanium film 108 corresponds to $1 \times 10^{10}$ dyne/cm$^2$ of the film stress or the compressive stress of the nitrogen containing titanium film 108 before the heat treatment for causing the silicidation reaction. Consequently, in order to obtain the low sheet resistance of the C54-structured titanium silicide layer 109, it is required that the film stress or the compressive stress of the nitrogen containing titanium film 108 be not higher than $1 \times 10^{10}$ dyne/cm$^2$, for which reason it is important for the present invention that the nitrogen containing titanium film 108 deposited on the titanium film 107 has a low film stress or compressive stress of not higher than $1 \times 10^{10}$ dyne/cm$^2$. In the light of facilitating the titanium silicidation reaction, it is important that the film stress or compressive stress of the nitrogen containing titanium film be not higher than $1 \times 10^{10}$ dyne/cm$^2$ and that the compositional ratio of nitrogen to titanium of the nitrogen containing titanium film 108 is not higher than 80%. It is preferable that the compositional ratio of nitrogen to titanium of the nitrogen containing titanium film 108 is not higher than 55%. In the meantime, in the light of realizing the self-alignment of the titanium silicide layer without any over-growth of the titanium silicide layer over the field oxide films 102 and the side wall spacers 105, it is preferable that the compositional ratio of nitrogen to titanium of the nitrogen containing titanium film 108 is not lower than 30%, and more preferably not lower than 45%.

Figure 4D:
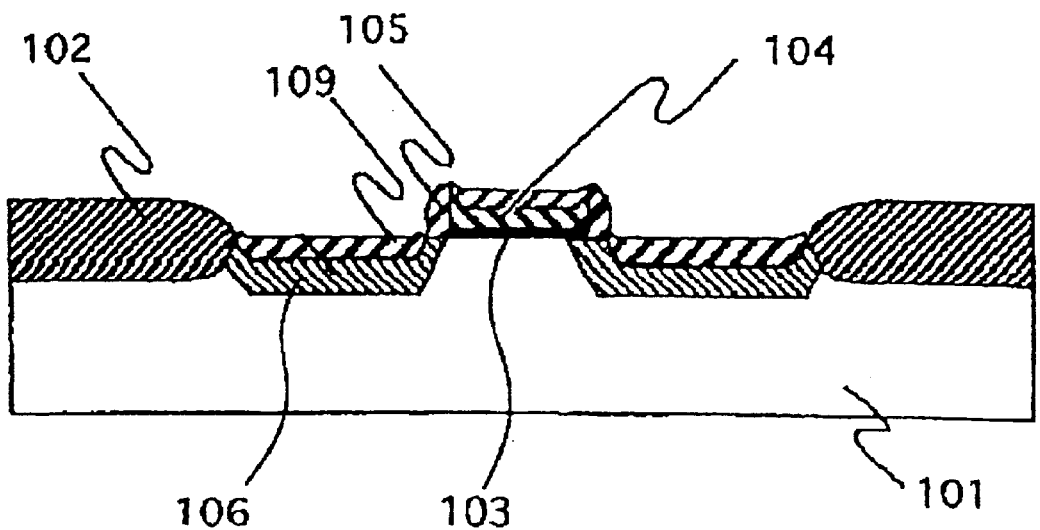

With reference to FIG. 4D, the nitrogen containing titanium film 110 overlaying the C49-structured titanium silicide layers 109 and the field oxide films 102 as well as the side wall spacers 105 is completely etched by a wet etching which uses a chemical comprising a mixture of an ammonium solution and a hydrogen peroxide solution, whereby the C49-structured titanium silicide layers 109 remain on the polysilicon gate electrode 104 and on the source/drain diffusion layers 106.

Figure 8:
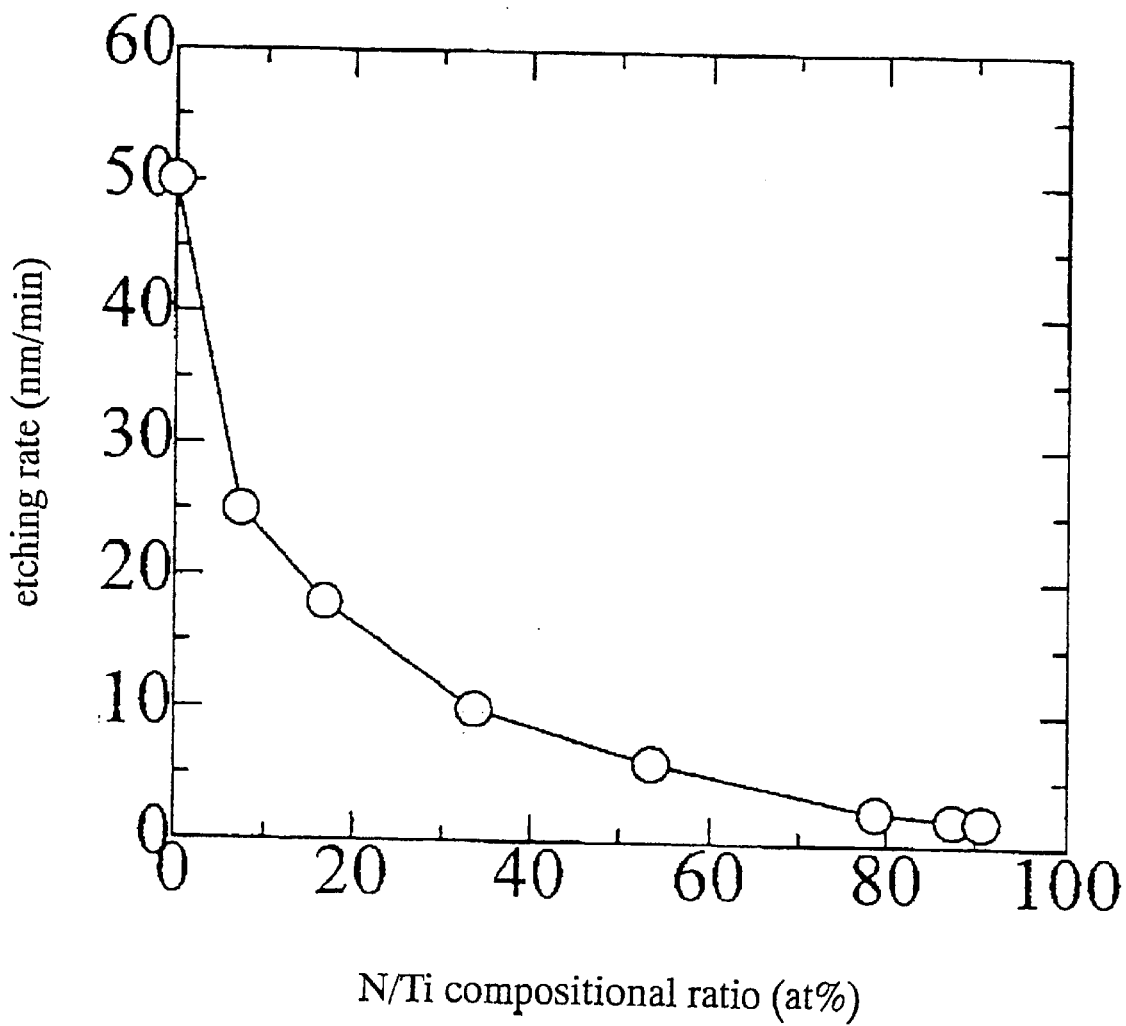
FIG. 8 is a diagram illustrative of variations in etching rate of the nitrogen containing titanium film with a thickness of 100 nanometers by use of a chemical comprising a mixture of an ammonium solution and a hydrogen peroxide solution over the compositional ratio of nitrogen to titanium of the nitrogen containing titanium film.

FIG. 8 is a diagram illustrative of variations in etching rate of the nitrogen containing titanium film with a thickness of 100 nanometers by use of a chemical comprising a mixture of an ammonium solution and a hydrogen peroxide solution over the compositional ratio of nitrogen to titanium of the nitrogen containing titanium film. As the compositional ratio of nitrogen to titanium of the nitrogen containing titanium film 108 is increased from 0% to 20%, then the etching rate of the nitrogen containing titanium film 108 is rapidly decreased from 50 nm/min to 16 nm/min. As the compositional ratio of nitrogen to titanium of the nitrogen containing titanium film 108 is further increased from 20% to 50%, then the etching rate of the nitrogen containing titanium film 108 is further decreased from 16 nm/min to 7 nm/min. As the compositional ratio of nitrogen to titanium of the nitrogen containing titanium film 108 is further increased from 50% to 90%, then the etching rate of the nitrogen containing titanium film 108 is further decreased from 7 nm/min to 1.9 nm/min. As the compositional ratio of nitrogen to titanium of the nitrogen containing titanium film 108 is 80%, then the etching rate of the nitrogen containing titanium film 108 is over 2 nm/min. When the compositional ratio of nitrogen to titanium of the nitrogen containing titanium film 108 is 50%, the etching rate of the nitrogen containing titanium film 108 is 7 nm/min which is higher by about 3.5 times than the etching rate of 1.9 nm/min when the compositional ratio of nitrogen to titanium of the nitrogen containing titanium film 108 is 90%. In the meantime, the etching rate of the titanium silicide layer 109 is 2 nm/min. In the light of facilitation of the complete etching to the nitrogen containing titanium film 108 without any overetching to the titanium silicide layer 109, it is preferable that the etching rate of the nitrogen containing titanium film 108 is higher than 2 nm/min of the etching rate of the titanium silicide layer 109, and therefore preferable that the compositional ratio of nitrogen to titanium of the nitrogen containing titanium film 108 is not higher than 80%. It is more preferable that the etching rate of the nitrogen containing titanium film 108 is much higher than 2 nm/min of the etching rate of the titanium silicide layer 109, and also more preferable that the compositional ratio of nitrogen to titanium of the nitrogen containing titanium film 108 is much lower than 80%. Namely, in view of the etching selectivity, the possible reduction in the compositional ratio of nitrogen to titanium of the nitrogen containing titanium film 108 is preferable. Actually, however, the nitrogen containing titanium film 110 is etched following to the heat treatment for silicidation reaction. The nitrogen containing titanium film 110 is formed by diffusion of nitrogen atoms into the titanium film 107 from the nitrogen containing titanium film 108, for which reason the concentration of nitrogen of the nitrogen containing titanium film 110 is lower than the concentration of nitrogen of the nitrogen containing titanium film 108. This means that the etching rate of the nitrogen containing titanium film 110 is higher than the etching rate of the nitrogen containing titanium film 108.

Figure 4E:
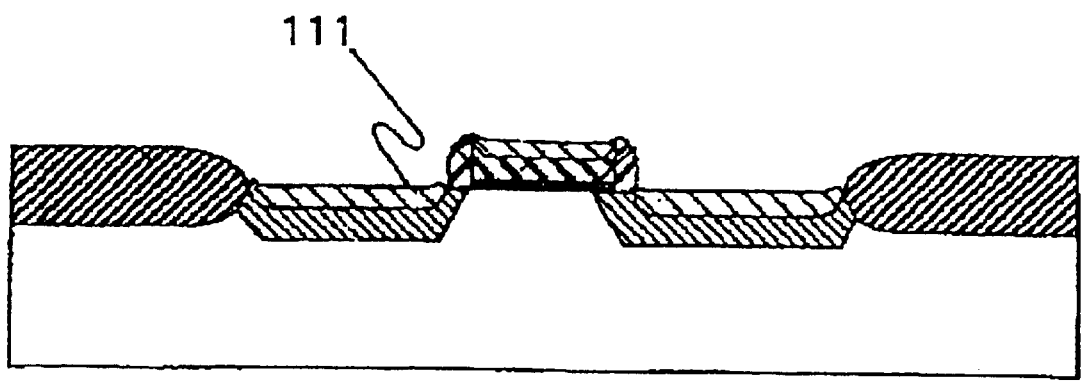

With reference to FIG. 4E, a heat treatment to the silicon substrate 101 is carried out at a temperature of about 800° C. in an argon atmosphere under an atmospheric pressure for 10 seconds to cause a phase transition from the C49 crystal structure to a C54 crystal structure which has a low resistivity of about 20 $\mu\Omega$cm. As a result, the C49-structured titanium suicide layers 109 are made into C54-structured titanium silicide layers 111. Namely, the C54-structured titanium silicide layers 111 are formed on the polysilicon gate electrode 104 and on the source/drain diffusion layers 106.

Consequently, the low film stress of not higher than $1\times10^{10}$ dyne/cm$^2$ of the nitrogen containing titanium layer 108 is effective to suppress the excess nitration reaction and allows a reduction in thickness of the silicide layer as well as applicable to silicide the line-shaped silicon layer or silicon region.

Accordingly, the low film stress of the nitrogen containing titanium layer 108 makes the self-aligned refractory metal silicide layer 109 free from the above problems with the first and second conventional methods. The low film stress of the nitrogen containing titanium layer 109 makes the self-aligned titanium silicide layer 109 free from a problem with any over-growth of the titanium silicide layer 109 onto the field oxide films 102 and the side wall spacers 105. The low film stress of the nitrogen containing titanium layer 108 is capable of suppressing any excess titanium nitration reaction. The low film stress of the nitrogen containing titanium layer allows a reduction in thickness of the titanium silicide layer 109. The low film stress of the nitrogen containing titanium layer 108 allows a self aligned titanium silicide layer 109 to be formed on a silicon region shaped in a line with a reduced width. The low film stress of the nitrogen containing titanium layer 108 is capable of reducing the necessary force for plastic deformations of the titanium silicide layer 109 and the titanium film 107 and the nitrogen containing titanium film 108 laminated thereon. The low film stress of the nitrogen containing titanium layer 108 does not need such a high temperature heat treatment as to deteriorate characteristics of a semiconductor device having the refractory metal silicide layer. The low film stress of the nitrogen containing titanium layer facilitates etching to the unsilicided layer such as the nitrogen containing titanium film without any over-etching to the titanium silicide layer 109.

The compositional ratio of nitrogen to titanium of the nitrogen containing titanium film 108 is not higher than 80%, so that the film stress or compressive stress of the nitrogen containing titanium film 108 is not higher than $1\times10^{10}$ dyne/cm$^2$, which facilitates the titanium silicidation reaction. This further allows that the etching rate of the nitrogen containing titanium film 110 is lower than the etching rate of the titanium silicide layer 109 when the chemical comprising the mixture of the ammonium solution and the hydrogen peroxide solution is used as an etchant. This prevents any over-etching to the titanium silicide layer 109. This further prevents the reduction and variation in thickness of the titanium silicide layer 109 This furthermore prevents the increase and variation in sheet resistance of the titanium nitride layer 109. It is further preferable that the compositional ratio of nitrogen to titanium of the nitrogen containing titanium film 108 is not less than 30% for preventing the over-growth of the titanium silicide layer 109 over the field oxide films 102 and the side wall spacers 105. It is furthermore preferable that the compositional ratio of nitrogen to titanium of the nitrogen containing titanium film 108 is in the range of 45% to 55% for formation of the low sheet resistance titanium silicide layer 109 with highly accurate self-alignment.

As a modification, it is also possible that a single compositionally grated nitrogen containing titanium film is formed in place of the laminations of the titanium film 107 and the nitrogen containing titanium film 108. In this case, the nitrogen containing compositionally graded titanium layer has such a compositional grade that a compositional ratio of nitrogen is varied in a thickness direction and is reduced toward a bottom surface of the nitrogen containing compositionally graded titanium layer, so that a lower region of the nitrogen containing compositionally graded titanium layer is substantially free of nitrogen, wherein an upper region of the nitrogen containing compositionally graded titanium layer has a film stress of not higher than $1\times10^{10}$ dyne/cm$^2$. This low film stress of the upper region of the nitrogen containing compositionally graded titanium layer reduces the necessary force for plastic deformations of the titanium silicide layer and the upper and lower regions of the nitrogen containing compositionally graded titanium layer during the continuous silicidation reaction. This reduction in the necessary force for the plastic deformations of the titanium silicide layer and the upper and lower regions of the nitrogen containing compositionally graded titanium layer facilitates the plastic deformations of the titanium silicide layer and the upper and lower regions of the nitrogen containing compositionally graded titanium layer. This further facilitates immersions of the growing titanium silicide layers into the source/drain diffusion layers or the polysilicon gate electrode 104. It is preferable that a compositional ratio of nitrogen to titanium of the upper region of the nitrogen containing compositionally graded titanium layer is in the range of 30% to 80%. It is furthermore preferable that a compositional ratio of nitrogen to titanium of the upper region of the nitrogen containing compositionally graded titanium layer is in the range of 45% to 55%. The nitrogen containing compositionally graded titanium layer may have a step-graded nitrogen compositional ratio profile, so that the lower region of the nitrogen containing compositionally graded titanium layer is substantially free of nitrogen, whilst the upper region of the nitrogen containing compositionally graded titanium layer may have a compositional ratio of in the range of 30% to 80%. Alternatively, the nitrogen containing compositionally graded titanium layer may have a slope-graded nitrogen compositional ratio profile, so that the lower region of the nitrogen containing compositionally graded titanium layer is substantially free of nitrogen, whilst the upper region of the nitrogen containing compositionally graded titanium layer has a compositional ratio gradually increased up to in the range of from 30% to 80%.

As a further modification, it is possible to carry out the heat treatment for causing the silicidation reaction in a vacuum atmosphere in place of the argon gas. The vacuum atmosphere and the argon atmosphere are the nitrogen free atmosphere. If the heat treatment were carried out in the nitrogen atmosphere, then the nitrogen containing titanium film 108 is nitrated with nitrogen supplied from the nitrogen atmosphere. The etching rate of the titanium nitride film is lower than the nitrogen containing titanium film, for which reason the etching to the titanium nitride film overlying the titanium silicide layer is likely to cause an over-etching to the titanium silicide layer, whereby the thickness of the titanium silicide layer is reduced and therefore the sheet resistance of the titanium silicide layer is increased. This means it important for the present invention to carry out the heat treatment in the nitrogen Bee atmosphere.

Second Embodiment

A second embodiment according to the present invention will be described in detail with reference to FIGS. 9A through 9E which are fragmentary cross sectional elevation views illustrative of MOS field effect transistors in sequential steps involved in a novel fabrication method in a second embodiment in accordance with the present invention.

Figure 9A:
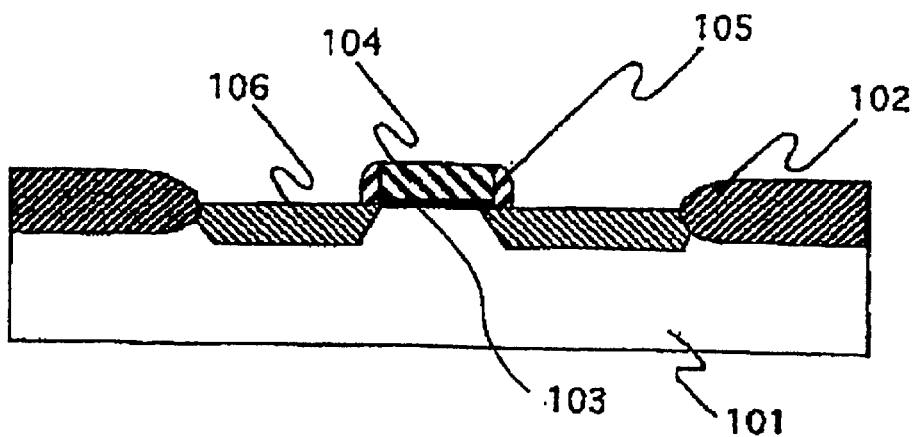
FIGS. 9A through 9E are fragmentary cross sectional elevation views illustrative of MOS field effect transistors in sequential steps involved in a novel fabrication method in a second embodiment in accordance with the present invention.

With reference to FIG. 9A, field oxide films 102 are selectively formed on a surface of a silicon substrate 101 by a local oxidation of silicon method, thereby to define an active region surrounded by the field oxide films 102. An ion-implantation of an impurity into the active region of the silicon substrate 101 is carried out to increase a withstand voltage thereof. A thermal oxidation of silicon is carried out to form a gate oxide film 103 on the active region of the silicon substrate 101. A chemical vapor deposition method is carried out to deposit a polysilicon film having a thickness of about 100 nanometers on an entire region of the silicon substrate, so that the polysilicon film extends over the field oxide films 102 and the gate oxide film 103. The polysilicon film is doped with an impurity such as phosphorus to reduce a resistivity of the polysilicon film. The polysilicon film is patterned by a photolithography technique in order to form a polysilicon gate electrode 104 on the gate oxide film 103. A chemical vapor deposition method is carried out to deposit a silicon oxide film having a thickness of about 100 nanometers on an entire region of the silicon substrate 101, so that the silicon oxide film extends over the polysilicon gate electrode 104, the active region of the silicon substrate 101 and the field oxide films 102. An anisotropic etching to the silicon oxide film is carried out to leave the silicon oxide film only on side walls of the polysilicon gate electrode 104, thereby to form side wall spacers 105 on the side walls of the polysilicon gate electrode 104. An ion-implantation of an impurity such as boron or arsenic into the active region of the silicon substrate 101 is carried out by using the polysilicon gate electrode 104, the side wall spacers 105 and the field oxide films 102 as masks, thereby to form impurity doped regions in upper regions of the silicon substrate 101. If the impurity is arsenic, a dose is set at about $1\times10^{15}$ $cm^{-2}$. A heat treatment to the silicon substrate 101 is carried out at a temperature of about 900° C. to form source/drain diffusion layers 106 in the upper regions of the silicon substrate 101.

Figure 9B:
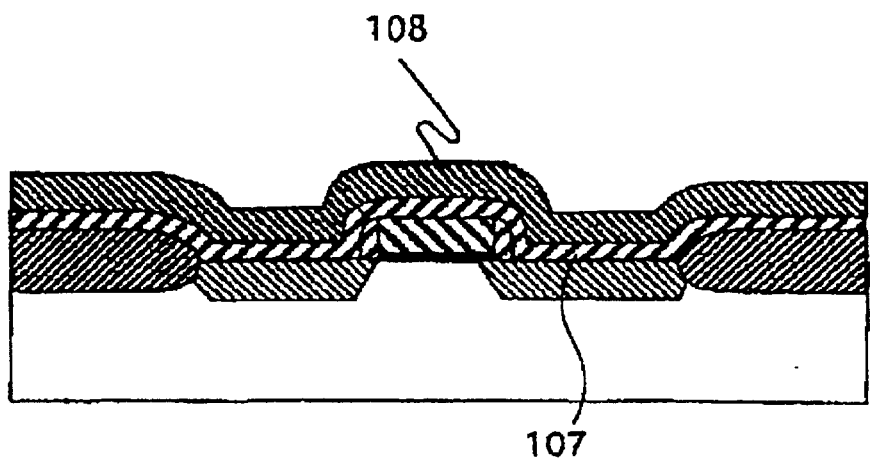

With reference to FIG. 9B, a sputtering method is carried out by sputtering a titanium target with an argon gas to deposit titanium on an entire region of the silicon substrate 101, thereby entirely forming a titanium film 107 having a thickness of about 20 nanometers, so that the titanium film 107 extends over the polysilicon gate electrode 104, the side wall spacers 105, the source/drain diffusion layers 106 and the field oxide films 102. Subsequently, a long slow sputtering method is carried out by sputtering a titanium target in an argon-nitrogen mixture atmosphere to deposit a nitrogen containing titanium film 108 on an entire region of the titanium film 107. A diameter of the titanium target is 300 millimeters. A distance between the titanium target and the substrate 101 is set to be not less than a radius of the titanium target, for example, the distance is 350 millimeters in order for stable formation of the nitrogen containing titanium film 108. The distance between the titanium target and the substrate 101 becomes longer, the growth rate of the nitrogen containing titanium film 108 is reduced, for which reason an excessive long distance between the titanium target and the substrate 101 is not preferable in the light of the growth rate of the nitrogen containing titanium film 108. The sputtering is carried out under conditions of a pressure in the range of 0.2 mTorr to 0.4 mTorr, and a power in the range of 8 kW to 10 kW, with supplying argon and nitrogen gases, wherein an argon gas flow rate is 10 sccm whilst a nitrogen gas flow rate is in the range of 15 sccm to 40 sccm.

Figure 10:
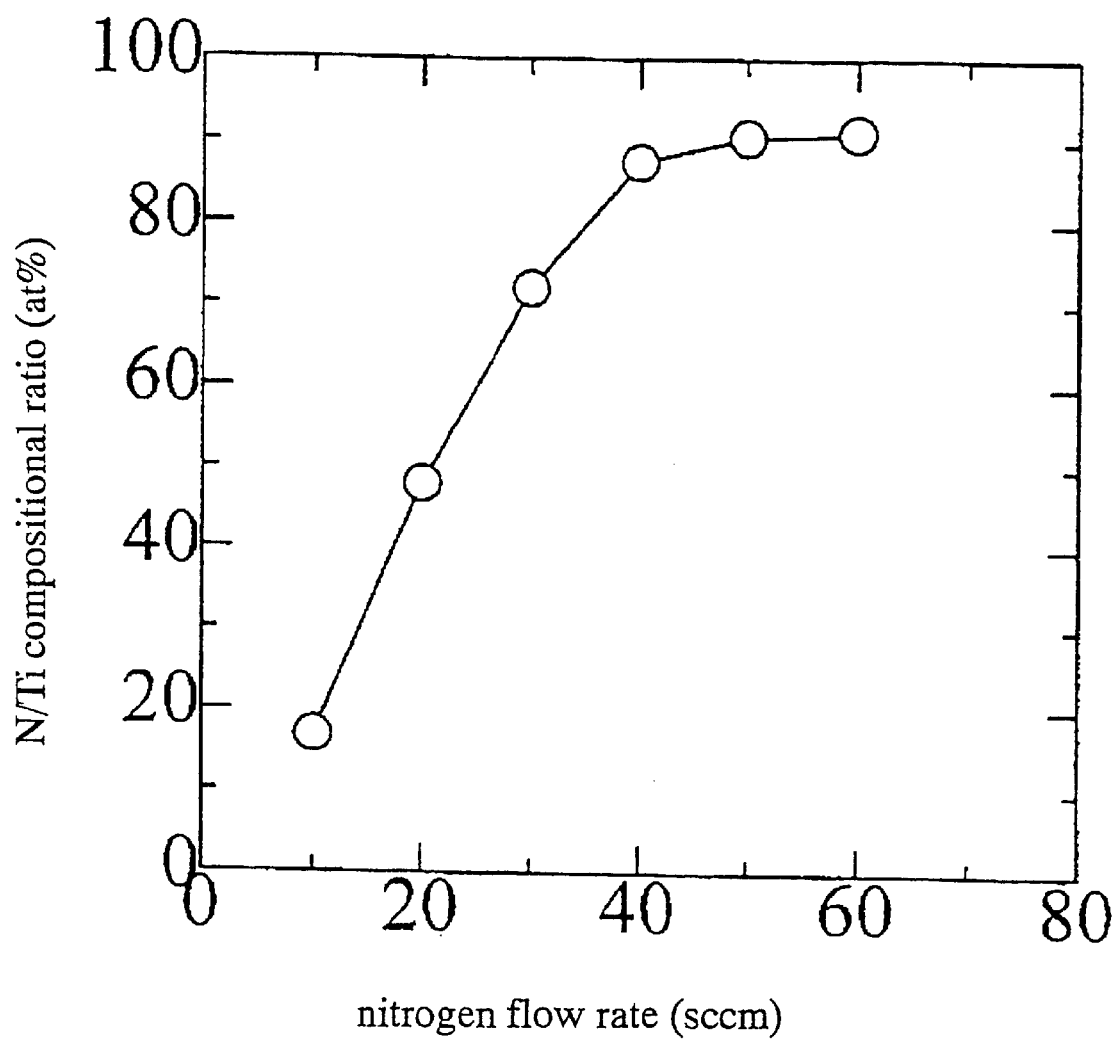
FIG. 10 is a diagram illustrative of variations in a compositional ratio of nitrogen to titanium of the nitrogen containing titanium film over a ratio of a nitrogen gas flow rate to a total flow rate of nitrogen and argon gases, wherein a reactive collimate sputtering method is carried out under conditions of a power of 9 kW and a pressure in the range of 0.2 mTorr to 0.4 mTorr for keeping a constant conductance.

FIG. 10 is a diagram illustrative of variations in a compositional ratio of nitrogen to titanium of the nitrogen containing titanium film over a ratio of a nitrogen gas flow rate to a total flow rate of nitrogen and argon gases, wherein a reactive collimate sputtering method is carried out under conditions of a power of 9 kW and a pressure in the range of 0.2 mTorr to 0.4 mTorr for keeping a constant conductance. As the ratio of the nitrogen gas flow rate to the total flow rate of the nitrogen and argon gases is increased from 10 sccm to 20 sccm, then the compositional ratio of nitrogen to titanium of the nitrogen containing titanium film is also increased from 18% to about 50%. As the ratio of the nitrogen gas flow rate to the total flow rate of the nitrogen and argon gases is increased from 20 sccm to 30 sccm, then the compositional ratio of nitrogen to titanium of the nitrogen containing titanium film is also increased from about 50% to about 70%. As the ratio of the nitrogen gas flow rate to the total flow rate of the nitrogen and argon gases is increased from 30 sccm to 40 sccm, then the compositional ratio of nitrogen to titanium of the nitrogen containing titanium film is also increased from about 70% to about 89%. If the ratio of the nitrogen gas flow rate to the total flow rate of the nitrogen and argon gases is increased from 40 sccm to 60 sccm, then the compositional ratio of nitrogen to titanium of the nitrogen containing titanium film is also increased to over about 90%. If, however, the ratio of the nitrogen gas flow rate to the total flow rate of the nitrogen and argon gases is not higher than 50%, then the surface of the titanium target is not nitrated. If the surface of the titanium target is not nitrated, then a deposition rate is much higher than when the surface of the titanium target is nitrated. The conditions for preventing the nitration of the surface of the titanium target depend upon not only the ratio of the nitrogen gas flow rate to the total flow rate of the nitrogen and argon gases but also the pressure and power.

Figure 9C:
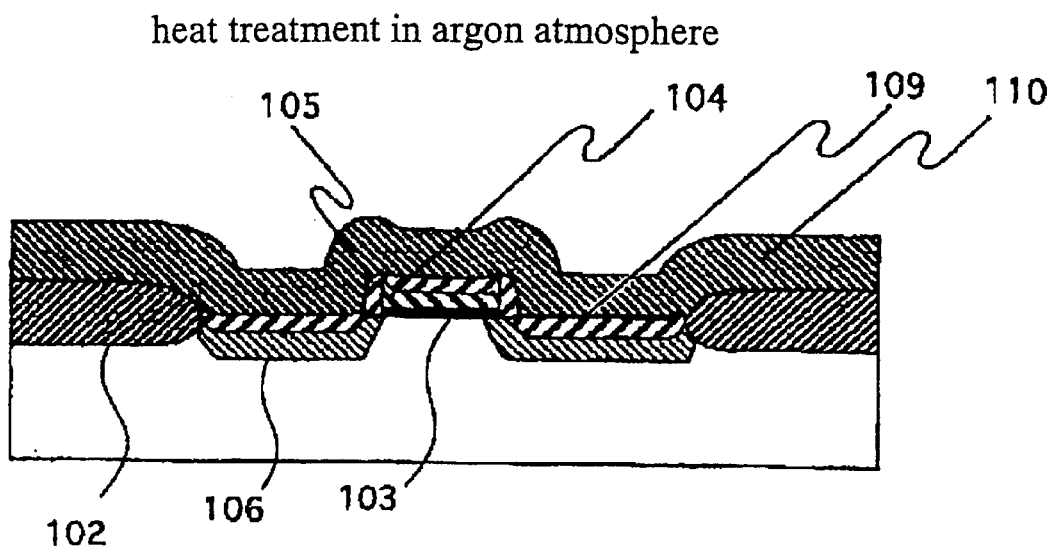

With reference to FIG. 9C, a heat treatment to the silicon substrate 101 is carried out by use of a lamp anneal at a temperature of 700° C. in an argon atmosphere under an atmospheric pressure for 30 seconds, thereby to cause both a titanium nitration reaction and a titanium silicide reaction. This heat treatment causes that silicon atoms in the source/drain diffusion layers 106 and the polysilicon gate electrode 104 are thermally diffused onto interfaces to the titanium film 107, so that the bottom surface of the titanium film 107 on the source/drain diffusion layers 106 and on the polysilicon gate electrode 104 are silicided with the thermally diffused silicon atoms. Subsequently, the titanium silicidation reaction is continued on the interfaces between the growing titanium silicide layers 109 and the source/drain diffusion layers 106 and the polysilicon gate electrode 104, whereby the titanium silicide layers 109 are grown toward the source/drain diffusion layers 106 and the polysilicon gate electrode 104. As a result, the titanium silicide layers 109 on the growth are immersed into the upper regions of the source/drain diffusion layers 106 and the polysilicon gate electrode 104, whereby the titanium silicide layers 109 show plastic deformations toward the source/drain diffusion layers 106 and the polysilicon gate electrode 104 together with further plastic deformations of the nitrogen containing titanium film 108 and the titanium film 107. As will be described in detail later, the nitrogen containing titanium film 108 has a low film stress. This low film stress of the nitrogen containing titanium film 108 reduces the necessary force for the plastic deformation of the nitrogen containing titanium film 108. This reduction in the necessary force for the plastic deformation of the nitrogen containing titanium film 108 facilitates the plastic deformation of the nitrogen containing titanium film 108. This further reduces the total necessary force of the plastic deformations of the titanium silicide layer 109, the titanium film 107 and the nitrogen containing titanium film 108. This reduction in the total necessary force of the plastic deformations facilitates the plastic deformations of the titanium silicide layer 109, the titanium film 107 and the nitrogen containing titanium film 108, thereby facilitating the immersion of the titanium silicide layer 109 on the growth. This means that the growth of the titanium silicide layer 109 is promoted while the titanium silicide reaction exceeds the titanium nitration reaction. The titanium silicide layers 109 has a C49-crystal stucture having a relatively high resistivity of about 60 $\mu\Omega$cm. On the other hands, upper regions of the titanium film 107 over the source/drain diffusion layers 106 and the polysilicon gate electrode 104 and further the upper and lower regions of the titanium film 107 over the side wall spacers 105 and the field oxide films 102 are nitrated with nitrogen atoms thermally diffused from the nitrogen containing titanium film 108 overlying the titanium film 107, whereby the upper regions of the titanium film 107 over the source/drain diffusion layers 106 and the polysilicon gate electrode 104 and further the upper and lower regions of the titanium film 107 over the side wall spacers 105 and the field oxide films 102 are made into a nitrogen containing titanium film 110 which extends over the field oxide films 102, the C49-structured titanium silicide layers 109 and the side wall spacers 105. As a result, the titanium silicide layers 109 are self-aligned and selectively formed on the source/drain diffusion layers 106 and the polysilicon gate electrode 104. Namely, the bottom regions of the titanium layer 107 but only on the source/drain diffusion layers 106 and the polysilicon gate electrode 104 are made into the C49-structured titanium silicide layers 109, thereby suppressing the over-growth of the titanium silicide layer over the side wall spacers 105 and the field oxide films 102. Namely, the titanium film 107 on the side wall spacers 105 and the field oxide films 102 are not silicided. The titanium silicide layers 109, therefore, extend on the bottom surface of the nitrogen containing titanium film 110 and over the source/drain diffusion layers 106 and the polysilicon gate electrode 104.

Contrary to the present invention, if the heat treatment were carried out in the nitrogen atmosphere, then the nitrogen containing titanium film 108 is nitrated with nitrogen supplied from the nitrogen atmosphere. The etching rate of the titanium nitride film is lower than the nitrogen containing titanium film, for which reason the etching to the titanium nitride film overlying the titanium silicide layer is likely to cause an over-etching to the titanium silicide layer, whereby the thickness of the titanium silicide layer is reduced and therefore the sheet resistance of the titanium silicide layer is increased. This means it important for the present invention to carry out the heat treatment in the nitrogen free atmosphere.

With reference again to FIG. 6, as the compositional ratio of nitrogen to titanium of the nitrogen containing titanium film is increased, then the film stress of the nitrogen containing titanium film is also increased. As the compositional ratio of nitrogen to titanium of the nitrogen containing titanium film is about 90%, then the film stress as the compressive stress of the nitrogen containing titanium film is about $1.2\times10^{10}$ dyne/cm$^2$. As the compositional ratio of nitrogen to titanium of the nitrogen containing titanium film is about 80%, then the film stress as the compressive stress of the nitrogen containing titanium film is about $1.0\times10^{10}$ dyne/cm$^2$. As the compositional ratio of nitrogen to titanium of the nitrogen containing titanium film is about 50%, then the film stress as the compressive stress of the nitrogen containing titanium film is about $0.7\times10^{10}$ dyne/cm$^2$. As the compositional ratio of nitrogen to titanium of the nitrogen containing titanium film is about 18%, then the film stress as the compressive stress of the nitrogen containing titanium film is about $0.38\times10^{10}$ dyne/cm$^2$. In the light of facilitation of the silicidation reaction or the growth of the titanium silicide layer, the small film stress or small compressive stress is preferable, and therefore the low compositional ratio of nitrogen to titanium of the nitrogen containing titanium film is preferable.

With reference again to FIG. 7, as the compositional ratio of nitrogen to titanium of the nitrogen containing titanium film is increased from 80%, then the sheet resistance of the C54-structured titanium silicide layer is rapidly increased. In contrast, as the compositional ratio of nitrogen to titanium of the nitrogen containing titanium film is decreased from 80%, then the sheet resistance of the C54-structured titanium silicide layer is not largely varied. As the compositional ratio of nitrogen to titanium of the nitrogen containing titanium film is below 80%, then the sheet resistance of the C54-structured titanium silicide layer remains about 10 $\Omega\square$. As the compositional ratio of nitrogen to titanium of the nitrogen containing titanium film is increased from 80% to 88%, then the sheet resistance of the C54-structured titanium silicide layer is rapidly increased from about 10 $\Omega\square$ up to about 23 $\Omega\square$. As the compositional ratio of nitrogen to titanium of the nitrogen containing titanium film is increased from 88% to 90%, then the sheet resistance of the C54-structured titanium silicide layer is rapidly increased from about 23 $\Omega\square$ lup to about 30 $\Omega\square$. The reason why the increase in the compositional ratio of nitrogen to titanium of the nitrogen containing titanium film from 80% causes the rapid increase in the sheet resistance of the C54-structured titanium silicide layer is that the large compositional ratio of nitrogen to titanium of the nitrogen containing titanium film 108 provides a large film stress which prevents the titanium silicidation reaction together with immersion of the titanium silicide layer into the source/drain diffusion layers 106 or the polysilicon gate electrode 104. This means that in order to obtain the low sheet resistance of the C54-structured titanium silicide layer 109, it is required that the compositional ratio of nitrogen to titanium of the nitrogen containing titanium film 108 be not higher than 80%. Since 80% of the compositional ratio of nitrogen to titanium of the nitrogen containing titanium film 108 corresponds to $1\times10^{10}$ dyne/cm$^2$ of the film stress or the compressive stress of the nitrogen containing titanium film 108 before the heat treatment for causing the silicidation reaction. Consequently, in order to obtain the low sheet resistance of the C54-structured titanium silicide layer 109, it is required that the film stress or the compressive stress of the nitrogen containing titanium film 108 be not higher than $1\times10^{10}$ dyne/cm$^2$, for which reason it is important for the present invention that the nitrogen containing titanium film 108 deposited on the titanium film 107 has a low film stress or compressive stress of not higher than $1\times10^{10}$ dyne/cm$^2$. In the light of facilitating the titanium silicidation reaction, it is important that the film stress or compressive stress of the nitrogen containing titanium film be not higher than $1\times10^{10}$ dyne/cm$^2$ and that the compositional ratio of nitrogen to titanium of the nitrogen containing titanium film 108 is not higher than 80%. If the nitrogen gas flow rate is 20 sccm, then the compositional ratio of nitrogen to titanium of the nitrogen containing titanium film 108 is about 50%, which corresponds to $0.7\times10^{10}$ dyne/cm$^2$ which is lower than $1\times10^{10}$ dyne/cm$^2$.

Figure 9D:
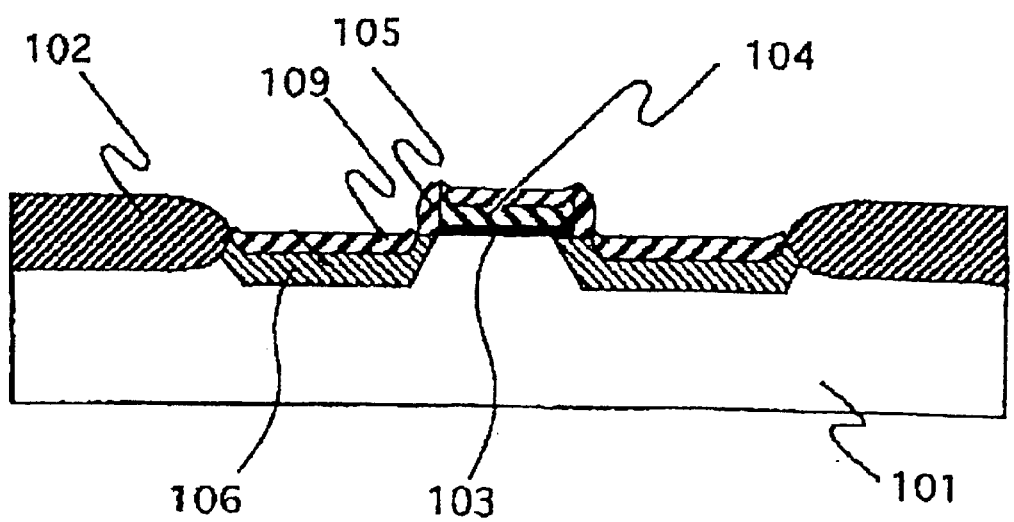

With reference to FIG. 9D, the nitrogen containing titanium film 110 overlaying the C49-structured titanium silicide layers 109 and the field oxide films 102 as well as the side wall spacers 105 is completely etched by a wet etching which uses a chemical comprising a mixture of an ammonium solution and a hydrogen peroxide solution, whereby the C49-structured titanium silicide layers 109 remain on the polysilicon gate electrode 104 and on the source/drain diffusion layers 106.

With reference again to FIG. 8, as the compositional ratio of nitrogen to titanium of the nitrogen containing titanium film 108 is increased from 0% to 20%, then the etching rate of the nitrogen containing titanium film 108 is rapidly decreased from 50 nm/min to 16 nm/min. As the compositional ratio of nitrogen to titanium of the nitrogen containing titanium film 108 is further increased from 20% to 50%, then the etching rate of the nitrogen containing titanium film 108 is further decreased from 16 nm/min to 7 nm/mnin. As the compositional ratio of nitrogen to titanium of the nitrogen containing titanium film 108 is further increased from 50% to 90%, then the etching rate of the nitrogen containing titanium film 108 is further decreased from 7 nm/min to 1.9 nm/min. As the compositional ratio of nitrogen to titanium of the nitrogen containing titanium film 108 is 80%, then the etching rate of the nitrogen containing titanium film 108 is over 2 nm/min. When the compositional ratio of nitrogen to titanium of the nitrogen containing titanium film 108 is 50%, the etching rate of the nitrogen containing titanium film 108 is 7 nm/min which is higher by about 3.5 times than the etching rate of 1.9 nm/min when the compositional ratio of nitrogen to titanium of the nitrogen containing titanium film 108 is 90%. In the meantime, the etching rate of the titanium silicide layer 109 is 2 nm/min. In the height of facilitation of the complete etching to the nitrogen containing titanium film 108 without any over-etching to the titanium silicide layer 109, it is preferable that the etching rate of the nitrogen containing titanium film 108 is higher than 2 nm/min of the etching rate of the titanium silicide layer 109, and therefore preferable that the compositional ratio of nitrogen to titanium of the nitrogen containing titanium film 108 is not higher than 80%. It is more preferable that the etching rate of the nitrogen containing titanium film 108 is much higher than 2 nm/min of the etching rate of the titanium silicide layer 109, and also more preferable that the compositional ratio of nitrogen to titanium of the nitrogen containing titanium film 108 is much lower than 80%. Namely, in view of the etching selectivity, the possible reduction in the compositional ratio of nitrogen to titanium of the nitrogen containing titanium film 108 is preferable. Actually, however, the nitrogen containing titanium film 110 is etched following to the heat treatment for silicidation reaction. The nitrogen containing titanium film 110 is formed by diffusion of nitrogen atoms into the titanium film 107 from the nitrogen containing titanium film 108, for which reason the concentration of nitrogen of the nitrogen containing titanium film 110 is lower than the concentration of nitrogen of the nitrogen containing titanium film 108. This means that the etching rate of the nitrogen containing titanium film 110 is higher than the etching rate of the nitrogen containing titanium film 108.

Figure 9E:
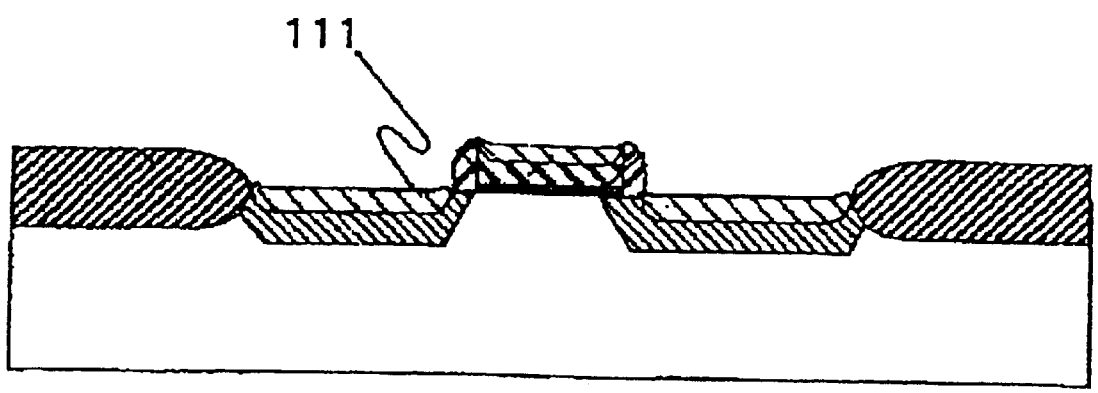

With reference to FIG. 9E, a heat treatment to the silicon substrate 101 is red out at a temperature of about 800° C. in an argon atmosphere under an atmospheric pressure for 10 seconds to cause a phase transition from the C49 crystal structure to a C54 crystal structure which has a low resistivity of about 20 $\mu\Omega$cm. As a result, the C49-structured titanium silicide layers 109 are made into C54-structured titanium silicide layers 111. Namely, the C54-structured titanium silicide layers 111 are formed on the polysilicon gate electrode 104 and on the source/drain diffusion layers 106.

Consequently, the low film stress of not higher than $1\times10^{10}$ dyne/cm$^2$ of the nitrogen containing titanium layer 108 is effective to suppress the excess nitration reaction and allows a reduction in thickness of the silicide layer as well as applicable to silicide the line-shaped silicon layer or silicon region.

In this embodiment, the sputtering method for depositing the nitrogen containing titanium film 108 is carried out in the long slow sputtering without use of collimate plate, for which reason there is no need to adjust the sputtering conditions in consideration of the life-time of the collimate plate Accordingly, the low film stress of the nitrogen containing titanium layer 108 makes the self-aligned refractory metal silicide layer 109 free from the above problems with the first and second conventional methods. The low film stress of the nitrogen containing titanium layer 109 makes the self-aligned titanium silicide layer 109 free from a problem with any over-growth of the titanium silicide layer 109 onto the field oxide films 102 and the side wall spacers 105. The low film stress of the nitrogen containing titanium layer 108 is capable of suppressing any excess titanium nitration reaction. The low film stress of the nitrogen containing titanic layer allows a reduction in thickness of the titanium silicide layer 109. The low film stress of the nitrogen containing titanium layer 108 allows a self aligned titanium silicide layer 109 to be formed on a silicon region shaped in a line with a reduced width. The low film stress of the nitrogen containing titanium layer 108 is capable of reducing the necessary force for plastic deformations of the titanium silicide layer 109 and the titanium film 107 and the nitrogen containing titanium film 108 laminated thereon. The low film stress of the nitrogen containing titanium layer 108 does not need such a high temperature heat treatment as to deteriorate characteristics of a semiconductor device having the refractory metal silicide layer. The low film stress of the nitrogen containing titanium layer facilitates etching to the unsilicided layer such as the nitrogen containing titanium film without any over-etching to the titanium silicide layer 109.

The compositional ratio of nitrogen to titanium of the nitrogen containing titanium film 108 is not higher than 80%, so that the film stress or compressive stress of the nitrogen containing titanium film 108 is not higher than $1\times10^{10}$ dyne/cm$^2$, which facilitates the titanium silicidation reaction. This further allows that the etching rate of the nitrogen containing titanium film 110 is lower than the etching rate of the titanium silicide layer 109 when the chemical comprising the mixture of the ammonium solution and the hydrogen peroxide solution is used as an etchant. This prevents any over-etching to the titanium silicide layer 109. This further prevents the reduction and variation in thickness of the titanium silicide layer 109. This furthermore prevents the increase and variation in sheet resistance of the titanium nitride layer 109.

As a modification, it is also possible that a single compositionally grated nitrogen containing titanium film is formed in place of the laminations of the titanium film 107 and the nitrogen containing titanium film 108. In this case, the nitrogen containing compositionally graded titanium layer has such a compositional grade that a compositional ratio of nitrogen is varied in a thickness direction and is reduced toward a bottom surface of the nitrogen containing compositionally graded titanium layer, so that a lower region of the nitrogen containing compositionally graded titanium layer is substantially free of nitrogen, wherein an upper region of the nitrogen containing compositionally graded titanium layer has a film stress of not higher than $1\times10^{10}$ dyne/cm$^2$. This low film stress of the upper region of the nitrogen containing compositionally graded titanium layer reduces the necessary force for plastic deformations of the titanium silicide layer and the upper and lower regions of the nitrogen containing compositionally graded titanium layer during the continuous silicidation reaction. This reduction in the necessary force for the plastic deformations of the titanium silicide layer and the upper and lower regions of the nitrogen containing compositionally graded titanium layer facilitates the plastic deformations of the titanium silicide layer and the upper and lower regions of the nitrogen containing compositionally graded titanium layer. This further facilitates immersions of the growing titanium silicide layers into the source/drain diffusion layers or the polysilicon gate electrode 104.

It is preferable that a compositional ratio of nitrogen to titanium of the upper region of the nitrogen containing compositionally graded titanium layer is in the range of 30% to 80%. It is furthermore preferable that a compositional ratio of nitrogen to titanium of the upper region of the nitrogen containing compositionally graded titanium layer is in the range of 45% to 55%. The nitrogen containing compositionally graded titanium layer may have a step-graded nitrogen compositional ratio profile, so that the lower region of the nitrogen containing compositionally graded titanium layer is substantially free of nitrogen, whilst the upper region of the nitrogen containing compositionally graded titanium layer may have a compositional ratio of in the range of 30% to 80%. Alternatively, the nitrogen containing compositionally graded titanium layer may have a slope-graded nitrogen compositional ratio profile, so that the lower region of the nitrogen containing compositionally graded titanium layer is substantially free of nitrogen, whilst the upper region of the nitrogen containing compositionally graded titanium layer has a compositional ratio gradually increased up to in the range of from 30% to 80%.

As a further modification, it is possible to carry out the heat treatment for causing the silicidation reaction in a vacuum atmosphere in place of the argon gas. The vacuum atmosphere and the argon atmosphere are the nitrogen free atmosphere. If the heat treatment were carried out in the nitrogen atmosphere, then the nitrogen containing titanium film 108 is nitrated with nitrogen supplied from the nitrogen atmosphere. The etching rate of the titanium nitride film is lower than the nitrogen containing titanium film, for which reason the etching to the titanium nitride film overlying the titanium silicide layer is likely to cause an over-etching to the titanium silicide layer, whereby the thickness of the titanium silicide layer is reduced and therefore the sheet resistance of the titanium silicide layer is increased. This means it important for the present invention to carry out the heat treatment in the nitrogen free atmosphere.

Third Embodiment

A third embodiment according to the present invention will be described in detail with reference to FIGS. 11A through 11E which are fragmentary cross sectional elevation views illustrative of MOS field effect transistors in sequential steps involved in a novel fabrication method in a third embodiment in accordance with the present invention.

Figure 11A:
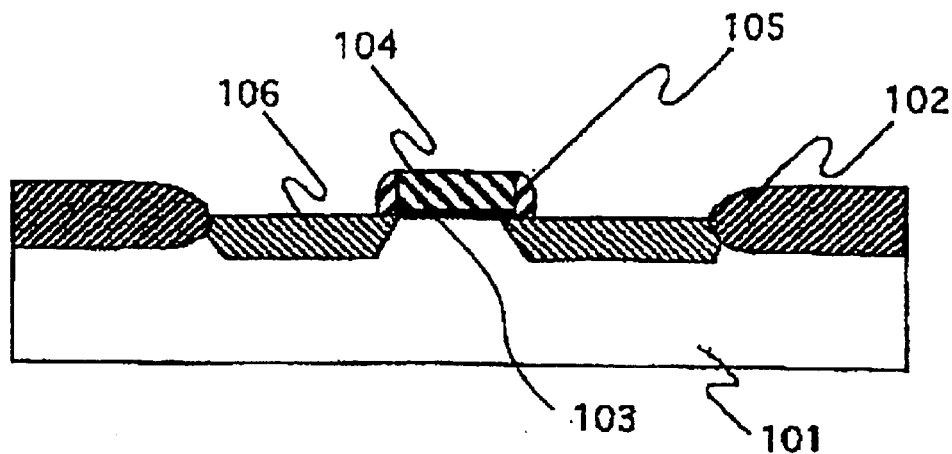
FIGS. 11A through 11E are fragmentary cross sectional elevation views illustrative of MOS field effect transistors in sequential steps involved in a novel fabrication method in a third embodiment in accordance with the present invention.

With reference to FIG. 11A, field oxide films 102 are selectively formed on a surface of a silicon substrate 101 by a local oxidation of silicon method, thereby to define an active region surrounded by the field oxide films 102. An ion-implantation of an impurity into the active region of the silicon substrate 101 is carried out to increase a withstand voltage thereof. A thermal oxidation of silicon is carried out to form a gate oxide film 103 on the active region of the silicon substrate 101. A chemical vapor deposition method is carried out to deposit a polysilicon film having a thickness of about 100 nanometers on an entire region of the silicon substrate, so that the polysilicon film extends over the field oxide films 102 and the gate oxide film 103. The polysilicon film is doped with an impurity such as phosphorus to reduce a resistivity of the polysilicon film. The polysilicon film is patterned by a photolithography technique in order to form a polysilicon gate electrode 104 on the gate oxide film 103. A chemical vapor deposition method is carried out to deposit a silicon oxide film having a thickness of about 100 nanometers on an entire region of the silicon substrate 101, so that the silicon oxide film extends over the polysilicon gate electrode 104, the active region of the silicon substrate 101 and the field oxide films 102. An anisotropic etching to the silicon oxide film is carried out to leave the silicon oxide film only on side walls of the polysilicon gate electrode 104, thereby to form side wall spacers 105 on the side walls of the polysilicon gate electrode 104. An ion-implantation of an impurity such as boron or arsenic into the active region of the silicon substrate 101 is carried out by using the polysilicon gate electrode 104, the side wall spacers 105 and the field oxide films 102 as masks, thereby to form impurity doped regions in upper regions of the silicon substrate 101. If the impurity is arsenic, a dose is set at about $1\times10^{15}$ cm$^{-2}$. A heat treatment to the silicon substrate 101 is carried out at a temperature of about 900° C. to form source/drain diffusion layers 106 in the upper regions of the silicon substrate 101.

Figure 11B:
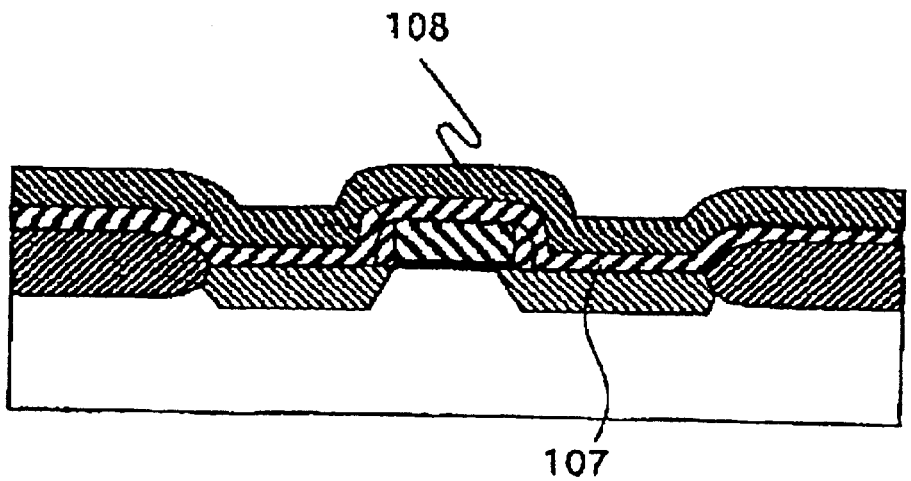

With reference to FIG. 11B, a sputtering method is carried out by sputtering a titanium target with an argon gas to deposit titanium on an entire region of the silicon substrate 101, thereby entirely forming a titanium film 107 having a thickness of about 20 nanometers, so that the titanium film 107 extends over the polysilicon gate electrode 104, the side wall spacers 105, the source/drain diffusion layers 106 and the field oxide films 102. Subsequently, a further reactive sputtering method is carried out by sputtering a titanium nitride target with an argon gas to deposit a nitrogen containing titanium film 108 on an entire region of the titanium film 107. The titanium nitride target has a compositional ratio of nitrogen to titanium in the range of 30% to 80%. The compositional ratio of nitrogen to titanium of the deposited nitrogen containing titanium film 108 almost depends upon the compositional ratio of the titanium nitride target, but is almost independent from the sputtering conditions such as power and pressure. In order to obtain a small film stress or compressive stress of the nitrogen containing titanium film 108, it is required that the sputtering is carried out under a large pressure, a small power and a high substrate temperature. If, for example, a $TiN_{0.5}$ target is used, then the sputtering is carried out at a power of 6 kW and under a pressure of not less than 8 mTorr, so that the deposited nitrogen containing titanium film has a lower film stress or compressive stress of not higher than $1\times10^{10}$ dyne/cm$^2$.

Figure 11C:
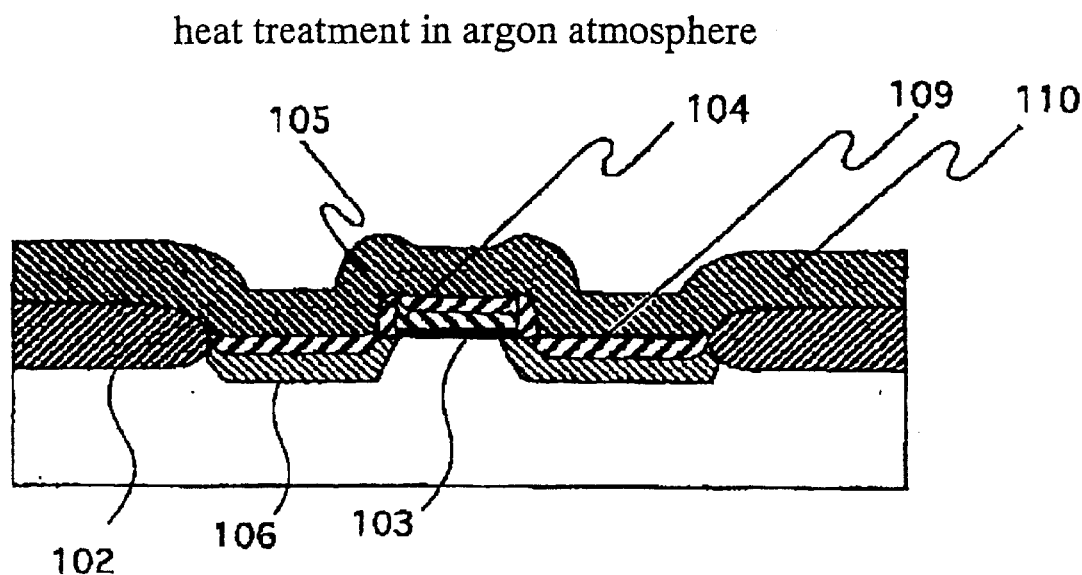

With reference to FIG. 11C, a heat treatment to the silicon substrate 101 is carried out by use of a lamp anneal at a temperature of 700° C. in an argon atmosphere under an atmospheric pressure for 30 seconds, thereby to cause both a titanium nitration reaction and a titanium silicide reaction. This heat treatment causes that silicon atoms in the source/drain diffusion layers 106 and the polysilicon gate electrode 104 are thermally diffused onto interfaces to the titanium film 107, so that the bottom surface of the titanium film 107 on the source/drain diffusion layers 106 and on the polysilicon gate electrode 104 are silicided with the thermally diffused silicon atoms. Subsequently, the titanium silicidation reaction is continued on the interfaces between the growing titanium silicide layers 109 and the source/drain diffusion layers 106 and the polysilicon gate electrode 104, whereby the titanium silicide layers 109 are grown toward the source/drain diffusion layers 106 and the polysilicon gate electrode 104. As a result, the titanium silicide layers 109 on the growth are immersed into the upper regions of the source/drain diffusion layers 106 and the polysilicon gate electrode 104, whereby the titanium silicide layers 109 show plastic deformations toward the source/drain diffusion layers 106 and the polysilicon gate electrode 104 together with further plastic deformations of the nitrogen containing titanium film 108 and the titanium film 107. As will be described in detail later, the nitrogen containing titanium film 108 has a low film stress. This low film stress of the nitrogen containing titanium film 108 reduces the necessary force for the plastic deformation of the nitrogen containing titanium film 108. This reduction in the necessary force for the plastic deformation of the nitrogen containing titanium film 108 facilitates the plastic deformation of the nitrogen containing titanium film 108. This further reduces the total necessary force of the plastic deformations of the titanium silicide layer 109, the titanium film 107 and the nitrogen containing titanium film 108. This reduction in the total necessary force of the plastic deformations facilitates the plastic deformations of the titanium silicide layer 109, the titanium film 107 and the nitrogen containing titanium film 108, thereby facilitating the immersion of the titanium silicide layer 109 on the growth. This means that the growth of the titanium silicide layer 109 is promoted while the titanium silicide reaction exceeds the titanium nitration reaction. The titanium silicide layers 109 has a C49-crystal structure having a relatively high resistivity of about 60 $\mu\Omega$cm. On the other hands, upper regions of the titanium film 107 over the source/drain diffusion layers 106 and the polysilicon gate electrode 104 and further the upper and lower regions of the titanium film 107 over the side wall spacers 105 and the field oxide films 102 are nitrated with nitrogen atoms thermally diffused from the nitrogen containing titanium film 108 overlying the titanium film 107, whereby the upper regions of the titanium film 107 over the source/detain diffusion layers 106 and the polysilicon gate electrode 104 and further the upper and lower regions of the titanium film 107 over the side wall spacers 105 and the field oxide films 102 are made into a nitrogen containing titanium film 110 which extends over the field oxide films 102, the C49-structured titanium silicide layers 109 and the side wall spacers 105. As a result, the titanium silicide layers 109 are self-aligned and selectively formed on the source/drain diffusion layers 106 and the polysilicon gate electrode 104. Namely, the bottom regions of the titanium layer 107 but only on the source/drain diffusion layers 106 and the polysilicon gate electrode 104 are made into the C49-structured titanium silicide layers 109, thereby suppressing the overgrowth of the titanium silicide layer over the side wall spacers 105 and the field oxide films 102. Namely, the titanium film 107 on the side wall spacers 105 and the field oxide films 102 are not silicided. The titanium silicide layers 109, therefore, extend on the bottom surface of the nitrogen containing titanium film 110 and over the source/drain diffusion layers 106 and the polysilicon gate electrode 104.

Contrary to the present invention, if the heat treatment were carried out in the nitrogen atmosphere, then tie nitrogen containing titanium film 108 is nitrated with nitrogen supplied from the nitrogen atmosphere. The etching rate of the titanium nitride film is lower than the nitrogen containing titanium film, for which reason the etching to the titanium nitride film overlying the titanium silicide layer is likely to cause an over-etching to the titanium silicide layer, whereby the thickness of the titanium silicide layer is reduced and therefore the sheet resistance of the titanium silicide layer is increased. This means it important for the present invention to carry out the heat treatment in the nitrogen free atmosphere.

With reference again to FIG. 6, as the compositional ratio of nitrogen to titanium of the nitrogen containing titanium film is increased, then the film stress of the nitrogen containing titanium film is also increased. Before the heat treatment, the nitrogen containing titanium film has a compressive stress. However, the compressive stress of the nitrogen containing titanium film is changed to a tensile stress by the heat treatment. As the compressive stress before the heat treatment is small, then a variation from the compressive stress to the tensile stress by the heat treatment is also small. The silicidation reaction is the volume decrease reaction, for which reason if the tensile stress after the heat treatment is large, then the suppression of the silicidation reaction as the volume decrease reaction is large. If, however, the tensile stress after the heat treatment is small, then the suppression of tie silicidation reaction as the volume decrease reaction is also small. Therefore, the small compressive stress of the nitrogen containing titanium film is preferable for causing the titanium silicidation reaction or for the formation of the titanium silicide layer. As the compositional ratio of nitrogen to titanium of the nitrogen containing titanium film is about 88%, then the film stress as the compressive stress of the nitrogen containing titanium film is about $1.1\times10^{10}$ dyne/cm$^2$. As the compositional ratio of nitrogen to titanium of the nitrogen containing titanium film is about 80%, then the film stress as the compressive stress of the nitrogen containing titanium film is about $1.0\times10^{10}$ dyne/cm$^2$. As the compositional ratio of nitrogen to titanium of the nitrogen containing titanium film is about 53%, then the film stress as the compressive stress of the nitrogen containing titanium film is about $0.75\times10^{10}$ dyne/$cm^2$. As the compositional ratio of nitrogen to titanium of the nitrogen containing titanium film is about 33%, then the film stress as the compressive stress of the nitrogen containing titanium film is about $0.5\times10^{10}$ dyne/$cm^2$. As the compositional ratio of nitrogen to titanium of the nitrogen containing titanium film is about 17%, then the film stress as the compressive stress of the nitrogen containing titanium film is about $0.38\times10^{10}$ dyne/$cm^2$. In the light of facilitation of the silicidation reaction or the growth of the titanium silicide layer, the small film stress or small compressive stress is preferable, and therefore the low compositional ratio of nitrogen to titanium of the nitrogen containing titanium film is preferable.

With reference again to FIG. 7, as the compositional ratio of nitrogen to titanium of the nitrogen containing titanium film is increased from 80%, then the sheet resistance of the C54-structured titanium silicide layer is rapidly increased. In contrast, as the compositional ratio of nitrogen to titanium of the nitrogen containing titanium film is decreased from 80%, then the sheet resistance of the C54-structured titanium silicide layer is not largely varied As the compositional ratio of nitrogen to titanium of the nitrogen containing titanium film is below 80%, then the sheet resistance of the C54-structured titanium silicide layer remains about 10 Ω□. As the compositional ratio of nitrogen to titanium of the nitrogen containing titanium film is increased from 80% to 88%, then the sheet resistance of the C54-structured titanium silicide layer is rapidly increased from about 10 Ω□ up to about 23 Ω□. As the compositional ratio of nitrogen to titanium of the nitrogen containing titanium film is increased from 88% to 90%, then the sheet resistance of the C54-structured titanium silicide layer is rapidly increased from about 23 Ω□ up to about 30 Ω□. The reason why the increase in the compositional ratio of nitrogen to titanium of the nitrogen containing titanium film from 80% causes the rapid increase in the sheet resistance of the C54-structured titanium silicide layer is that the large compositional ratio of nitrogen to titanium of the nitrogen containing titanium film 108 provides a large film stress which prevents the titanium silicidation reaction together with immersion of the titanium silicide layer into the source/drain diffusion layers 106 or the polysilicon gate electrode 104. This means that in order to obtain the low sheet resistance of the C54-structured titanium silicide layer 109, it is required that the compositional ratio of nitrogen to titanium of the nitrogen containing titanium film 108 be not higher than 80%. Since 80% of the compositional ratio of nitrogen to titanium of the nitrogen containing titanium film 108 corresponds to $1\times10^{10}$ dyne/$cm^2$ of the film stress or the compressive stress of the nitrogen containing titanium film 108 before the heat treatment for causing the silicidation reaction. Consequently, in order to obtain the low sheet resistance of the C54-structured titanium silicide layer 109, it is required that the film stress or the compressive stress of the nitrogen containing titanium film 108 be not higher than $1\times10^{10}$ dyne/$cm^2$, for which reason it is important for the present invention that the nitrogen containing titanium film 108 deposited on the titanium film 107 has a low film stress or compressive stress of not higher than $1\times10^{10}$ dyne/$cm^2$. In the light of facilitating the titanium silicidation reaction, it is important that the film stress or compressive stress of the nitrogen containing titanium film be not higher than $1\times10^{10}$ dyne/$cm^2$ and that the compositional ratio of nitrogen to titanium of the nitrogen containing titanium film 108 is not higher than 80%. It is preferable that the compositional ratio of nitrogen to titanium of the nitrogen containing titanium film is not higher than 55%. In the meantime, in the light of realizing the self-alignment of the titanium silicide layer without any over-growth of the titanium silicide layer over the field oxide films 102 and the side wall spacers 105, it is preferable that the compositional ratio of nitrogen to titanium of the nitrogen containing titanium film 108 is not lower than 30%, and more preferably not lower than 45%.

Figure 11D:
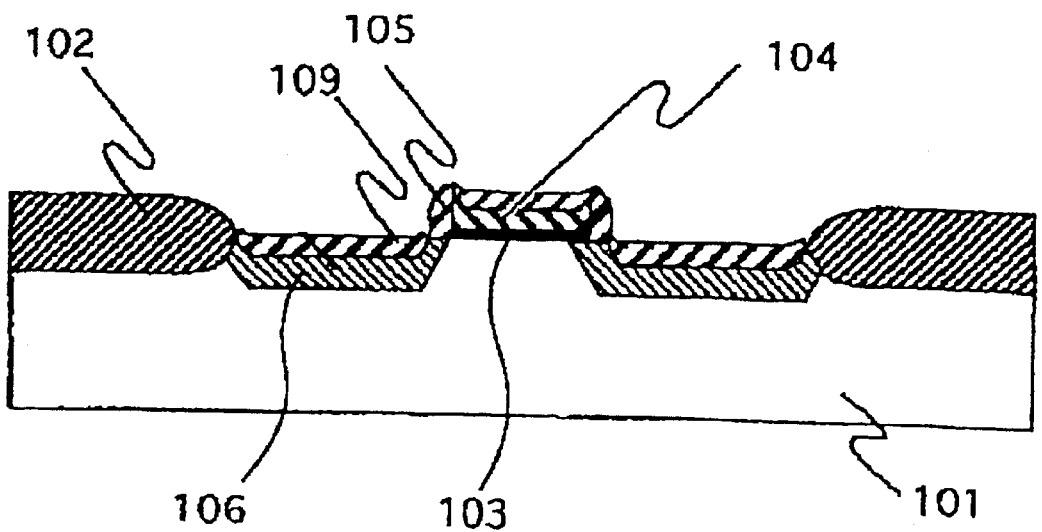

With reference to FIG. 11D, the nitrogen containing titanium film 110 overlaying the C49-structured titanium silicide layers 109 and the field oxide films 102 as well as the side wall spacers 105 is completely etched by a wet etching which uses a chemical comprising a mixture of an ammonium solution and a hydrogen peroxide solution, whereby the C49-structured titanium silicide layers 109 remain on the polysilicon gate electrode 104 and on the source/drain diffusion layers 106.

With reference again to FIG. 8, as the compositional ratio of nitrogen to titanium of the nitrogen containing titanium film 108 is increased from 0% to 20%, then the etching rate of the nitrogen containing titanium film 108 is rapidly decreased from 50 nm/min to 16 nm/min. As the compositional ratio of nitrogen to titanium of the nitrogen containing titanium film 108 is further increased from 20% to 50%, then the etching rate of the nitrogen containing titanium film 108 is further decreased from 16 nm/min to 7 nm/min. As the compositional ratio of nitrogen to titanium of the nitrogen containing titanium film 108 is further increased from 50% to 90%, then the etching rate of the nitrogen containing titanium film 108 is further decreased from 7 nm/min to 1.9 nm/min. As the compositional ratio of nitrogen to titanium of the nitrogen containing titanium film 108 is 80%, then the etching rate of the nitrogen containing titanium film 108 is over 2 nm/min. When the compositional ratio of nitrogen to titanium of the nitrogen containing titanium film 108 is 50%, the etching rate of the nitrogen containing titanium film 108 is 7 nm/min which is higher by about 3.5 times than the etching rate of 1.9 nm/min when the compositional ratio of nitrogen to titanium of the nitrogen containing titanium film 108 is 90%. In the meantime, the etching rate of the titanium silicide layer 109 is 2 nm/min. In the light of facilitation of the complete etching to the nitrogen containing titanium film 108 without any over-etching to the titanium silicide layer 109, it is preferable that the etching rate of the nitrogen containing titanium film 108 is higher than 2 nm/min of the etching rate of the titanium silicide layer 109, and therefore preferable that the compositional ratio of nitrogen to titanium of the nitrogen containing titanium film 108 is not higher than 80%. It is more preferable that the etching rate of the nitrogen containing titanium film 108 is much higher than 2 nm/min of the etching rate of the titanium silicide layer 109, and also more preferable that the compositional ratio of nitrogen to titanium of the nitrogen containing titanium film 108 is much lower than 80%. Namely, in view of the etching selectivity, the possible reduction in the compositional ratio of nitrogen to titanium of the nitrogen containing titanium film 108 is preferable Actually, however, the nitrogen containing titanium film 110 is etched following to the heat treatment for silicidation reaction. The nitrogen containing titanium film 110 is formed by diffusion of nitrogen atoms into the titanium film 107 from the nitrogen containing titanium film 108, for which reason the concentration of nitrogen of the nitrogen containing titanium film 110 is lower than the concentration of nitrogen of the nitrogen containing titanium film 108. This means that the etching rate of the nitrogen containing titanium film 110 is higher than the etching rate of the nitrogen containing titanium film 108.

Figure 11E:
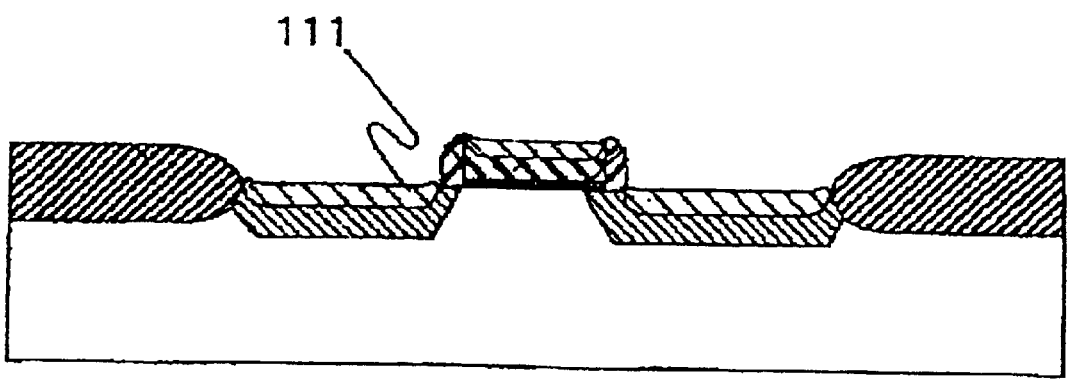

With reference to FIG. 11E, a heat treatment to the silicon substrate 101 is carried out at a temperature of about 800° C. in an argon atmosphere under an atmospheric pressure for 10 seconds to cause a phase transition from the C49 crystal structure to a C54 crystal structure which has a low resistivity of about 20j Qcm. As a result, the C49-structured titanium silicide layers 109 are made into C54-structured titanium silicide layers 111. Namely, the C54-structured titanium silicide layers 111 are formed on the polysilicon gate electrode 104 and on the source/drain diffusion layers 106.

Consequently, the low film stress of not higher than $1 \times 10^{10}$ dyne/cm$^2$ of the nitrogen containing titanium layer 108 is effective to suppress the excess nitration reaction and allows a reduction in thickness of the silicide layer as well as applicable to silicide the line-shaped silicon layer or silicon region.

Accordingly, the low film stress of the nitrogen containing titanium layer 108 makes the self-aligned refractory metal silicide layer 109 free from the above problems with the first and second conventional methods. The low film stress of the nitrogen containing titanium layer 109 makes the self-aligned titanium silicide layer 109 free from a problem with any over-growth of the titanium silicide layer 109 onto the field oxide films 102 and the side wall spacers 105. The low film stress of the nitrogen containing titanium layer 108 is capable of suppressing any excess titanium nitration reaction. The low film stress of the nitrogen containing titanium layer allows a reduction in thickness of the titanium silicide layer 109. The low film stress of the nitrogen containing titanium layer 108 allows a self aligned titanium silicide layer 109 to be formed on a silicon region shaped in a line with a reduced width. The low film stress of the nitrogen containing titanium layer 108 is capable of reducing the necessary force for plastic deformations of the titanium silicide layer 109 and the titanium film 107 and the nitrogen containing titanium film 108 laminated thereon. The low film stress of the nitrogen containing titanium layer 108 does not need such a high temperature heat treatment as to deteriorate characteristics of a semiconductor device having the refractory metal silicide layer. The low film stress of the nitrogen containing titanium layer facilitates etching to the unsilicided layer such as the nitrogen containing titanium film without any over-etching to the titanium silicide layer 109.

The compositional ratio of nitrogen to titanium of the nitrogen containing titanium film 108 is not higher than 80%, so that the film stress or compressive stress of the nitrogen containing titanium film 108 is not higher than $1 \times 10^{10}$ dyne/cm$^2$, which facilitates the titanium silicidation reaction. This further allows that the etching rate of the nitrogen containing titanium film 110 is lower than the etching rate of the titanium silicide layer 109 when the chemical comprising the mixture of the ammonium solution and the hydrogen peroxide solution is used as an etchant. This prevents any over-etching to the titanium silicide layer 109. This further prevents the reduction and variation in thickness of the titanium silicide layer 109. This furthermore prevents the increase and variation in sheet resistance of the titanium nitride layer 109. It is further preferable that the compositional ratio of nitrogen to titanium of the nitrogen containing titanium film 108 is not less than 30% for preventing the over growth of the titanium silicide layer 109 over the field oxide films 102 and the side wall spacers 105. It is furthermore preferable that the compositional ratio of nitrogen to titanium of the nitrogen containing titanium film 108 is in the range of 45% to 55% for formation of the low sheet resistance titanium silicide layer 109 with highly accurate self-alignment.

As a modification, it is possible to carry out the heat treatment for causing the silicidation reaction in a vacuum atmosphere in place of the argon gas. The vacuum atmosphere and the argon atmosphere are the nitrogen free atmosphere. If the heat treatment were carried out in the nitrogen atmosphere, then the nitrogen containing titanium film 108 is nitrated with nitrogen supplied from the nitrogen atmosphere. The etching rate of the titanium nitride film is lower than the nitrogen containing titanium film, for which reason the etching to the titanium nitride film overlying the titanium silicide layer is likely to cause an over-etching to the titanium silicide layer, whereby the thickness of the titanium silicide layer is reduced and therefore the sheet resistance of the titanium silicide layer is increased This means it important for the present invention to carry out the heat treatment in the nitrogen free atmosphere.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spint and scope of the present invention.

What is claimed is:

1. A method of forming a silicide layer on a silicon region, said method comprising the steps of:

forming a first refractory metal layer on said silicon region, and said first refractory metal layer being made of a first refractory metal;

forming a second refractory metal layer on said first refractory metal layer, said second refractory metal layer being made of a second refractory metal and containing nitrogen, wherein said second refractory metal layer has a film stress of not higher than $1 \times 10^{10}$ dyne/cm$^2$; and carrying out a heat treatment in a first atmosphere substantially free of nitrogen so as to cause a silicidation of a lower region of said first refractory metal layer, whereby a C49-structured refractory metal silicide layer is formed on said silicon region.

2. The method as claimed in claim 1, further comprising a step of : removing said second refractory metal layer and an unsilicided remaining region of said first refractory metal layer to show a surface of said C49-structured refractory metal silicide layer.

3. The method as claimed in claim 2, further comprising a step of : carrying out a further heat treatment in a second atmosphere substantially tree of nitrogen so as to cause a phase transition from C49 crystal structure to C54 crystal structure whereby said C49-structured refractory metal silicide layer is made into a C54-structured refractory metal silicide layer.

4. The method as claimed in claim 1, wherein said first refractory metal and said second refractory metal are the same.

5. The method as claimed in claim 4, wherein said first and second refractory metals are titanium so that said first refractory metal layer comprises a titanium layer and said second refractory metal comprises a titanium nitride layer.

6. The method as claimed in claim 5, wherein a compositional ratio of nitrogen to titanium of said second refractory metal layer is in the range of 30% to 80%.

7. The method as claimed in claim 6, wherein a compositional ratio of nitrogen to titanium of said second refractory metal layer is in the range of 45% to 55%.

8. The method as claimed in claim 5, wherein said titanium nitride layer as said second refractory metal layer is formed by a reactive sputtering method, wherein a titanium target is sputtered in an argon nitrogen mixture atmosphere.

9. The method as claimed in claim 8, wherein a nitrogen flow rate to a total flow rate of nitrogen and argon is set in the range of 30% to 50%.

10. The method as claimed in claim 5, wherein said titanium nitride layer as said second refractory metal layer is formed by a long slow sputtering method under conditions that a distance between a titanium target and said silicon region is not less than a half size of a target and a pressure is controlled in the range of 0.2 mTorr to 0.4 mTrr.

11. The method as claimed in claim 5, wherein said titanium nitride layer as said second refractory metal layer is formed by a sputtering method, wherein a titanium nitride target having a compositional ratio of nitrogen to titanium in the range of 30% to 80% is sputtered with an argon gas.

12. The method as claimed in claim 1, wherein said first atmosphere free of nitrogen comprises an inert gas free of nitrogen.

13. The method as claimed in claim 12, wherein said inert gas free of nitrogen comprises an argon gas.

14. The method as claimed in claim 1, wherein said first atmosphere free of nitrogen comprises a vacuum.

15. The method as claimed in claim 1, wherein said first refractory metal and said second refractory metal are different from each other.

16. A method of forming a silicide layer on a silicon region, said method comprising the steps of :
    forming a nitrogen containing compositionally graded refractory metal layer on said silicon region, and said nitrogen containing compositionally graded refractory metal layer having such a compositional grade that a compositional ratio of nitrogen is varied in a thickness direction and is reduced toward a bottom surface of said nitrogen containing compositionally graded refractory metal layer, so that a lower region of said nitrogen containing compositionally graded refractory metal layer is substantially free of nitrogen, wherein an upper region of said nitrogen containing compositionally graded refractory metal layer has a film stress of not higher than $1 \times 10^{10}$ dyne/cm$^2$; and
    carrying out a heat treatment in a first atmosphere substantially free of nitrogen so as to cause a silicidation of a bottom region of said nitrogen containing compositionally graded refractory metal layer, whereby a C49-structured refractory metal silicide layer is formed on said silicon region.

17. The method as claimed in claim 16, further comprising a step of : removing an unsilicided remaining region of said nitrogen containing compositionally graded refractory metal layer to show a surface of said C49-structured refractory metal silicide layer.

18. The method as claimed in claim 17, further comprising a step of : carrying out a further heat treatment in a second atmosphere substantially free of nitrogen so as to cause a phase transition from C49 crystal structure to C54 crystal structure whereby said C49-structured refractory metal silicide layer is made into a C54-structured refractory metal silicide layer.

19. The method as claimed in claim 16, wherein a refractory metal of said nitrogen containing compositionally graded refractory metal layer is titanium.

20. The method as claimed in claim 19, wherein a compositional ratio of nitrogen to titanium of said upper region of said nitrogen containing compositionally graded refractory metal layer is in the range of 30% to 80%.

21. The method as claimed in claim 20, wherein a compositional ratio of nitrogen to titanium of said upper region of said nitrogen containing compositionally graded refractory metal layer is in the range of 45% to 55%.

22. The method as claimed in claim 19, wherein said nitrogen containing compositionally graded refractory metal layer is formed by a reactive sputtering method, wherein a titanium target is sputtered in an argon-nitrogen mixture atmosphere by changing a nitrogen flow rate to a total rate of nitrogen and argon.

23. The method as claimed in claim 22, wherein a nitrogen flow rate to a total flow rate of nitrogen and argon is controlled in the range of 30% to 50% during forming said upper region of said nitrogen containing compositionally graded refractory metal layer is deposited.

24. The method as claimed in claim 19, wherein said nitrogen containing compositionally graded refractory metal layer is formed by a long slow sputtering method by changing a nitrogen flow rate to a total rate of nitrogen and argon under conditions that a distance between a titanium target and said silicon region is not less than a half size of a target and a pressure is controlled in the range of 0.2 mTorr to 0.4 mTorr.

25. The method as claimed in claim 19, wherein said nitrogen containing compositionally graded refractory metal layer is formed by a long slow sputtering method by changing a nitrogen flow rate to a total rate of nitrogen and argon, and
    wherein said nitrogen containing compositionally graded refractory metal layer has a step-graded nitrogen compositional ratio profile, so that the lower region of the nitrogen containing compositionally graded refractory metal layer is substantially free of nitrogen, whilst the upper region of the nitrogen containing compositionally graded refractory metal layer has a compositional ratio of in the range of 30% to 80%.

26. The method as claimed in claim 25, wherein said nitrogen flow rate to a total rate of nitrogen and argon is discontinuously increased from almost zero to a high level in the range of 30% to 50% to obtain said step-graded nitrogen compositional ratio profile.

27. The method as claimed in claim 19, wherein said nitrogen containing compositionally graded refractory metal layer is formed by a long slow sputtering method by changing a nitrogen flow rate to a total rate of nitrogen and argon, and
    wherein said nitrogen containing compositionally graded refractory metal layer has a slope-graded nitrogen compositional ratio profile, so that the lower region of the nitrogen containing compositionally graded refractory metal layer is substantially free of nitrogen, whilst the upper region of the nitrogen containing compositionally graded refractory metal layer has a compositional ratio gradually increased up to in the range of from 30% to 80%.

28. The method as claimed in claim 27, wherein said nitrogen flow rate to a total rate of nitrogen and argon is continuously increased from almost zero to a high level in the range of 30% to 50% to obtain said slope-graded nitrogen compositional ratio profile.

29. The method as claimed in claim 16, wherein said first atmosphere free of nitrogen comprises an inert gas free of nitrogen.

30. The method as claimed in claim 29, wherein said inert gas free of nitrogen comprises an argon gas.

31. The method as claimed in claim 16, wherein said first atmosphere free of nitrogen comprises a vacuum.

32. A method of forming a self-aligned silicide layer on a silicon region bounded with a silicon oxide region, said method comprising the steps of :

forming a first refractory metal layer over said silicon region and said silicon oxide region, said first refractory metal layer being made of a first refractory metal, and said first refractory metal layer comprising a first part on said silicon region and a second part on said silicon oxide region;

forming a second refractory metal layer on said first refractory metal layer, said second refractory metal layer being made of a second refractory metal and containing nitrogen, wherein said second refractory metal layer has a film stress of not higher than $1 \times 10^{10}$ dyne/cm$^2$; and carrying out a heat treatment in a first atmosphere substantially free of nitrogen so as to cause both a silicidation of a lower region of said first part of said first refractory metal layer and a nitration of an upper region of said first part of said first refractory metal layer and an entire region of said second part of said first refractory metal layer, whereby a C49-structured refractory metal silicide layer is formed only on said silicon region.

33. The method as claimed in claim 32, further comprising a step of : removing said second refractory metal layer and an unsilicided remaining region of said first refractory metal layer to show a surface of said C49-structured refractory metal silicide layer and also show a surface of said silicon oxide region.

34. The method as claimed in claim 33, further comprising a step of : carrying out a further heat treatment in a second atmosphere substantially free of nitrogen so as to cause a phase transition from C49 crystal structure to C54 crystal structure whereby said C49-structured refractory metal silicide layer is made into a C54-structured refractory metal silicide layer.

35. The method as claimed in claim 32, wherein said first refractory metal and said second refractory metal are the same.

36. The method as claimed in claim 35, wherein said first and second refractory metals are titanium so that said first refractory metal layer comprises a titanium layer and said second refractory metal comprises a titanium nitride layer.

37. The method as claimed in claim 36, wherein a compositional ratio of nitrogen to titanium of said second refractory metal layer is in the range of 30% to 80%.

38. The method as claimed in claim 37, wherein a compositional ratio of nitrogen to titanium of said second refractory metal layer is in the range of 45% to 55%.

39. The method as claimed in claim 36, wherein said titanium nitride layer as said second refractory metal layer is formed by a reactive sputtering method, wherein a titanium target is sputtered in an argon-nitrogen mixture atmosphere.

40. The method as claimed in claim 39, wherein a nitrogen flow rate to a total flow rate of nitrogen and argon is set in the range of 30% to 50%.

41. The method as claimed in claim 36, wherein said titanium nitride layer as said second refractory metal layer is formed by a long slow sputtering method under conditions that a distance between a titanium target and said silicon region is not less than a half size of a target and a pressure is controlled in the range of 0.2 mTorr to 0.4 mTorr.

42. The method as claimed in claim 36, wherein said titanium nitride layer as said second refractory metal layer is formed by a sputtering method, wherein a titanium nitride target having a compositional ratio of nitrogen to titanium in the range of 30% to 80% is sputtered with an argon gas.

43. The method as claimed in claim 32, wherein said first atmosphere free of nitrogen comprises an inert gas free of nitrogen.

44. The method as claimed in claim 41, wherein said inert gas free of nitrogen comprises an argon gas.

45. The method as claimed in claim 32, wherein said first atmosphere free of nitrogen comprises a vacuum.

46. The method as claimed in claim 32, wherein said first refractory metal and said second refractory metal are different from each other.

47. A method of forming a self-aligned silicide layer on a silicon region bounded with a silicon oxide region, said method comprising the steps of :

forming a nitrogen containing compositionally graded refractory metal layer over said silicon region and said silicon oxide region, said nitrogen containing compositionally graded refractory metal layer comprising a first part on said silicon region and a second part on said silicon oxide region, and said nitrogen containing compositionally graded refractory metal layer having such a compositional grade that a compositional ratio of nitrogen is varied in a thickness direction and is reduced toward a bottom surface of said nitrogen containing compositionally graded refractory metal layer, so that a lower region of said nitrogen containing compositionally graded refractory metal layer is substantially free of nitrogen, wherein an upper region of said nitrogen containing compositionally graded refractory metal layer has a film stress of not higher than $1 \times 10^{10}$ dyne/cm$^2$; and carrying out a heat treatment in a first atmosphere substantially free of nitrogen so as to cause both a silicidation of a lower region of said first part of said nitrogen containing compositionally graded refractory metal layer and a nitration of an upper region of said first part of said nitrogen containing compositionally graded refractory metal layer and an entire region of said second part of said nitrogen containing compositionally graded refractory metal layer, whereby a C49-structured refractory metal silicide layer is formed only on said silicon region.

48. The method as claimed in claim 47, further comprising a step of : removing an unsilicided remaining region of said nitrogen containing compositionally graded refractory metal layer to show a surface of said C49-structured refractory metal silicide layer and also show a surface of said silicon oxide region.

49. The method as claimed in claim 48, further comprising a step of : carrying out a further heat treatment in a second atmosphere substantially free of nitrogen so as to cause a phase transition from C49 crystal structure to C54 crystal structure whereby said C49-structured refractory metal silicide layer is made into a C54-structured refractory metal silicide layer.

50. The method as claimed in claim 47, wherein a refractory metal of said nitrogen containing compositionally graded refractory metal layer is titanium.

51. The method as claimed in claim 50, wherein a compositional ratio of nitrogen to titanium of said upper region of said nitrogen containing compositionally graded refractory metal layer is in the range of 30% to 80%.

52. The method as claimed in claim 51, wherein a compositional ratio of nitrogen to titanium of said upper region of said nitrogen containing compositionally graded refractory metal layer is in the range of 45% to55%.

53. The method as claimed in claim 50, wherein said nitrogen containing compositionally graded refractory metal layer is formed by a reactive sputtering method, wherein a titanium target is sputtered in an argon-nitrogen mixture atmosphere by changing a nitrogen flow rate to a total rate of nitrogen and argon.

54. The method as claimed in claim 53, wherein a nitrogen flow rate to a total flow rate of nitrogen and argon is controlled in the range of 30% to 50% during forming said upper region of said nitrogen containing compositionally graded refractory metal layer is deposited.

55. The method as claimed in claim 50, wherein said nitrogen containing compositionally graded refractory metal layer is formed by a long slow sputtering method by changing a nitrogen flow rate to a total rate of nitrogen and argon under conditions that a distance between a titanium target and said silicon region is not less than a half size of a target and a pressure is controlled in the range of 0.2 mTorr to 0.4 mTorr.

56. The method as claimed in claim 50, wherein said nitrogen containing compositionally graded refractory metal layer is formed by a long slow sputtering method by changing a nitrogen flow rate to a total rate of nitrogen and argon, and
   wherein said nitrogen containing compositionally graded refractory metal layer has a step-graded nitrogen compositional ratio profile, so that the lower region of the nitrogen containing compositionally graded refractory metal layer is substantially free of nitrogen, whilst the upper region of the nitrogen containing compositionally graded refractory metal layer has a compositional ratio in the range of from 30% to 80%.

57. The method as claimed in claim 56, wherein said nitrogen flow rate to a total rate of nitrogen and argon is discontinuously increased from almost zero to a high level in the range of 30% to 50% to obtain said step-graded nitrogen compositional ratio profile.

58. The method as claimed in claim 50, wherein said nitrogen containing compositionally graded refractory metal layer is formed by a long slow sputtering method by changing a nitrogen flow rate to a total rate of nitrogen and argon, and
   wherein said nitrogen containing compositionally graded refractory metal layer has a slope-graded nitrogen compositional ratio profile, so that the lower region of the nitrogen containing compositionally graded refractory metal layer is substantially free of nitrogen, whilst the upper region of the nitrogen containing compositionally graded refractory metal layer has a compositional ratio gradually increased up to in the range of from 30% to 80%.

59. The method as claimed in claim 58, wherein said nitrogen flow rate to a total rate of nitrogen and argon is continuously increased from almost zero to a high level in the range of 30% to 50% to obtain said slope-graded nitrogen compositional ratio profile.

60. The method as claimed in claim 47, wherein said first atmosphere free of nitrogen comprises an inert gas free of nitrogen.

61. The method as claimed in claim 60, wherein said inert gas free of nitrogen comprises an argon gas.

62. The method as claimed in claim 47, wherein said first atmosphere free of nitrogen comprises a vacuum.

63. A method of forming a silicide layer on a silicon region, said method comprising the steps of :
   forming a first refractory metal layer on said silicon region, and said first refractory metal layer being made of a first refractory metal;
   forming a second refractory metal layer on said first refractory metal layer, said second refractory metal layer being made of a second refractory metal and containing nitrogen, wherein said second refractory metal layer has a film stress of not higher than $1 \times 10^{10}$ dyne/cm$^2$;
   carrying out a heat treatment in a first atmosphere substantially free of nitrogen so as to cause a silicidation of a lower region of said first refractory metal layer, whereby a C49-structured refractory metal silicide layer is formed on said silicon region; and
   removing said second refractory metal layer and an unsilicided remaining region of said first refractory metal layer to show a surface of said C49-structured refractory metal silicide layer.

* * * * *